(12) United States Patent
Hahn et al.

(10) Patent No.: US 10,935,611 B2
(45) Date of Patent: Mar. 2, 2021

(54) MAGNETOMETER APPARATUS

(71) Applicant: LOCKHEED MARTIN CORPORATION, Bethesda, MD (US)

(72) Inventors: Joseph W. Hahn, Bethesda, MD (US); Cedric H. Wu, Bethesda, MD (US); Yongdan Hu, Bethesda, MD (US); Kenneth Michael Jackson, Bethesda, MD (US); Gregory Scott Bruce, Bethesda, MD (US); Wilbur Lew, Bethesda, MD (US); Andrew Raymond Mandeville, Bethesda, MD (US); Duc Huynh, Bethesda, MD (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 134 days.

(21) Appl. No.: 16/032,040

(22) Filed: Jul. 10, 2018

(65) Prior Publication Data

US 2019/0018076 A1 Jan. 17, 2019

Related U.S. Application Data

(60) Provisional application No. 62/531,344, filed on Jul. 11, 2017, provisional application No. 62/531,328, filed on Jul. 11, 2017, provisional application No. 62/531,334, filed on Jul. 11, 2017, provisional application No. 62/531,350, filed on Jul. 11, 2017, provisional application No. 62/531,352, filed on Jul. 11, 2017, provisional application No. 62/531,347, filed on Jul. 11, 2017.

(51) Int. Cl.
| | | |
|---|---|---|
| *G01R 33/032* | (2006.01) | |
| *G01N 22/00* | (2006.01) | |
| *G01N 21/64* | (2006.01) | |

(52) U.S. Cl.
CPC .......... *G01R 33/032* (2013.01); *G01N 21/64* (2013.01); *G01N 22/00* (2013.01)

(58) Field of Classification Search
CPC ....... G01R 33/032; G01N 22/00; G01N 21/64
See application file for complete search history.

(56) References Cited

U.S. PATENT DOCUMENTS

| 8,547,090 B2 * | 10/2013 | Lukin ................ G01R 33/032 324/244.1 |
| 10,349,870 B1 * | 7/2019 | Demas ..................... B03C 1/01 |
| 10,545,200 B2 * | 1/2020 | Barry .................. G01R 33/032 |
| 2010/0237858 A1 * | 9/2010 | Hokari ................ G01R 33/032 324/244.1 |

(Continued)

*Primary Examiner* — Dominic E Hawkins
(74) *Attorney, Agent, or Firm* — Foley & Lardner LLP

(57) ABSTRACT

A magnetometer for magnetic detection includes a magneto-optical defect center material having at least one magneto-optical defect center; a radio frequency (RF) exciter system including a radio frequency (RF) excitation source; an optical excitation system including an optical excitation source; an optical detector configured to receive an optical signal based on light emitted by the magneto-optical defect center material due RF excitation and optical excitation provided to the magneto-optical defect center material via the RF excitation source and the optical excitation source, respectively; a magnetic field generator configured to generate a magnetic field detected at the magneto-optical defect center material; and a system controller.

28 Claims, 34 Drawing Sheets

(56) References Cited

U.S. PATENT DOCUMENTS

2016/0018269 A1* 1/2016 Maurer .................. G01K 11/20
  374/121
2016/0146904 A1* 5/2016 Stetson, Jr. .......... G01R 35/005
  324/202
2017/0077665 A1* 3/2017 Liu ........................ H01S 1/005

* cited by examiner

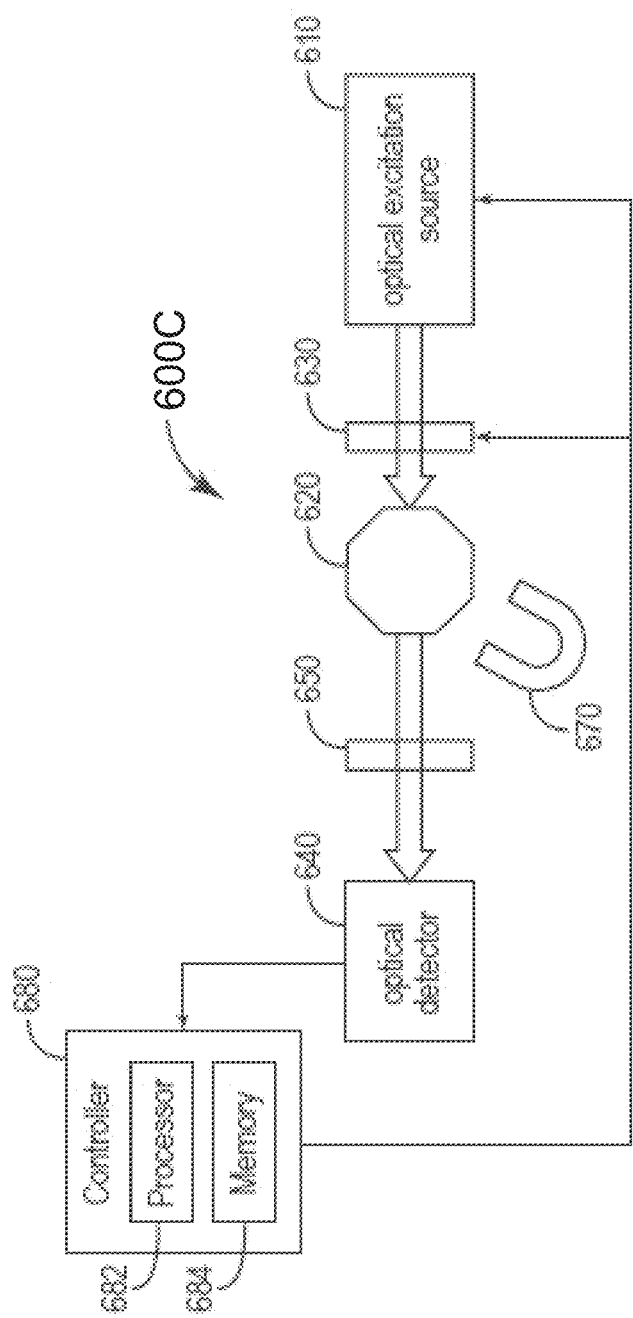

MAGNETOMETER APPARATUS

CROSS-REFERENCE TO RELATED APPLICATIONS

This application claims the benefit of and priority to U.S. Provisional Application No. 62/531,344 filed on Jul. 11, 2017; U.S. Provisional Application No. 62/531,347 filed on Jul. 11, 2017; U.S. Provisional Application No. 62/531,334 filed on Jul. 11, 2017; U.S. Provisional Application No. 62/531,328 filed on Jul. 11, 2017; U.S. Provisional Application No. 62/531,352 filed on Jul. 11, 2017; and U.S. Provisional Application No. 62/531,350 filed on Jul. 11, 2017, the entire disclosures of which are incorporated by reference herein.

FIELD

The present disclosure generally relates, in general, to magnetometers using magneto-optical defect center materials, and more particularly, to magnetometers including a nitrogen vacancy diamond material.

BACKGROUND

The following description is provided to assist the understanding of the reader. None of the information provided or references cited is admitted to be prior art. Some magnetometers use magneto-optical defect center materials to determine a magnetic field. Such magnetometers can direct light into the magneto-optical defect center material. Magneto-optical defect center materials with defect centers can be used to sense an applied magnetic field by transmitting light into the materials and measuring the responsive light that is emitted.

A number of industrial and scientific areas such as physics and chemistry can benefit from magnetic detection and imaging with a device that has improved sensitivity and/or the ability to capture signals that fluctuate rapidly (i.e., improved bandwidth) with a package that is small in size, efficient in power and reduced in volume. Many advanced magnetic imaging systems can operate in restricted conditions, for example, high vacuum and/or cryogenic temperatures, which can make them inapplicable for imaging applications that require ambient or other conditions. Furthermore, small size, weight and power (SWAP) magnetic sensors of moderate sensitivity, vector accuracy, and bandwidth are valuable in many applications.

SUMMARY

According to some embodiments, a magnetometer for magnetic detection includes a magneto-optical defect center material comprising at least one magneto-optical defect center; a radio frequency (RF) exciter system including a radio frequency (RF) excitation source, the RF exciter system being configured to provide RF excitation to the magneto-optical defect center material; an optical excitation system including an optical excitation source; an optical detector configured to receive an optical signal based on light emitted by the magneto-optical defect center material due to RF excitation and optical excitation provided to the magneto-optical defect center material; a magnetic field generator configured to generate a magnetic field detected at the magneto-optical defect center material; and a system controller programmed to: control the RF excitation source to provide the RF excitation to the magneto-optical defect center material, and control the optical excitation source to provide optical excitation to the magneto-optical defect center material.

In some implementations of the embodiments, the magnetometer further includes a light collection assembly comprising a light pipe, an optical filter, and a lens.

In some implementations of the embodiments, the magnetometer further includes an optical waveguide assembly comprising an optical waveguide with a hollow core and at least one optical filter coating, wherein the optical waveguide assembly is configured to transmit the optical signal to the optical detector through the at least one optical filter coating.

In some implementations of the embodiments, the optical excitation source is mounted to a laser optical assembly that is selectively adjustable in a first axial direction in a first plane relative to the magneto-optical defect center material, and the light collection assembly is selectively adjustable in a second axial direction in the first plane relative to the magneto-optical defect center material.

In some implementations of the embodiments, the optical excitation system comprises an active cooling element arranged to actively cool the optical excitation source without cooling the RF excitation source, the magneto-optical defect center material, or the optical detector.

In some embodiments, a method for magnetic detection using a magnetometer includes providing radio frequency (RF) excitation to a magneto-optical defect center material via a radio frequency (RF) excitation source, the magneto-optical defect center material comprising at least one magneto-optical defect center; providing optical excitation to the magneto-optical defect center material via an optical excitation source; receiving an optical signal via an optical detector, the optical signal being based on light emitted by the magneto-optical defect center material due to the RF excitation and the optical excitation provided to the magneto-optical defect center material; and generating a magnetic field detected at the magneto-optical defect center material via a magnetic field generator.

In some implementations of the embodiments, the method further includes controlling the RF excitation source to provide the RF excitation to the magneto-optical defect center material; and controlling the optical excitation source to provide the optical excitation to the magneto-optical defect center material.

In some implementations of the embodiments, the method further includes transmitting light emitted from the magneto-optical defect center material to the optical detector via a waveguide assembly comprising an optical waveguide with a hollow core and through at least one optical filter coating.

In some implementations of the embodiments, the method further includes mounting the optical excitation source to a laser optical assembly; and adjusting the laser optical assembly in a first axial direction in a first plane relative to the magneto-optical defect center material.

In some implementations of the embodiments, the method further includes actively cooling the optical excitation source without cooling the RF excitation source, the magneto-optical defect center material, or the optical detector via an active cooling element or a thermal electric cooler.

In some embodiments, a magnetic field generator includes a plurality of permanent magnets arranged in a Halbach array. A first subset of the plurality of permanent magnets are comprised of a first magnetic material. A second subset of the plurality of permanent magnets is comprised of a second magnetic material different from the first magnetic material.

In some embodiments, a laser optical assembly includes a tip and tilt flexure assembly selectively adjustable relative to a first plane and a second plane, the second plane being perpendicular to the first plane. The tip and tilt flexure assembly includes a first frame member portion; a second frame member portion coupled to the first frame member portion by a tilt flexure rib; and a third frame member portion coupled to the second frame member portion by a tip flexure rib. A Z-axis adjustment assembly selectively adjustable relative to a third plane, the third plane being orthogonal to the first plane and the second plane. The Z-axis adjustment assembly includes an outer frame member; a laser mount; and a plurality of flexure ribs coupling the outer frame member to the laser mount.

In some embodiments, a system for magnetic detection includes a magneto-optical defect center material comprising at least one magneto-optical defect center; a radio frequency (RF) excitation source configured to provide RF excitation to the magneto-optical defect center material; a first optical detector and a second optical detector configured to receive optical signals emitted by the magneto-optical defect center material; an optical light source; a first light collection assembly comprising a first light pipe, a first optical filter, and a first lens, wherein the first light collection assembly is configured to transmit light of a first type emitted from the magneto-optical defect center material to the first optical detector; and a second light collection assembly comprising a second light pipe, a second optical filter, and a second lens, wherein the second light collection assembly is configured to transmit light of a second type emitted from the magneto-optical defect center material to the second optical detector.

In some embodiments, a magnetometer for magnetic detection includes a magneto-optical defect center material comprising at least one magneto-optical defect center; a radio frequency (RF) exciter system including a radio frequency (RF) excitation source, the RF exciter system being configured to provide RF excitation to the magneto-optical defect center material; an optical excitation system including an optical excitation source mounted to a laser optical assembly that is selectively adjustable in a first axial direction in a first plane relative to the magneto-optical defect center material; a light collection assembly that is selectively adjustable in a second axial direction in the first plane relative to the magneto-optical defect center material; an optical detector configured to receive an optical signal based on light emitted by the magneto-optical defect center material due to RF excitation and optical excitation provided to the magneto-optical defect center material; a magnetic field generator configured to generate a magnetic field detected at the magneto-optical defect center material, the magnetic field generator including a plurality of permanent magnets arranged in a Halbach array; and a system controller programmed to: control the RF excitation source to provide the RF excitation to the magneto-optical defect center material, and control the optical excitation source to provide optical excitation to the magneto-optical defect center material.

In some implementations of the embodiments, the light collection assembly comprises a light pipe, an optical filter, and a lens.

In some implementations of the embodiments, the light collection assembly comprises an optical waveguide assembly included an optical waveguide with a hollow core and at least one optical filter coating, wherein the optical waveguide assembly is configured to transmit the optical signal emitted from the magneto-optical defect center material to the optical detector through the at least one optical filter coating.

In some implementations of the embodiments, the magnetometer further includes an active cooling element arranged to actively cool the optical excitation source without cooling the RF excitation source, the magneto-optical defect center material, or the optical detector.

In some implementations of the embodiments, the optical excitation system further includes a thermal electric cooler arranged to actively cool the optical excitation source without cooling the RF excitation source, the magneto-optical defect center material, or the optical detector; one or more thermometers thermally contacting the optical excitation source; and a temperature controller configured to receive a temperature signal from the one or more thermometers, and to control the thermal electric cooler based on the received temperature signal.

The foregoing summary is illustrative only and is not intended to be in any way limiting. In addition to the illustrative aspects, embodiments, and features described above, further aspects, embodiments, and features will become apparent by reference to the following drawings and the detailed description. The embodiments and implementations described above are not mutually exclusive, and thus, may be combined.

BRIEF DESCRIPTION OF THE DRAWINGS

FIG. 6C is another schematic diagram illustrating some embodiments of a magnetic field detection system.

Figure 1:
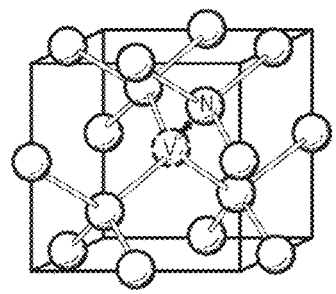
FIG. 1 illustrates one orientation of a Nitrogen-Vacancy (NV) center in a diamond lattice.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Atomic-sized magneto-optical defect centers, such as nitrogen-vacancy (NV) centers in diamond lattices, can have excellent sensitivity for magnetic field measurement and enable fabrication of small magnetic sensors. Magneto-optical defect center materials include but are not be limited to diamonds, Silicon Carbide (SiC), Phosphorous, and other materials with nitrogen, boron, carbon, silicon, or other defect centers. Diamond nitrogen vacancy (DNV) sensors may be maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe triplet spin states (e.g., with ms=−1, 0, +1) of the NV centers to split based upon an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers.

Magneto-optical defect center materials are those that can modify an optical wavelength of light directed at the defect center based on a magnetic field in which the magneto-defect center material is exposed. In some implementations, the magneto-optical defect center material may utilize nitrogen vacancy centers. Nitrogen-vacancy (NV) centers are defects in a diamond's crystal structure. Synthetic diamonds can be created that have these NV centers. NV centers generate red light when excited by a light source, such as a green light source, and microwave radiation. When an excited NV center diamond is exposed to an external magnetic field, the frequency of the microwave radiation at which the diamond generates red light and the intensity of the generated red light change. By measuring this change and comparing the change to the microwave frequency that the diamond generates red light at when not in the presence of the external magnetic field, the external magnetic field strength can be determined. Accordingly, NV centers can be used as part of a magnetic field sensor.

In some implementations, microwave RF excitation may be used in a DNV sensor. The more uniform the microwave signal is across the NV centers in the diamond, the better and more accurate a NV sensor can perform. Uniformity, however, can be difficult to achieve. Also, the larger the bandwidth of the element, the better the NV sensor can perform. Large bandwidth, such as octave bandwidth, however, can be difficult to achieve. Various NV sensors respond to a microwave frequency that is not easily generated by RF antenna elements that are comparable to the small size of the NV sensor. In addition, RF elements reduce the amount of light within the sensor that is blocked by the RF elements. When a single RF element is used, the RF element is offset from the NV diamond when the RF element maximizes the faces and edges of the diamond that light can enter or leave. Moving the RF element away from the NV diamond, however, impacts the uniformity of strength of the RF that is applied to the NV diamond.

Some of the embodiments realize that the DNV magnetic sensors with dual RF elements provide a number of advantages. As described in greater detail below, using a two RF element arrangement in a DNV sensor can allow greater access to the edges and faces of the diamond for light input and egress, while still exciting the NV centers with a uniform RF field. In some implementations, each of the two microwave RF elements is contained on a circuit board. The RF elements can include multiple stacked spiral antenna coils. These stacked coils can occupy a small footprint and can provide the microwave RF field such that the RF field is uniform over the NV diamond.

In addition, all edges and faces of the diamond can be used for light input and egress. The more light captured by photo-sensing elements of a DNV sensor can result in an increased efficiency of the sensor. Various implementations use the dual RF elements to increase the amount of light collected by the DNV sensor. The dual RF elements can be fed by a single RF feed or by two separate RF feeds. If there are two RF feeds, the feeds can be individual controlled creating a mini-phased array antenna effect, which can enhance the operation of the DNV sensor.

The NV center in a diamond may comprise a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. The neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
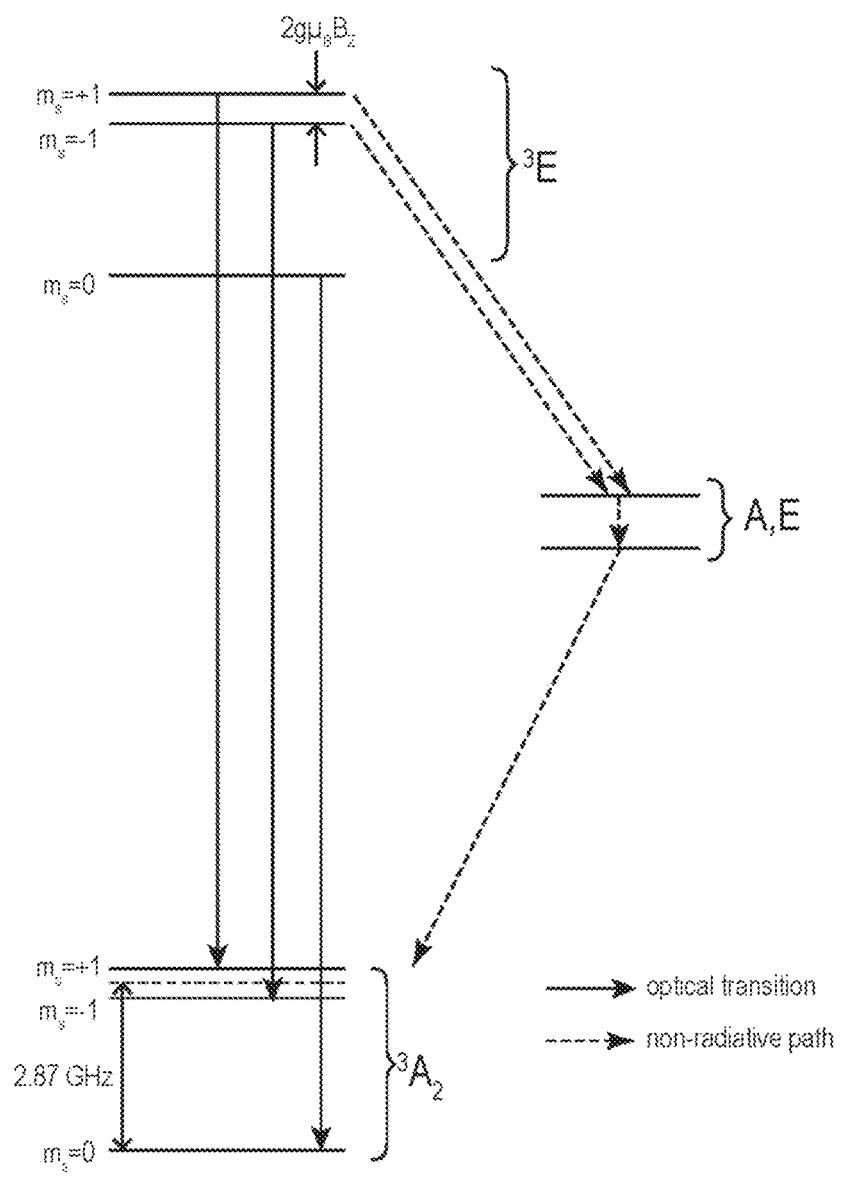
FIG. 2 illustrates an energy level diagram showing energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of approximately 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B B_z$, where g is the g-factor, $\mu_B$ is the Bohr magneton, and $B_z$ is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

The NV Center, or Magneto-Optical Defect Center, Magnetic Sensor System

Figure 3A:
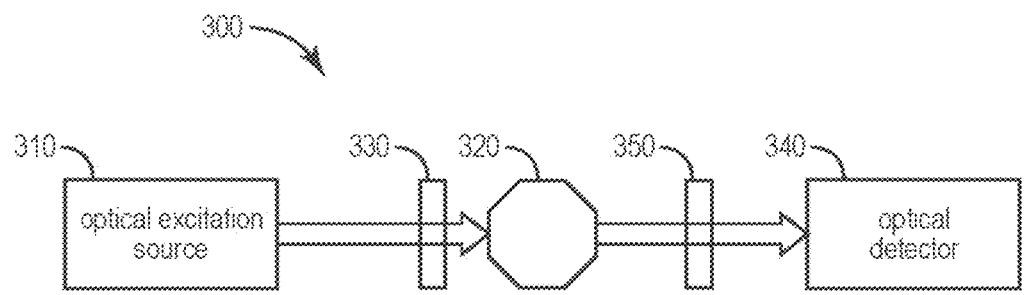
FIG. 3A is a schematic diagram illustrating a NV center magnetic sensor system.

FIG. 3A is a schematic diagram illustrating a NV center magnetic sensor system 300A that uses fluorescence intensity to distinguish the $m_s=\pm 1$ states, and to measure the magnetic field based on the energy difference between the $m_s=+1$ state and the $m_s=-1$ state, as manifested by the RF frequencies corresponding to each state. The system 300A includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance and a subsequent decrease in fluorescence intensity occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state.

The optical excitation source 310 may be a laser or a light emitting diode, for example, which emits light in the green (light having a wavelength such that the color is green), for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

Figure 4:
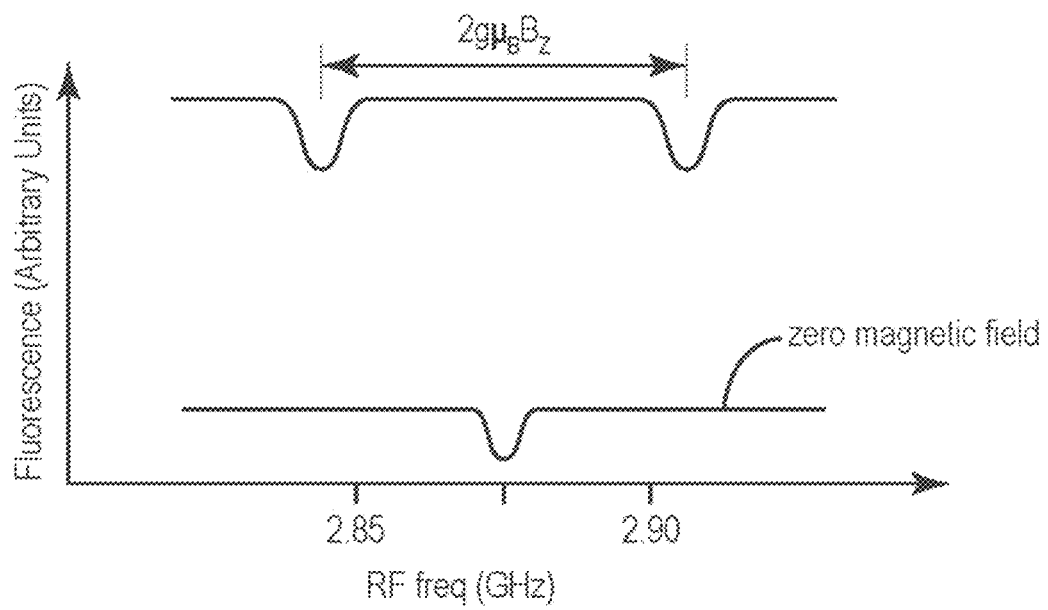
FIG. 4 is a graph illustrating the fluorescence as a function of an applied RF frequency of an NV center along a given direction for a zero magnetic field, and also for a non-zero magnetic field having a component along the NV axis.

For continuous wave excitation, the optical excitation source 310 continuously pumps the NV centers, and the RF excitation source 330 sweeps across a frequency range that includes the zero splitting (when the $m_s=\pm1$ spin states have the same energy) photon energy of approximately 2.87 GHz. The fluorescence for an RF sweep corresponding to a NV diamond material 320 with NV centers aligned along a single direction is shown in FIG. 4 for different magnetic field components $B_z$ along the NV axis, where the energy splitting between the $m_s=-1$ spin state and the $m_s=+1$ spin state increases with $B_z$. Thus, the component $B_z$ may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

Figure 5B:
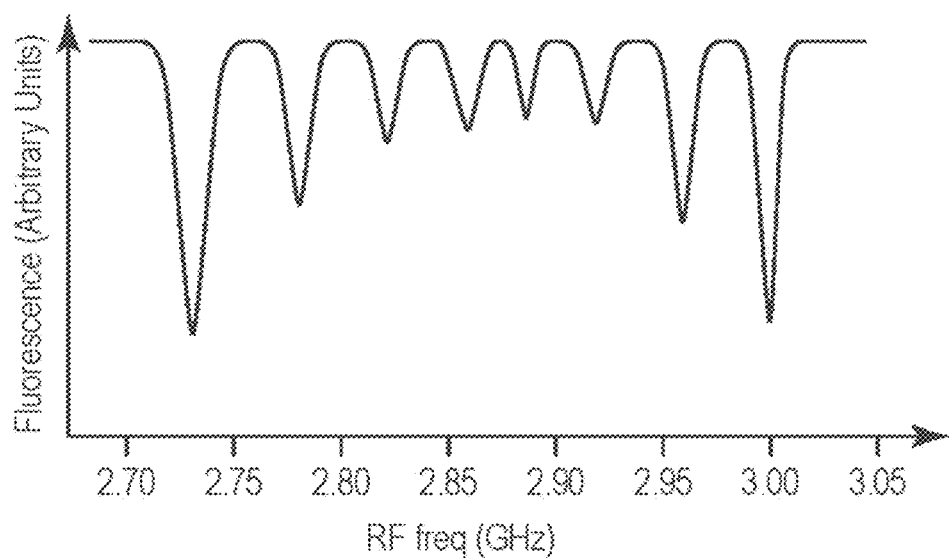
FIG. 5B is a graph illustrating the fluorescence as a function of an applied RF frequency for four different NV center orientations for a non-zero magnetic field.
Figure 5A:
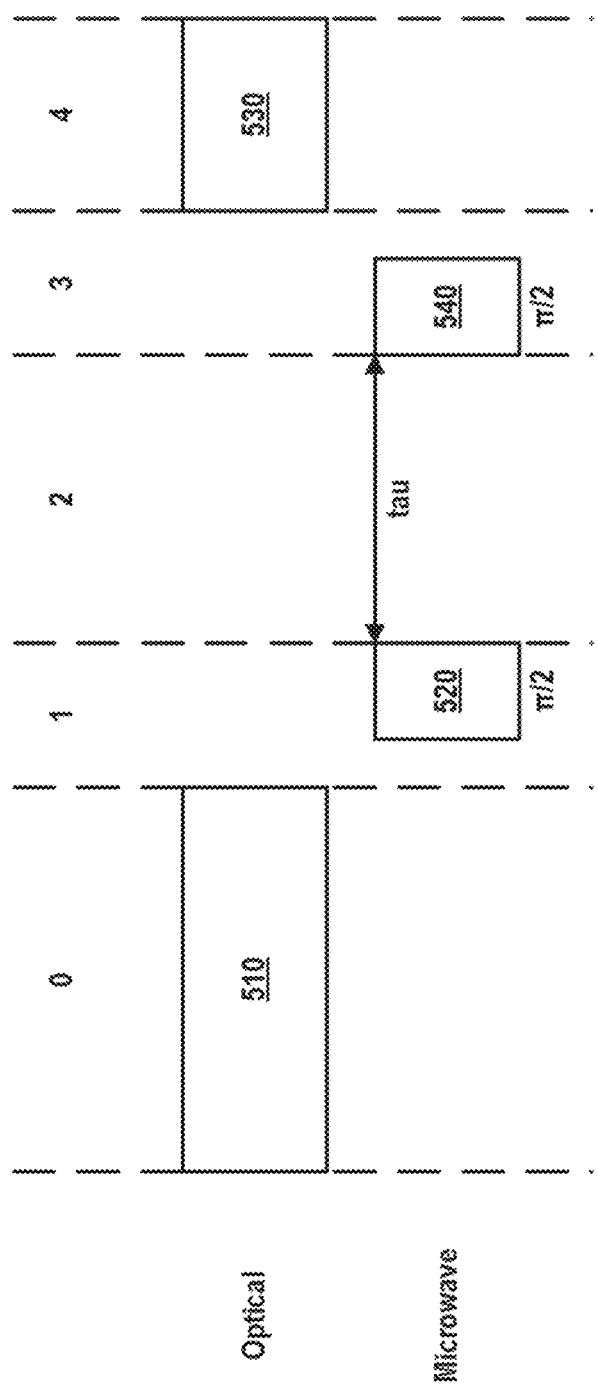
FIG. 5A is a schematic illustrating a Ramsey sequence of optical excitation pulses and RF excitation pulses.

The Ramsey pulse sequence is a pulsed RF-pulsed laser scheme that measures the free precession of the magnetic moment in the NV diamond material 320 with NV centers, and is a technique that quantum mechanically prepares and samples the electron spin state. FIG. 5A is a schematic diagram illustrating the Ramsey pulse sequence. As shown in FIG. 5A, a Ramsey pulse sequence includes optical excitation pulses and RF excitation pulses over a five-step period. In a first step, during a period 0, a first optical excitation pulse 510 is applied to the system to optically pump electrons into the ground state (i.e., $m_s=0$ spin state). This is followed by a first RF excitation pulse 520 (in the form of, for example, a microwave (MW) $\pi/2$ pulse) during a period 1. The first RF excitation pulse 520 sets the system into superposition of the $m_s=0$ and $m_s=+1$ spin states (or, alternatively, the $m_s=0$ and $m_s=-1$ spin states, depending on the choice of resonance location). During a period 2, the system is allowed to freely precess (and dephase) over a time period referred to as tau ($\tau$). During this free precession time period, the system measures the local magnetic field and serves as a coherent integration. Next, a second RF excitation pulse 540 (in the form of, for example, a MW $\pi/2$ pulse) is applied during a period 3 to project the system back to the $m_s=0$ and $m_s=+1$ basis. Finally, during a period 4, a second optical pulse 530 is applied to optically sample the system and a measurement basis is obtained by detecting the fluorescence intensity of the system. The RF excitation pulses applied are provided at a given RF frequency, which correspond to a given NV center orientation.

In general, the NV diamond material 320 will have NV centers aligned along directions of four different orientation classes. FIG. 5B illustrates fluorescence as a function of RF frequency for the case where the NV diamond material 320 has NV centers aligned along directions of four different orientation classes. In this case, the component $B_z$ along each of the different orientations may be determined. These results, along with the known orientation of crystallographic planes of a diamond lattice, allow not only the magnitude of the external magnetic field to be determined, but also the direction of the magnetic field.

Figure 3B:
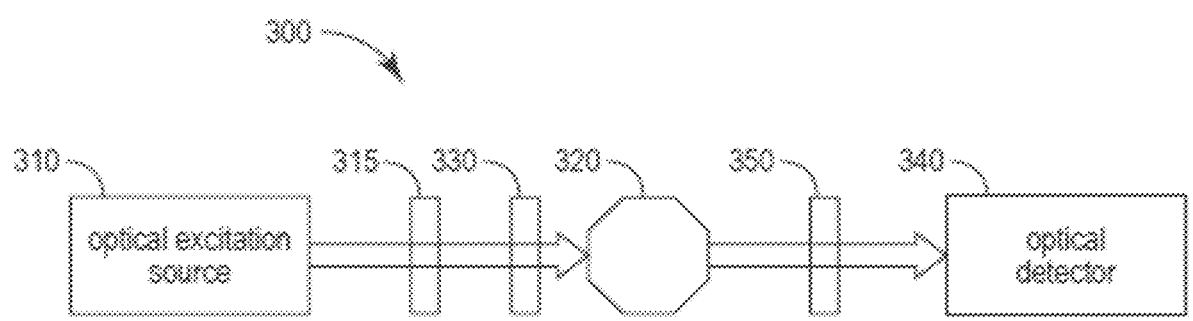
FIG. 3B is a schematic diagram illustrating a NV center magnetic sensor system with a waveplate in accordance with some illustrative embodiments.

FIG. 3B is a schematic diagram illustrating a NV center magnetic sensor system 300B with a waveplate 315. The NV center magnetic sensor system 300B uses fluorescence intensity to distinguish the $m_s=\pm1$ states, and to measure the magnetic field based on the energy difference between the $m_s=+1$ state and the $m_s=-1$ state. The system 300B includes an optical excitation source 310, which directs optical excitation through a waveplate 315 to a NV diamond material 320 with defect centers (e.g., NV diamond material). The system further includes an RF excitation source 330, which provides RF radiation to the NV diamond material 320. Light from the NV diamond may be directed through an optical filter 350 to an optical detector 340.

In some implementations, the RF excitation source 330 may be a microwave coil. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, or between the $m_s=0$ spin state and the $m_s=+1$ spin state, there is a decrease in the fluorescence intensity.

In some implementations, the optical excitation source 310 may be a laser or a light emitting diode which emits light in the green. In some implementations, the optical excitation source 310 induces fluorescence in the red, which corresponds to an electronic transition from the excited state to the ground state. In some implementations, the light from the optical excitation source 310 may be directed through a waveplate 315. In some implementations, light from the NV diamond material 320 may be directed through the optical filter 350 to filter out light in the excitation band (in the green, for example), and to pass light in the red fluorescence band, which in turn may be detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

In some implementations, the light may be directed through a waveplate 315. In some implementations, the waveplate 315 may be in a shape analogous to a cylinder solid with an axis, height, and a base. In some implementations, the performance of the system may be affected by the polarization of the light (e.g., light from a laser) as it may be lined up with a crystal structure of the NV diamond material 320. In some implementations, a waveplate 315 may be mounted to allow for rotation of the waveplate 315 with the ability to stop and/or lock the waveplate 315 in to position at a specific rotation orientation. This allows the tuning of the polarization relative to the NV diamond material 320. Affecting the polarization of the system allows for the affecting the responsive Lorentzian curves. In some implementations where the waveplate 315 is a half-wave plate such that, when a laser polarization may be lined up with the orientation of a given lattice of the NV diamond material 320, the contrast of the dimming Lorentzian, the portion of the light sensitive to magnetic fields, is deepest and narrowest so that the slope of each side of the Lorentzian is steepest. In some implementations where the waveplate 315 is a half-wave plate, a laser polarization lined up with the orientation of a given lattice of the NV diamond material 320 allows extraction of maximum sensitivity for the measurement of an external magnetic field component aligned with the given lattice. In some implementations, four positions of the waveplate 315 are determined to maximize the sensitivity to different lattices of the NV diamond material 320. In some implementations, a position of the waveplate 315 may be determined to get similar sensitivities or contrasts to the four Lorentzians corresponding to lattices of the NV diamond material 320.

In some implementations where the waveplate 315 may be a half-wave plate, a position of the waveplate 315 may be determined as an initial calibration for a light directed through a waveplate 315. In some implementations, the performance of the system may be affected by the polarization of the light (e.g., light from a laser) as it may be lined up with a crystal structure of the NV diamond material 320. In some implementations, a waveplate 315 may be mounted to allow for rotation of the waveplate 315 with the ability to stop and/or lock the half-wave after an initial calibration determines the eight Lorentzians associated with a given lattice with each pair of Lorentzians associated with a given lattice plane symmetric around the carrier frequency. In some implementations, the initial calibration may be set to allow for high contrast with steep Lorentzians for a particular lattice plane. In some implementations, the initial calibration may be set to create similar contrast and steepness of the Lorentzians for each of the four lattice planes. The structural details of the waveplate 315 will be discussed in further detail below While FIGS. 3A-3B illustrate an NV center magnetic sensor system 300A, 300B with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states may be not the same for all of the different spin states. In this way, the magnetic field may be determined based on optical excitation, and possibly RF excitation, in a corresponding way to that described above with NV diamond material. Magneto-optical defect center materials include but are not limited to diamonds, Silicon Carbide (SiC) and other materials with nitrogen, boron, or other chemical defect centers. Our references to diamond-nitrogen vacancies and diamonds are applicable to magneto-optical defect center materials and variations thereof.

Figure 6A:
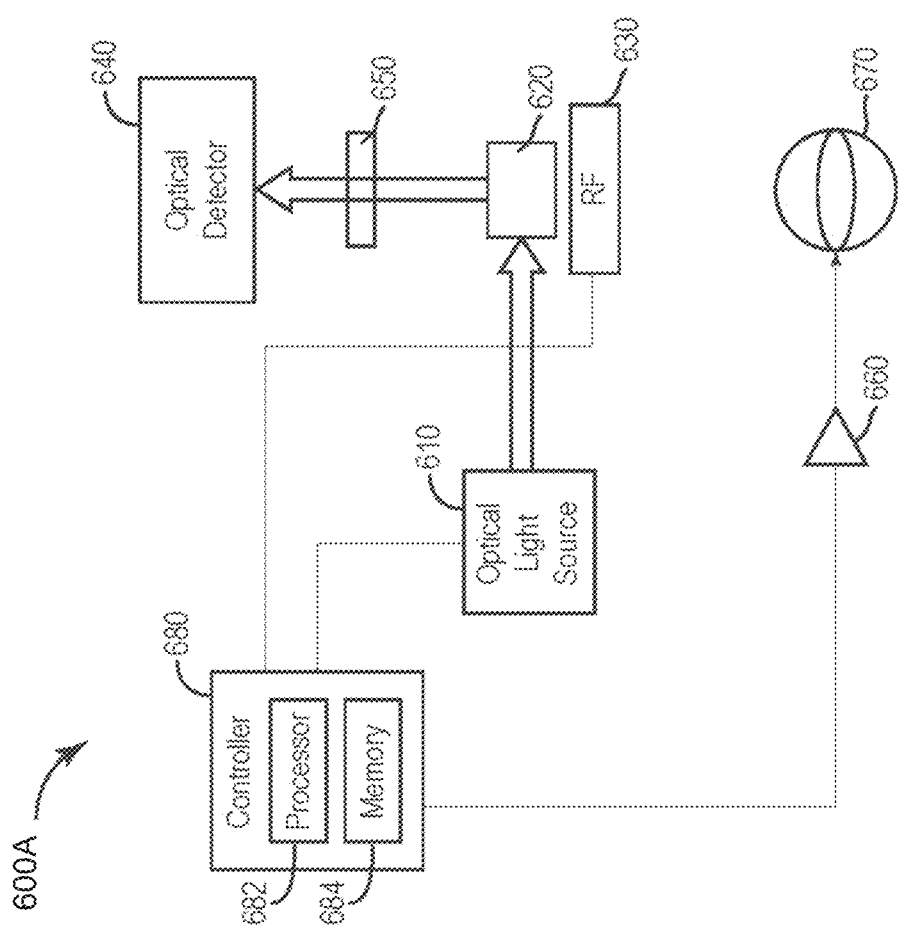
FIG. 6A is a schematic diagram illustrating some embodiments of a magnetic field detection system.

FIG. 6A illustrates a magnetic field detection system 600A according to some embodiments. The system 600A includes an optical light source 610 (i.e., the optical light source 310 of FIGS. 3A and 3B), which directs optical light to an NV diamond material 620 (i.e., the NV diamond material 320 of FIGS. 3A and 3B) with NV centers, or another magneto-optical defect center material with magneto-optical defect centers. An RF excitation source 630 (i.e., the RF excitation source 330 of FIGS. 3A and 3B) provides RF radiation to the NV diamond material 620. The system 600A may include a magnetic field generator 670 which generates a magnetic field, which may be detected at the NV diamond material 620, or the magnetic field generator 670 may be external to the system 600A. The magnetic field generator 670 may provide a biasing magnetic field.

Figure 6B:
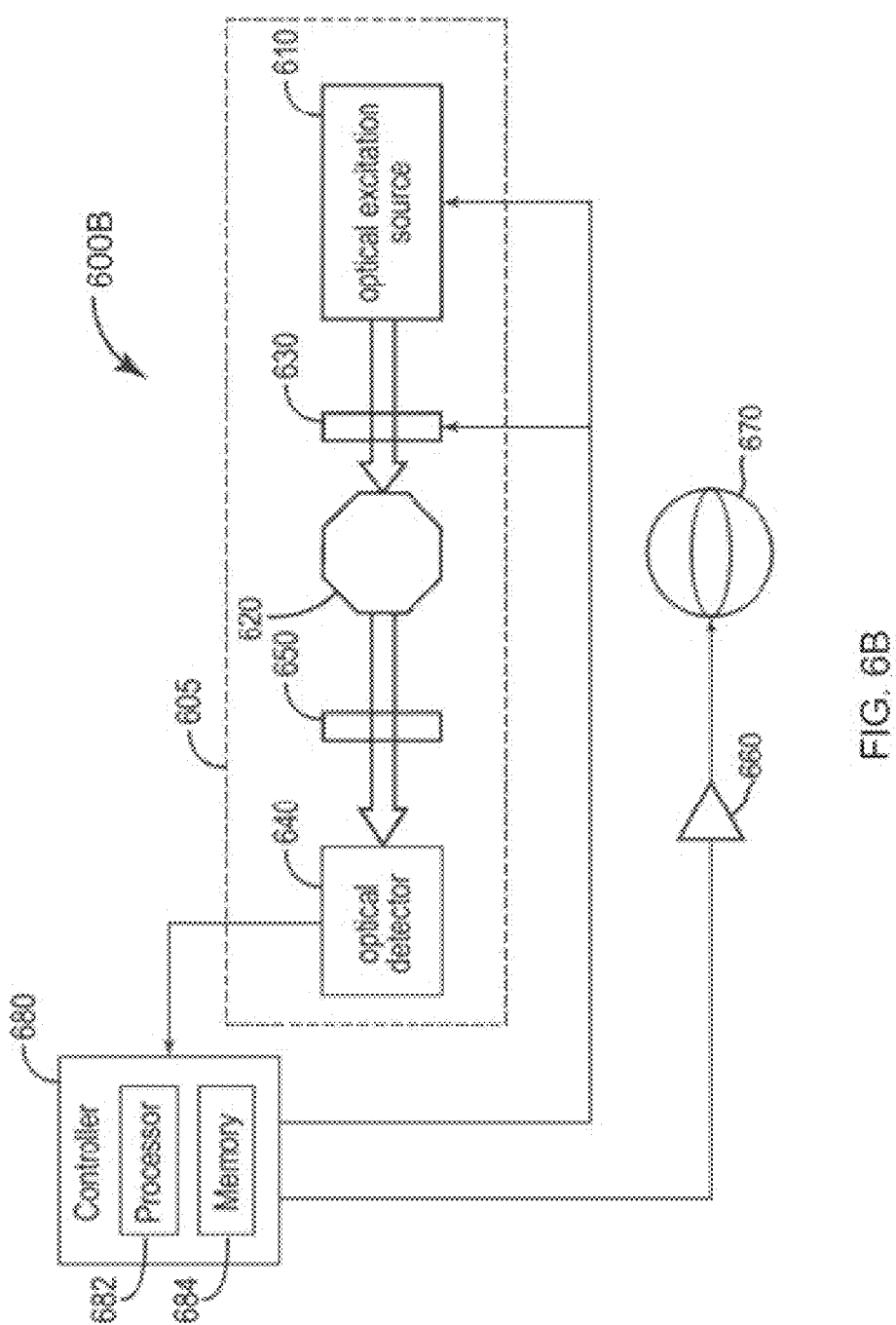
FIG. 6B is another schematic diagram illustrating some embodiments of a magnetic field detection system.

FIG. 6B is another schematic diagram of a magnetic field detection system 600B according to some embodiments. The system 600B includes an optical excitation source 610 (i.e., the optical excitation source 310 of FIGS. 3A and 3B), which directs optical excitation to a NV diamond material 620 (i.e., the NV diamond material 320 of FIGS. 3A and 3B) with defect centers. An RF excitation source 630 (i.e., the RF excitation source 330 of FIGS. 3A and 3B) provides RF radiation to the NV diamond material 620. A magnetic field generator 670 generates a magnetic field, which may be detected at the NV diamond material 620.

Referring to both FIGS. 6A and 6B, the system 600A, 600B further includes a controller 680 arranged to receive a light detection signal from the optical detector 640 (i.e., the optical detector 340 of FIGS. 3A and 3B) and to control the optical light source 610, the RF excitation source 630, and the magnetic field generator 670. The controller 680 may be a single controller, or multiple controllers. For a controller 680 including multiple controllers, each of the controllers may perform different functions, such as controlling different components of the system 600A, 600B. The magnetic field generator 670 may be controlled by the controller 680 via an amplifier 660, for example.

The RF excitation source 630 may be controlled to emit RF radiation with a photon energy resonant with the transition energy between the ground $m_s=0$ spin state and the $m_s=\pm 1$ spin states as discussed above with respect to FIG. 3A or 3B, or to emit RF radiation at other no resonant photon energies.

The controller 680 may be arranged to receive a light detection signal from the optical detector 640 and to control the optical light source 610, the RF excitation source 630, and the magnetic field generator 670. The controller 680 may include a processor 682 and a memory 684, in order to control the operation of the optical light source 610, the RF excitation source 630, and the magnetic field generator 670. The memory 684, which may include a no transitory computer readable medium, may store instructions to allow the operation of the optical light source 610, the RF excitation source 630, and the magnetic field generator 670 to be controlled. That is, the controller 680 may be programmed to provide control.

The magnetic field generator 670 may generate magnetic fields with orthogonal polarizations, for example. In this regard, the magnetic field generator 670 may include two or more magnetic field generators, such as two or more Helmholtz coils. The two or more magnetic field generators may be configured to provide a magnetic field having a predetermined direction, each of which provide a relatively uniform magnetic field at the NV diamond material 620. The predetermined directions may be orthogonal to one another.

In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600A may be arranged to include one or more optical detection systems 605, where each of the optical detection systems 605 includes the optical detector 640, optical excitation source 610, and NV diamond material 620. Similarly, the system 600B also includes the optical detector 640, optical excitation source 610, and NV diamond material 620. The magnetic field generator 670 may have a relatively high power as compared to the optical detection systems 605. In this way, the optical systems 605 may be deployed in an environment that requires a relatively lower power for the optical systems 605, while the magnetic field generator 670 may be deployed in an environment that has a relatively high power available for the magnetic field generator 670 so as to apply a relatively strong magnetic field.

The RF excitation source 630 may be a microwave coil, for example behind the light of the optical excitation source 610. The RF excitation source 630 may be controlled to emit RF radiation with a photon energy resonant with the transition energy between the ground $m_s=0$ spin state and the $m_s=\pm 1$ spin states as discussed above with respect to FIGS. 3A and 3B.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 may be directed through the optical filter 650 to filter out light in the excitation band (in the green, for example), and to pass light in the red fluorescence band, which in turn may be detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 may be arranged to receive a light detection signal from the optical detector 640 and to control the optical excitation source 610, the RF excitation source 630, and a second magnetic field generator (not illustrated). The controller may include a processor 682 and a memory 684, in order to control the operation of the optical excitation source 610, the RF excitation source 630, and the second magnetic field generator. The memory 684, which may include a no transitory computer readable medium, may store instructions to allow the operation of the optical excitation source 610, the RF excitation source 630, and the second magnetic field generator to be controlled. That is, the controller 680 may be programmed to provide control.

FIG. 6C is a schematic of an NV center magnetic sensor system 600C, according to an embodiment. The sensor system 600C includes an optical excitation source 610, which directs optical excitation to an NV diamond material 620 with NV centers, or another magneto-optical defect center material with magneto-optical defect centers. An RF excitation source 630 provides RF radiation to the NV diamond material 620. The NV center magnetic sensor system 600C may include a bias magnet (bias magnetic field generator 670) applying a bias magnetic field to the NV diamond material 620. Unlike FIGS. 6A and 6B, the sensor system 600C of FIG. 6C does not include the amplifier 660. However, in some implementations of the NV center magnetic sensor system 600C, an amplifier 660 may be utilized. Light from the NV diamond material 620 may be directed through an optical filter 650 and optionally, an electromagnetic interference (EMI) filter (not illustrated), which suppresses conducted interference, to an optical detector 640. The sensor system 600C further includes a controller 680 arranged to receive a light detection signal from the optical detector 640 and to control the optical excitation source 610 and the RF excitation source 630.

The optical excitation source 610 may be a laser or a light emitting diode, for example, which emits light in the green, for example. The optical excitation source 610 induces fluorescence in the red, which corresponds to an electronic transition from the excited state to the ground state. Light from the NV diamond material 620 may be directed through the optical filter 650 to filter out light in the excitation band (in the green for example), and to pass light in the red fluorescence band, which in turn may be detected by the optical detector 640. In implementations including the EMI filter, the EMI filter may be arranged between the optical filter 650 and the optical detector 640 and suppresses conducted interference. The optical excitation light source 610, in addition to exciting fluorescence in the NV diamond material 620, also serves to reset the population of the $m_s=0$ spin state of the ground state $^3A_2$ to a maximum polarization, or other desired polarization.

Figure 7:
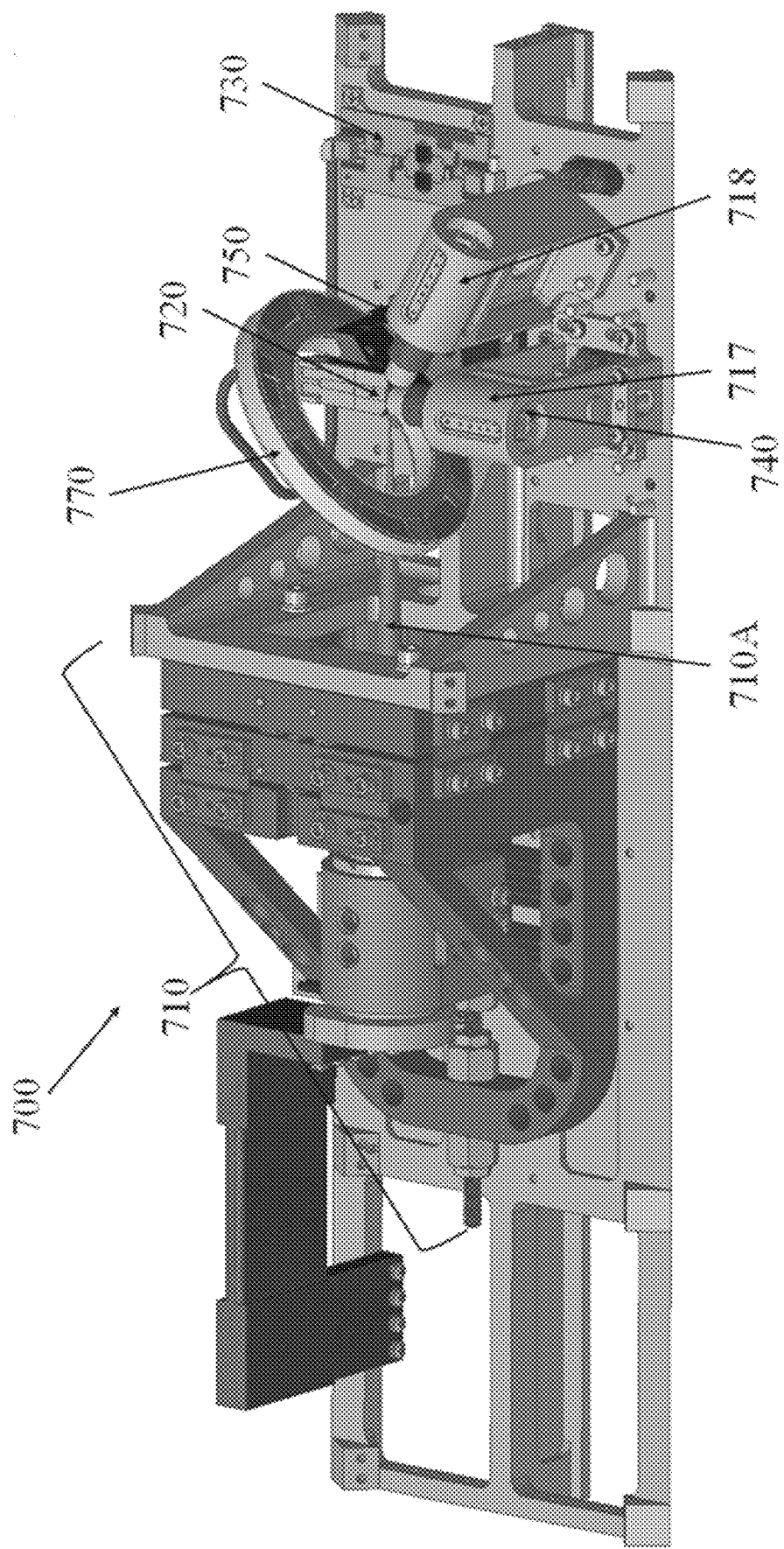
FIG. 7 illustrates a magnetometer in accordance with some illustrative embodiments.

Referring to FIG. 7, a magnetometer 700 includes a magneto-optical defect center material 720 comprising at least one magneto-optical defect center that emits an optical signal when excited by an excitation light 710A, a radio frequency (RF) exciter system configured to provide RF excitation to the magneto-optical defect center material 720, an optical light system 710 configured to direct the excitation light 710A to a magneto-optical defect center material 720 (e.g., a nitrogen vacancy (NV) diamond material with one or more NV centers, or another magneto-optical defect center material with one or more magneto-optical defect centers), a magnetic field generator 770, and an optical detector 740 configured to receive the optical signal emitted by the magneto-optical defect center material based on the excitation light and the RF excitation. The RF exciter system may include may include an RF amplifier assembly 730, which includes RF circuitry that amplifies the signal from the RF source to a desired power level needed in the RF excitation element. In alternative embodiments, additional, fewer, and/or different elements may be used. For example, although the optical light system 710 of FIG. 7 illustrates one light source, in other embodiments, the optical light system 710 may include any suitable number of light sources, such as two, three, four, etc. light sources. An orientation of the magneto-optical defect center material 720 may be changed.

In the magnetometer 700, light from the magneto-optical defect center material 720 may be directed through an optical filter to filter out light in the excitation band (in the green, for example), and to pass light in the red fluorescence band through a light pipe, which in turn may be detected by the optical detector 740. A red collection 717 and a green collection 718 may be provided around a periphery of a base 750 to which the magneto-optical defect center material 720 and the magnetic field generator 770 are mounted. The red collection 717 may be a system of parts that includes, for example, a photo diode, a light pipe, and filters that measure the red light emitted from the magneto-optical defect center material 720. The red collection 717 provides the main signal of interest, used to measure external magnetic fields. The green collection 718 may be a system of parts that includes, for example, a photo diode, a light pipe, and filters that measure the green light from the excitation light that passes through the magneto-optical defect center material 720. The green collection 718 may be used in tandem with the red collection 717 to remove common mode noise in the detection signal, and therefore, increase device sensitivity. A beam trap configured to capture any portion of the excitation light (e.g., a green light portion) that may be not absorbed by the magneto-optical defect center material 720 may be provided to ensure that that the excitation light does not bounce around and add noise to the measurement. This noise could result from the excitation light bouncing off other components of the magnetometer 700 and hitting the magneto-optical defect center material 720 at a later time, where the excitation light would be absorbed and contaminate the signal. The excitation light that is not absorbed by the magneto-optical defect center material 720 might also be captured on the green or red collection photodiodes, directly adding noise to those signals.

Magnetic Field Generator

As described above, in an optical defect center based magnetometer (e.g., the magnetometer 700 of FIG. 7), a bias magnetic field may be used. However, if the magnetometer is used in environments that have a large temperature range, the bias magnetic field needs to be very stable over the operational temperature because the performance of the magnetometer may be directly related to the magnetic field strength. A stable operational temperature may be a predetermined temperature plus or minus a few degrees Celsius, preferably, plus or minus tenths of a degree Celsius, and even more preferably, plus or minus hundredths of a degree Celsius. Active cooling methods may be used to maintain the bias magnet and/or the entire magnetometer at the stable operational temperature. However, active cooling systems capable of maintaining the stable operational temperature are large in size, high in power consumption, heavy, control software and hardware intensive, and expensive.

Figure 8:
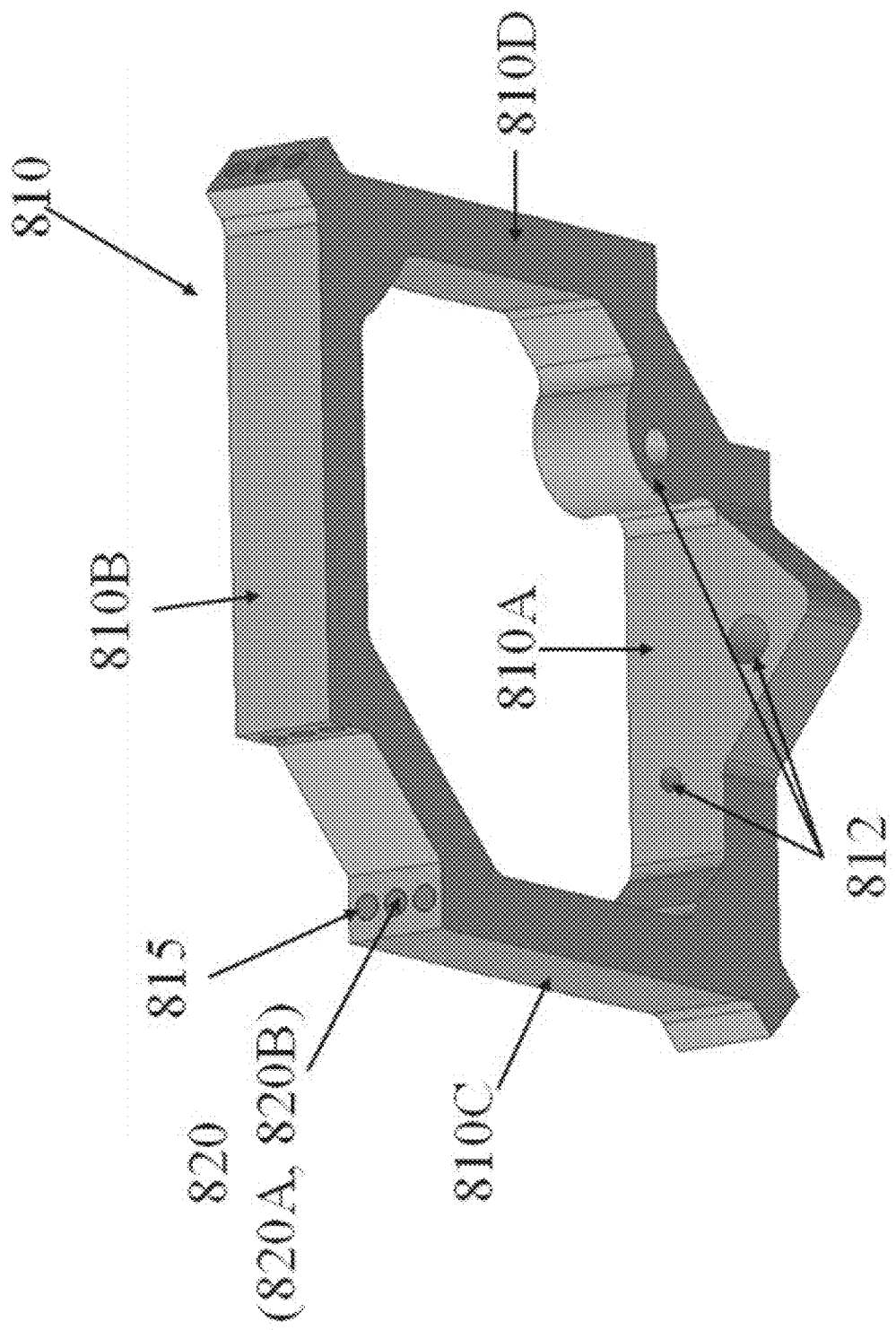
FIG. 8 illustrates some embodiments of a mounting frame of a magnetic field generator of the magnetometer of FIG. 7.
Figure 9:
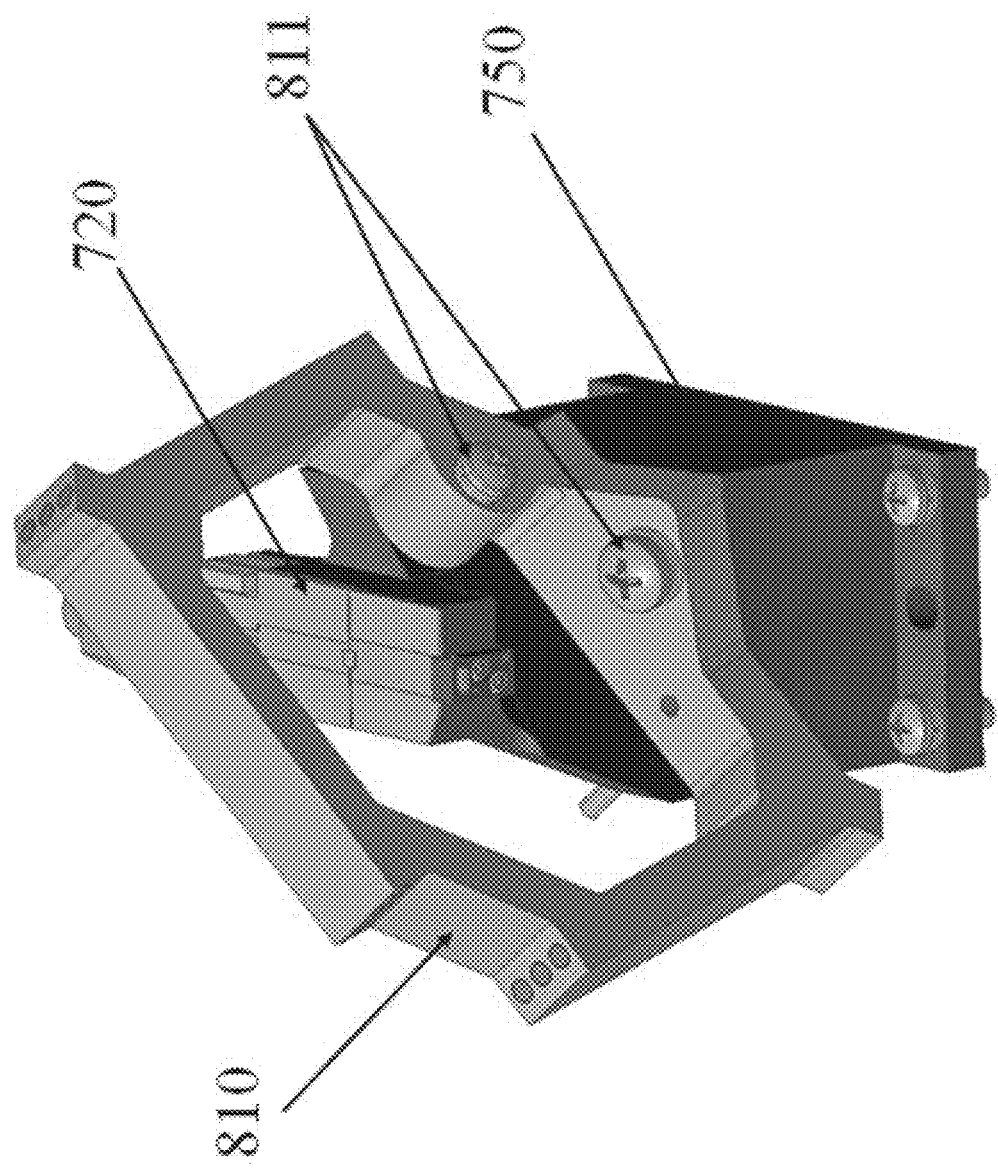
FIG. 9 illustrates some embodiments of the mounting frame of FIG. 8 and a magneto-optical defect center material mounted to a base with the magneto-optical defect center material provided at a center of the mounting frame.
Figure 10:
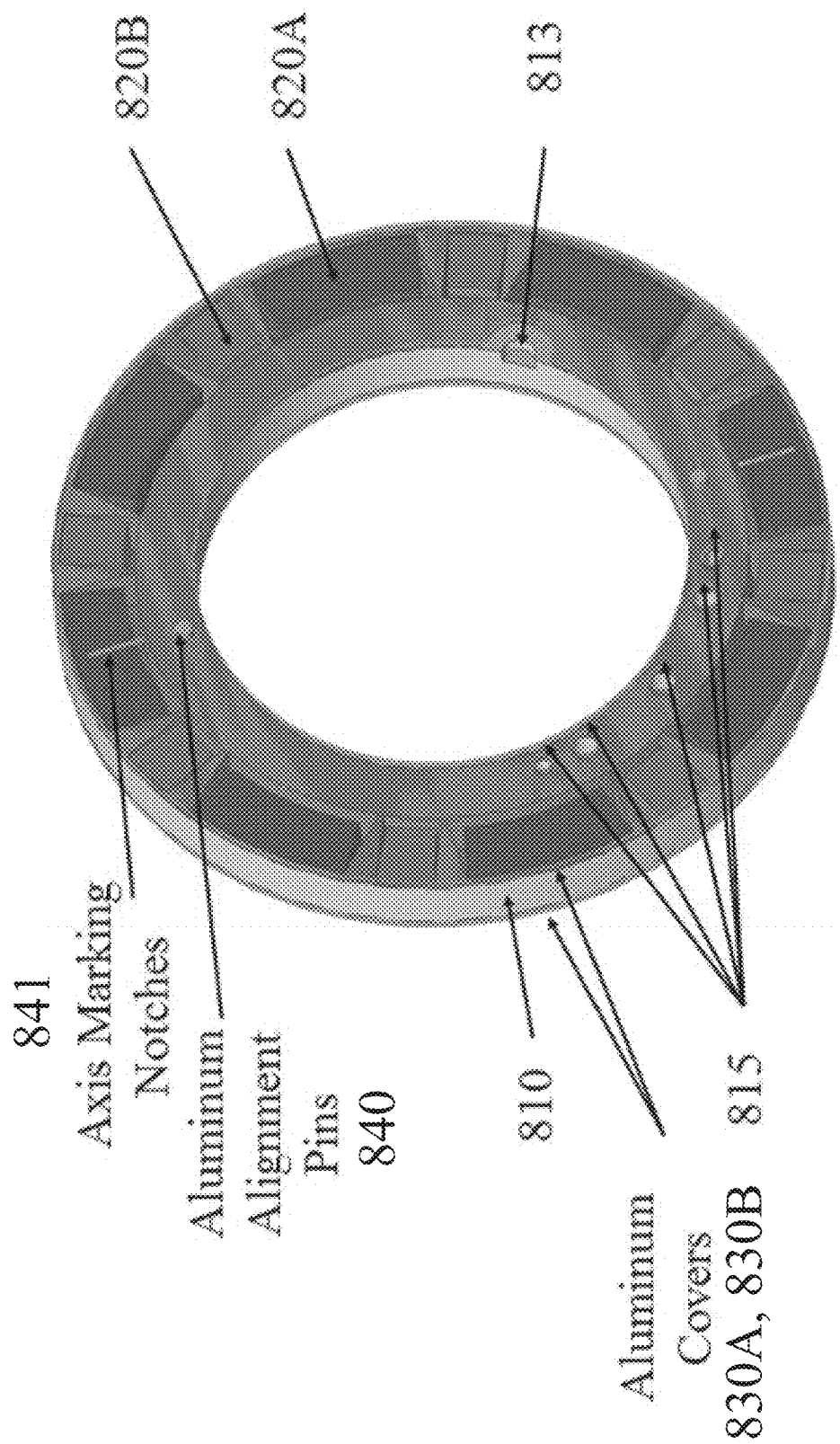
FIG. 10 illustrates other embodiments of a mounting frame of a magnetic field generator of the magnetometer of FIG. 7.

Referring to the embodiments illustrated in FIGS. 8-12B, a magnetometer (e.g., the magnetometer 700 of FIG. 7) includes a magnetic field generator 870 (e.g., the magnetic field generator 670 of FIGS. 6A-6C or the magnetic field generator 770 of FIG. 7). The magnetic field generator 870 includes a mounting frame 810 configured to support a plurality of permanent magnets 820. The mounting frame 810 may be made of plastic (e.g., Black Noryl® PPO™, polystyrene, polyphenylene ether, etc.), titanium (e.g., Grade 5, Ti 6Al-4V, etc.), aluminum (e.g., 6061-T6 per ASTM B209, may have a chemical conversion coating per military standard MIL-DTL-5541, etc.), etc. The mounting frame 810 may be repeatedly and reversibly mounted to the base 750 to which the magneto-optical defect center material 720 may be also mounted. The mounting frame 810 may be mounted to the base 750 via one or more fasteners 811, each configured to be received in one of a plurality of alignment and mounting holes 812 provided in the mounting frame 810. The fasteners 811 can be any suitable device such as screws, bolts, studs, nuts, clips, etc. As seen in FIG. 10, the mounting frame 810 may include one or more cutouts 813 along an interior periphery thereof. The cutouts 813 are configured to prevent the permanent magnets 820 from blocking the excitation light 710A generated by the optical light system 710. A thermistor 880 may be epoxied (or otherwise attached) to one or more permanent magnets 820 to monitor a temperature thereof.

In the embodiment of FIGS. 8 and 9, the mounting frame 810 includes a lower portion 810A configured to be attached to the base 750, an upper portion 810B, and side portions 810C and 810D, which connect the lower portion 810A and the upper portion 810B. Portions that are not configured to receive a permanent magnet may be provided between the lower portion 810A and at least one of the side portions 810C and 810D, and/or between the upper portion 810B and at least one of the side portions 810C and 810D for structural integrity of the mounting frame 810 (i.e., to assist in holding the assembly together). Each of the upper portion 810B and the side portions 810C and 810D include a plurality of magnet mounting holes 815 in an interior thereof. The magnet mounting holes 815 extend along a length of each of the upper portion 810B and the side portions 810C and 810D. In this embodiment, the permanent magnets 820 are cylindrical magnets configured to be received in the magnet mounting holes 815. The permanent magnets 820 may be provided in specified positions along the mounting frame 810 to provide maximum uniformity of the generated magnetic field. Although there are three magnet mounting holes illustrated in each of the upper portion 810B and the side portions 810C and 810D, any suitable number of magnet mounting holes 815 may be provided such as two, four, five, six, etc. provided that the number of magnets is balanced and capable of providing magnetic field uniformity. In some examples, all of the magnet mounting holes 815 may receive at least one permanent magnet 820. In other examples, at least one of the magnet mounting holes 815 may be empty (i.e., not contain a permanent magnet 820) during operation of the magnetometer to adjust a strength of the magnet. In some examples, a same number of magnet mounting holes 815 on each of the upper portion 810B and the side portions 810C and 810D may contain a permanent magnet. One or more permanent magnets 820 having the same or different lengths can be received in each of the magnet mounting holes 815, where a plurality of permanent magnets 820 may be stacked in any given magnet mounting hole to change a strength of a magnetic field that may be generated. For example, some of the permanent magnets 820 may be 0.250 inches long with a 1/16 inch outer diameter, while other permanent magnets 820 may be 0.125 inches long with a 1/16 inch outer diameter. An individual magnet mounting hole 815 may be configured to hold two permanent magnets 820, for example, one of each size or two of the same size. Thus, the mounting frame 810 of FIGS. 8 and 9 can be adapted for use in a plurality of magnetometers.

In the embodiment of FIGS. 10-12B, the mounting frame 810 may be circular and has a plurality of recesses 825 in a front side thereof arranged along a circumference thereof. Each of the recesses 825 may be sized and shaped to receive an arcuate permanent magnet 820. The sizes of the recesses 825 may be uniform (i.e., all of the permanent magnets 820 have the same size and shape) or non-uniform (i.e., at least one of the permanent magnets 820 has a different size and/or shape than another permanent magnet 820). Because the mounting frame 810 may be fabricated to include recesses corresponding to a particular arrangement of permanent magnets, the mounting frame 810 of FIGS. 10-12B may be a customized magnet frame configured for use in a particular magnetometer. The magnetic field generator of FIGS. 10-12B may be held together with structural epoxy. A first cover 830A and a second cover 830B may be provided on opposite sides of the mounting frame 810. Mutual attraction or repulsion between the permanent magnets 820 may occur. The first cover 830A and the second cover 830B are configured to provide a clamping force to help hold the permanent magnets 820 in place. One or more alignment pins 840 and one or more axis markers 841 may be provided along the mounting frame 810 to facilitate proper orientation of the magnetic field vector in the assembly. The first cover 830a, the second cover 830B and/or the alignment pins 840 may be made, for example, of aluminum.

The permanent magnets 820 of FIGS. 8-12B are arranged in a Halbach array. One of ordinary skill in the art would understand that a Halbach array may be an arrangement of permanent magnets in which magnetic materials, for example, ferromagnetic materials, with alternating magnetizations are combined such that the magnetic fields align on one side of the Halbach array (e.g., above the plane of the magnetic materials), while the magnetic fields on the other side of the Halbach array (e.g., below the plane of the magnetic materials) are in opposite directions and cancel out in an ideal case. Because the ideal case may be never observed, a very small magnetic field may be produced on the other side of the Halbach array (e.g., below the plane of the magnetic materials).

The permanent magnets 820 of FIGS. 8-12B are comprised of one or more magnetic materials. In some embodiments, the permanent magnets 820 are comprised of two magnetic materials (i.e., a first magnetic material 820A and a second magnetic material 820B) such that the Halbach array may be a thermal compensated Halbach array configured to supply a stable bias magnetic field over large temperature ranges. As used herein, stable means that the magnetic field does not vary significantly over the timescale of a measurement. The primary driver for temporal changes in the magnetic field may be the change in the magnet's temperature. The metric of stability may either be the change in the field with respect to time [Tesla/s] or temperature [Tesla/K]. The latter may be more preferable in this context because the exact change in temperature vs. time may be a function of the magnetometer system. In some examples, a first subset of the plurality of permanent magnets 820 may be comprised of a first magnetic material 820A and a second subset of the plurality of permanent magnets 820 may be comprised of a second magnetic material 820B different from the first magnetic material 820A. The first magnetic material 820A and the second magnetic material 820B are selected such that the magnetic materials have different temperature coefficients, and thus, have a different slope when plotting a change of magnetic field versus temperature. The first magnetic material 820A and the second magnetic material 820B are arranged such that a temperature coefficient of the magnetic materials are cancelled, and the magnetic fields generated by the magnetic field generator 870 are essentially independent with respect to the operational temperature of the magnetometer. The cancellation may be achieved, for example, by aligning the magnetic fields generated by each of the first magnetic material 820A and the second magnetic material 820B in the opposite direction. In some examples, the first magnetic material 820A generates a weaker magnetic field, but has a smaller slope when plotting the change of magnetic field versus temperature as compared to the magnetic field and slope of the second magnetic material 820B. The first magnetic material 820A may be oriented to produce a magnetic field in a desired direction (e.g., above the plane of the magnetic materials), while the second magnetic material 820B may be oriented to produce a magnetic field in a direction opposite to the desired direction (e.g., below the plane of the magnetic materials).

The magnetic field, B, produced by a permanent magnet with a temperature coefficient, c, varies a function of temperature follows:

$$B(T_o+\Delta T)=B(T_o)[1-c\Delta T] \quad (1)$$

where $T_o$ is the initial temperature and $\Delta T$ is the change in temperature. In our configuration we have two opposing magnets with different coefficients $c_1$ and $c_2$. The total temperature dependent field produced by this configuration is:

$$B_{total}(T_o+\Delta T)=B_1(T_o)[1-c_1\Delta T]-B_2(T_o)[1-c_2\Delta T] \quad (2)$$

At $T=T_o$:

$$B_{total}(T_o)=B_o=B_1(T_o)-B_2(T_o) \quad (3)$$

To design a thermally stable magnet, set $B_{total}(T_o+\Delta T)=B_o$, where $B_o$ is the desired field and a constant with respect to temperature. Substituting $B_o+B_2(T_o)$ for $B_1(T_o)$ in (2) and solving for $B_2(T_o)$ gives:

$$B_2(T_o) = \frac{c_1}{c_2-c_1} B_o \quad (4)$$

Using equations (3) and (4), the values of $B_1(T_o)$ and $B_2(T_0)$ can be designed to produce a thermally stable field of $B_o$.

From equation (4) if $c_2 \sim c_1$ then $B_2$ will be very large with respect to $B_1$ or if $c_1 \ll c_2$ then $B_2$ will be very small with respect to $B_1$, neither of which may be ideal. The first magnetic material 820A may be comprised, for example, of Samarium Cobalt (e.g., SmCo30) and the second magnetic material 820B may be comprised, for example, of Neodymium (e.g., N52). The difference between SmCo and N52 may be in a range where reasonable values of $B_1$ and $B_2$ can be achieved. Other ferromagnetic materials such as alnico alloys (composed primary of aluminum, nickel and cobalt) may be used as the first magnetic material 820A or the second magnetic material 820B. Alternatively, the first magnetic material 820A or the second magnetic material 820B may be comprised of ferrous iron. Another factor to consider in selecting the magnetic materials may be whether the permanent magnets 820 are strong enough to fit within the small footprint desired. This may substantially limit the choice of magnetic materials. A further consideration may be that the maximum operating temperature must be significantly smaller than the Curie temperature such that the magnetic field strength changes linearly with temperature, although this may be less of a concern because Curie temperatures are typically quite high.

In the embodiment of FIGS. 8 and 9, the permanent magnets 820 comprised of the first magnetic material 820A and the second magnetic material 820B may be provided in adjacent magnet mounting holes 815. Using the example of three magnet mounting holes 815 as illustrated in FIGS. 8 and 9, a first magnet mounting hole and a third magnet mounting hole may include permanent magnets 820 comprised of the first magnetic material 820A, while the second magnet mounting hole (i.e., the middle magnet mounting hole) includes permanent magnets 820 comprised of the second magnetic material 820B. Alternatively, the first magnet mounting hole and the third magnet mounting hole may include permanent magnets 820 comprised of the second magnetic material 820B, while the second magnet mounting hole (i.e., the middle magnet mounting hole) includes permanent magnets 820 comprised of the first magnetic material 820A. Alternatively, two adjacent magnet mounting holes (i.e., the first and the second, or second and third) may include permanent magnets 820 comprised of the first magnetic material 820A, while the remaining magnet mounting hole includes permanent magnets 820 comprised of the second magnetic material 820B. Alternatively, two adjacent magnet mounting holes (i.e., the first and the second, or second and third) may include permanent magnets 820 comprised of the second magnetic material 820B, while the remaining magnet mounting hole includes permanent magnets 820 comprised of the first magnetic material 820A.

As illustrated in 10-12B, the permanent magnets 820 comprised of the first magnetic material 820A and the second magnetic material 820B may be provided in an alternating fashion along a circumference of the mounting frame 810. For example, one permanent magnet 820 comprised of the first magnetic material 820A may be provided between two permanent magnets 820 comprised of the second magnetic material 820B, or one permanent magnet 820 comprised of the second magnetic material 820B may be provided between two permanent magnets 820 comprised of the first magnetic material 820A. Alternatively, one permanent magnet 820 comprised of the first magnetic material 820A may be provided between two permanent magnets comprised of the first magnetic material 820A or provided between one permanent magnet comprised of the first magnetic material 820A and one permanent magnet comprised of the second magnetic material 820B. Alternatively, one permanent magnet 820 comprised of the second magnetic material 820B may be provided between two permanent magnets comprised of the second magnetic material 820B or provided between one permanent magnet comprised of the first magnetic material 820A and one permanent magnet comprised of the second magnetic material 820B.

The sizes of the permanent magnets 820 in any of FIGS. 8-12B may be uniform or non-uniform. For example, when the sizes of the permanent magnets 820 are non-uniform, the permanent magnets 820 comprised of the first magnetic material 820A may be larger than the permanent magnets 820 comprised of the second magnetic material 820B. Alternatively, the permanent magnets 820 comprised of the first magnetic material 820A may be smaller than the permanent magnets 820 comprised of the second magnetic material 820B.

A number of permanent magnets 820 comprised of the first magnetic material and a number of permanent magnets 820 comprised of the second magnetic material may be the same or different in any of FIGS. 8-12B. For example, a number of permanent magnets 820 comprised of the first magnetic material may be greater than a number of permanent magnets 820 comprised of the second magnetic material. Alternatively, the number of permanent magnets 820 comprised of the first magnetic material may be less than a number of permanent magnets 820 comprised of the second magnetic material.

As noted above with respect to FIGS. 4 and 5, each of the dips (e.g., Lorentzians) in the graphs may correspond to one or more axes of the defect centers within the NV diamond material 620. The bias magnetic field applied to the magneto-optical defect center material 720 may adjust the order and orientation of the Lorentzian dips in the graphs. Accordingly, there are forty-eight unique orientations of the Lorentzians such that each Lorentzian is distinguishable from the others (e.g., as in the graph of FIG. 5). Thus, there are forty-eight unique positions of the permanent magnets 820 around the magneto-optical defect center material 720 corresponding to each of the forty-eight orientations of the Lorentzians.

In some illustrative embodiments, the mounting frame 810 may be movable such that twelve of the forty-eight positions of the magnets permanent magnets 820 are accessible. That is, the mounting frame 810 cannot be positioned into all of the forty-eight positions because the mounting frame 810 would interfere with the housing of the magnetometer, which may span across the top and bottom of the mounting frame 810. In some illustrative embodiments, the mounting frame 810 may be positioned such that the Lorentzians are distinguishable from one another and such that the light is not interfered with as it passes through the through-hole to the magneto-optical defect center material 720.

Figure 11:
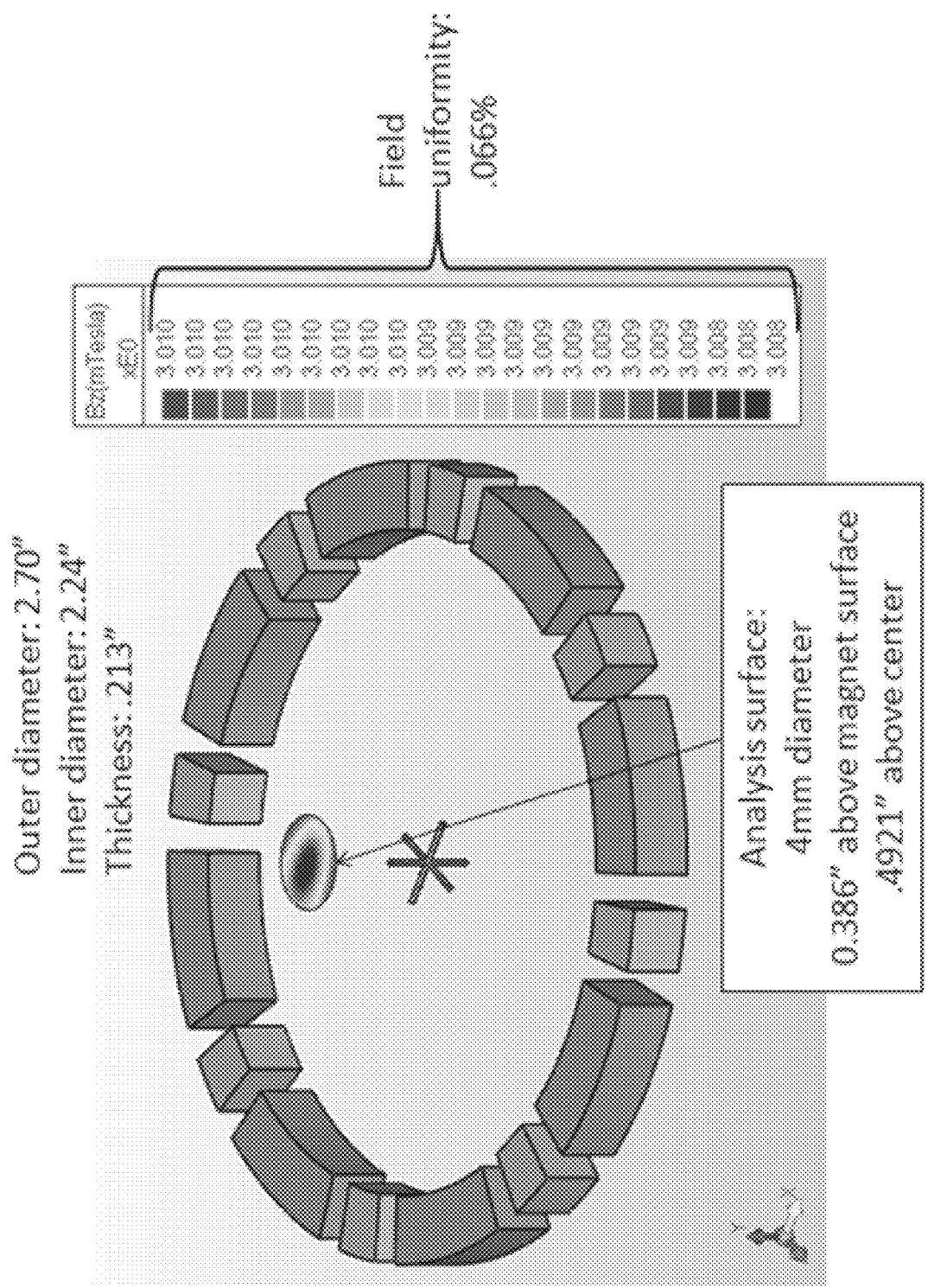
FIG. 11 illustrates examples of a uniform magnetic field generated by the magnetic field generator of FIG. 10.
Figure 12B:
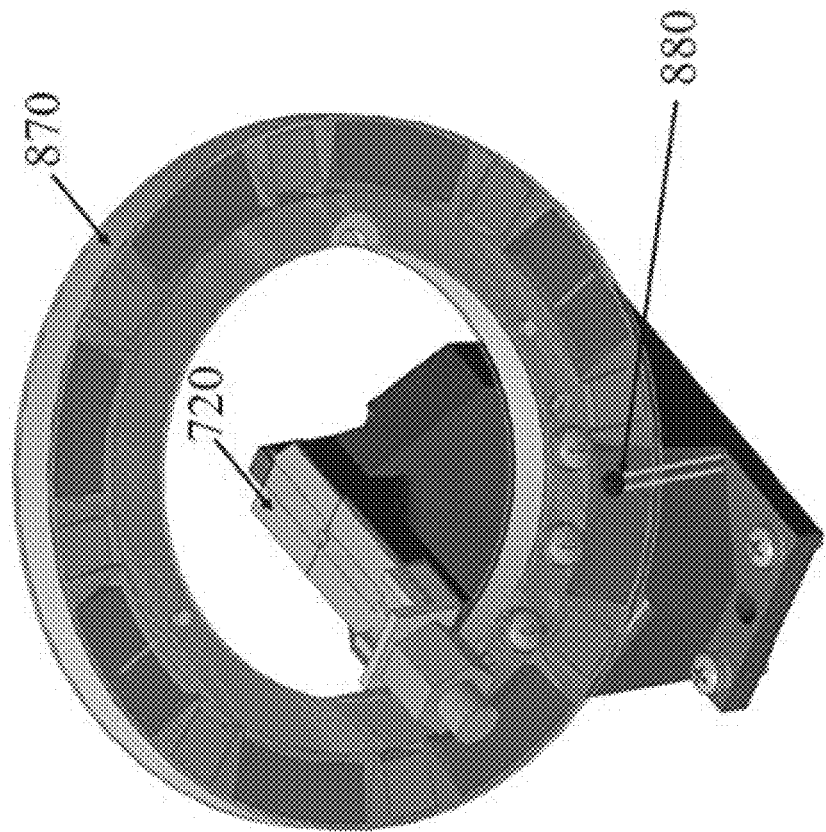
FIGS. 12A and 12B illustrate some different views of the mounting frame of FIG. 10 and a magneto-optical defect center material mounted to a base with the magneto-optical defect center material provided offset from a center of the mounting frame.
Figure 12A:
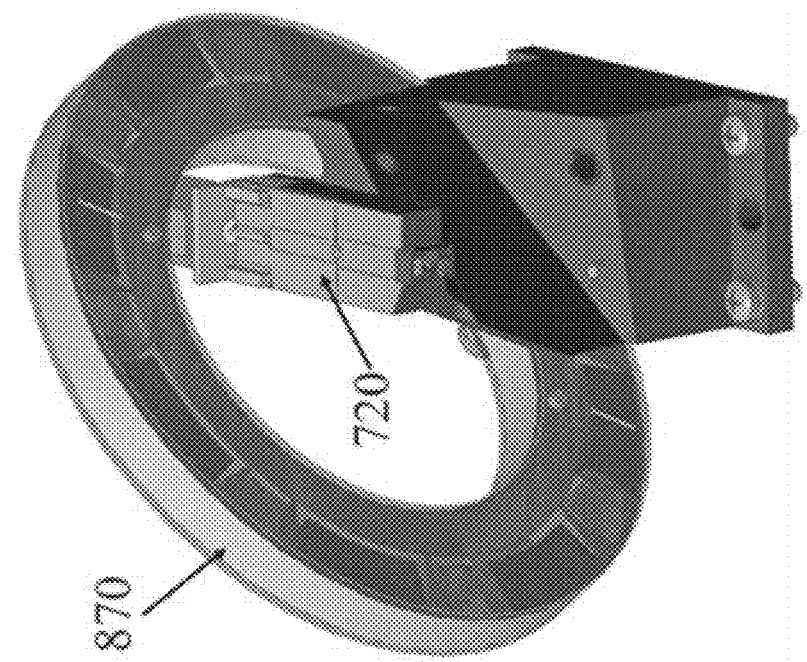

In some examples (see FIGS. 8-12B), the mounting frame 810 may be positioned such that the array of permanent magnets 820 are offset behind the magneto-optical defect center material 720. This creates a region having excellent magnetic field uniformity (see FIG. 11) in a plane of the magnetic field generator 870 that is centered on the magneto-optical defect center material 720. The dimensions included in FIG. 11 are non-limiting examples. Although this region provides excellent magnetic field uniformity in the x and y directions, the magnetic field may not be as uniform in the z direction. Therefore, in other examples (see FIGS. 8 and 9), the mounting frame 810 may be positioned such that the array of permanent magnets 820 are not offset with respect to the magneto-optical defect center material 720. This orientation results in slightly less magnetic field uniformity in the x and y directions, but greater magnetic field uniformity in the z direction.

By providing a magnetic field generator 870 including the thermal compensated Halbach magnet arrays described above, it may be possible to supply a very stable bias magnetic field over large temperature ranges. In particular, use of the thermal compensated Halbach magnet arrays removes the need to control the magnet temperature to the levels required by a non-thermal-compensated magnet. For example, instead of requiring maintenance of a temperature in a range of the predetermined temperature plus or minus tenths of a degree Celsius over the full test time (e.g., on the order of several hours), a thermal compensated magnet may only require temperature control, for example, of 20 degrees Celsius over a one or two hour period. Thus, the cooling system for the magnet and/or the magnetometer may be passive or much smaller, simpler, lighter, lower power consuming, and cheaper than an active cooling system.

Light Pipe with Focusing Lens

Figure 13:
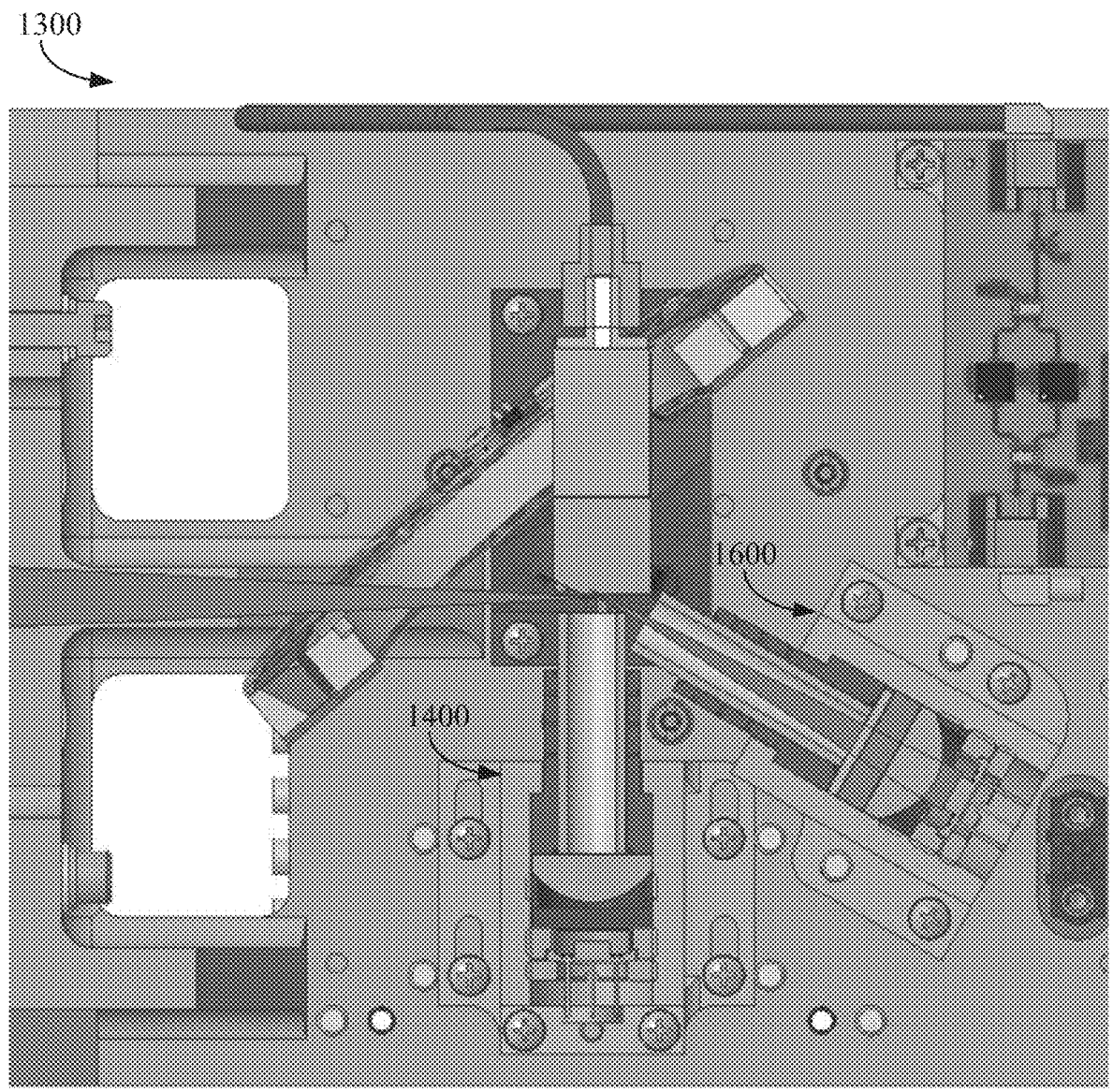
FIG. 13 is a partial cross-sectional view illustrating a magneto-optical defect center sensor and showing assemblies for light pipes and lenses for green and red light collection.

FIG. 13 is partial cross-sectional view illustrating some implementations of a magnetometer 1300 (e.g., the magnetometer of FIG. 7) and showing assemblies 1400, 1600 for light pipes and lenses for green and red light collection. Green light may be emitted from a laser optical assembly (not shown) and focused on a magneto-optical defect center material, such as a diamond having nitrogen vacancies. The red light collection assembly 1400 may be positioned relative to the magneto-optical defect center material to collect the red light emitted. The red light collection assembly 1400 is described in greater detail below in reference to FIG. 14. The green light collection assembly 1600 may be positioned relative to the magneto-optical defect center material to collect the green light that passes through the magneto-optical defect center material. In the implementation shown, the green light collection assembly 1600 may be offset at an angle of approximately 29.25 degrees based on the geometric configuration of the magneto-optical defect center material. The green light collection assembly 1600 is described in greater detail below in reference to FIG. 16.

Figure 14:
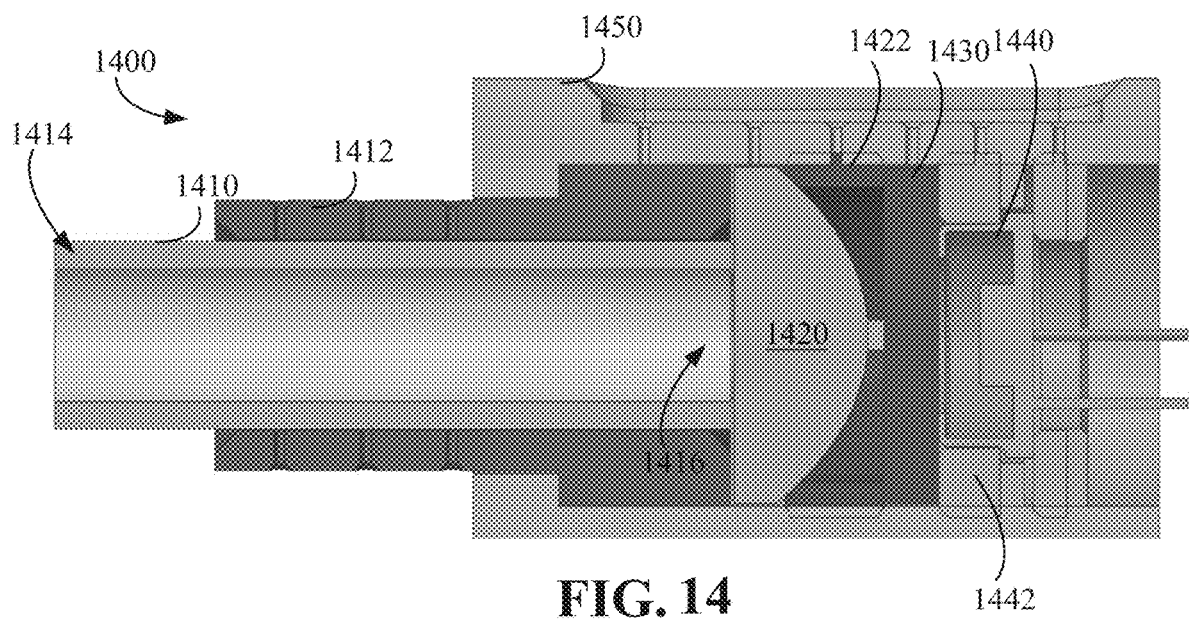
FIG. 14 is a cross-section illustrating a hollow light pipe with a collection lens and an associated mount for red light collection.

FIG. 14 depicts some implementations of a red light collection assembly 1400. The red light collection assembly 1400 may include an optical light pipe 1410, a light pipe mount 1412, a lens 1420, a lens retention ring 1422, a red filter 1430, a photo diode 1440, a photo diode mount 1442, and the assembly mount 1450. The optical light pipe 1410 may be a hollow copper tube having a highly reflective interior surface to reflect the light within the light pipe 1410. The air within the hollow tube may be substantially lossless for optical transmission. In some implementations, the reflective interior surface can be a silver layer. In other implementations, the reflective interior surface can be configured to minimize optical losses at a specific wavelength, such as 650 nanometers (nm) to 1450 nm. In other implementations, the inner surface of the light pipe 1410 can incorporate an optical filtering coating to absorb or filter wavelengths of light that are not of interest. In some instances, the light pipe 1410 may have a 5 millimeter (mm) inner diameter, a 7 mm outer diameter, and be 25 mm in length. The light pipe 1410 may be coupled or staked to the light pipe mount 1412 via adhesive within one or more openings formed in the light pipe mount 1412. The light pipe mount 1412 may be secured within the assembly mount 1450 via adhesive within one or more openings formed in the assembly mount 1450. The light pipe 1410 may be positioned proximate the magneto-optical defect center material at a first end 1414 and may be positioned proximate a lens 1420 at a second end 1416. In some implementation, a spacer washer can be positioned between the second end 1416 and the lens 1420.

The lens 1420 may be an aspheric lens or the like positioned to focus the light exiting the light pipe 1410 from the second end 1416 to a focal point corresponding to a collection portion of the photo diode 1440. By positioning the lens 1420 directly downstream of the light pipe 1410, substantially all of the light exiting the light pipe 1410 may be collected by the photo diode 1440. A lens retention ring 1422 mechanically secures the lens 1420 in position within the assembly mount 1450. In addition, the lens 1420 and lens retention ring 1422 can also be secured within the assembly mount 1450 via adhesive within one or more openings formed in the assembly mount 1450. In some implementations, the lens 1420 may be positioned within the light pipe 1410 and/or may be integrally formed with the light pipe 1410.

A red filter 1430 may be positioned proximate the lens 1420 to filter out wavelengths of light that do not correspond to a wavelength of interest, such as 650 nm to 1450 nm. In some implementations, the red filter 1430 may be a coating on the lens 1420 and/or may be incorporated integrally into the lens 1420 itself. The red filter 1430 can also be secured within the assembly mount 1450 via adhesive within one or more openings formed in the assembly mount 1450.

A photo diode 1440 may be positioned such that the collection portion may be located at the focal point of the lens 1420. The photo diode 1440 can be coupled to a photo diode mount 1442 to center the photo diode 1440 within the assembly mount 1450. In some implementations, the photo diode mount 1442 can also be secured within the assembly mount 1450 via adhesive within one or more openings formed in the assembly mount 1450. In some implementations, a retaining ring can be used to axially secure the photo diode mount 1442 within the assembly mount 1450.

Figure 15:
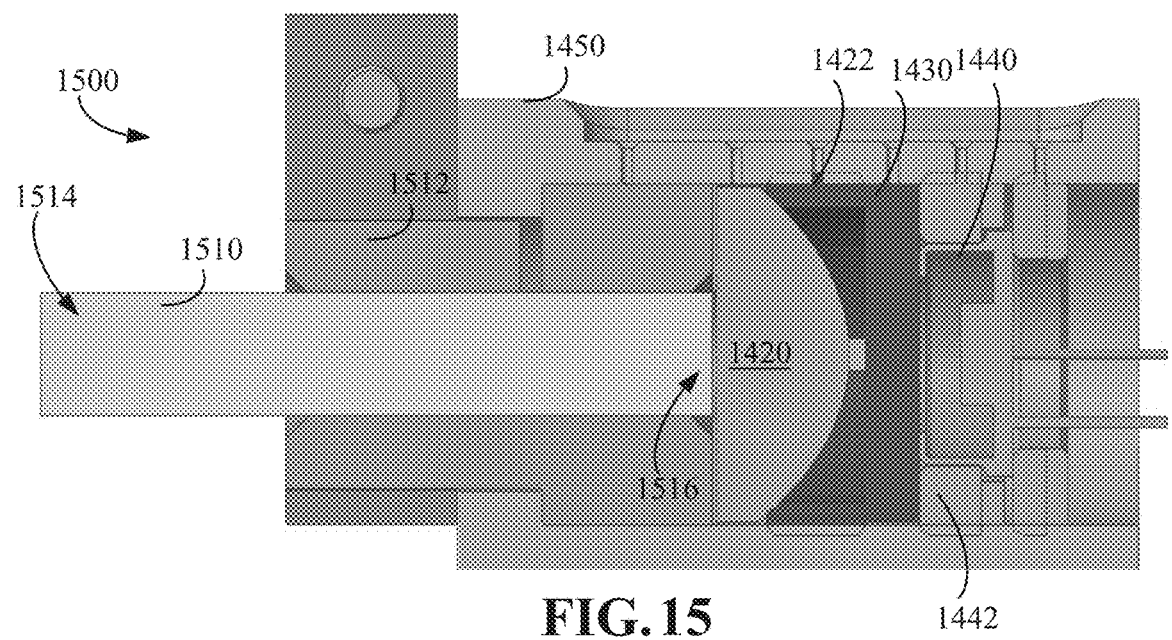
FIG. 15 is a cross-section illustrating a hexagonal light pipe with a collection lens and an associated mount for red light collection.

FIG. 15 depicts another red light collection assembly 1500 that may include an optical light pipe 1510, a light pipe mount 1512, a lens 1420, a lens retention ring 1422, a red filter 1430, a photo diode 1440, a photo diode mount 1442, and the assembly mount 1450. The optical light pipe 1510 may be a solid glass pipe having a highly reflective coating to reflect the light within the light pipe 1510. In some implementations, the reflective coating can be configured to minimize optical losses at a specific wavelength, such as 650 nm to 1450 nm. In other implementations, the light pipe 1510 itself can incorporate an optical filtering material to absorb or filter wavelengths of light that are not of interest. In some instances, the light pipe 1510 may be a hexagonal solid borosilicate glass material. The light pipe 1510 may be coupled to the light pipe mount 1512 via a compressible portion of the light pipe mount 1512 that may be clamped down to secure the light pipe 1510 to the light pipe mount 1512. The light pipe mount 1512 can be secured within the assembly mount 1450 via adhesive within one or more openings formed in the assembly mount 1450. The light pipe 1510 may be positioned proximate the magneto-optical defect center material at a first end 1514 and may be positioned proximate a lens 1420 at a second end 1516. In some implementation, a spacer washer can be positioned between the second end 1516 and the lens 1420.

Figure 16:
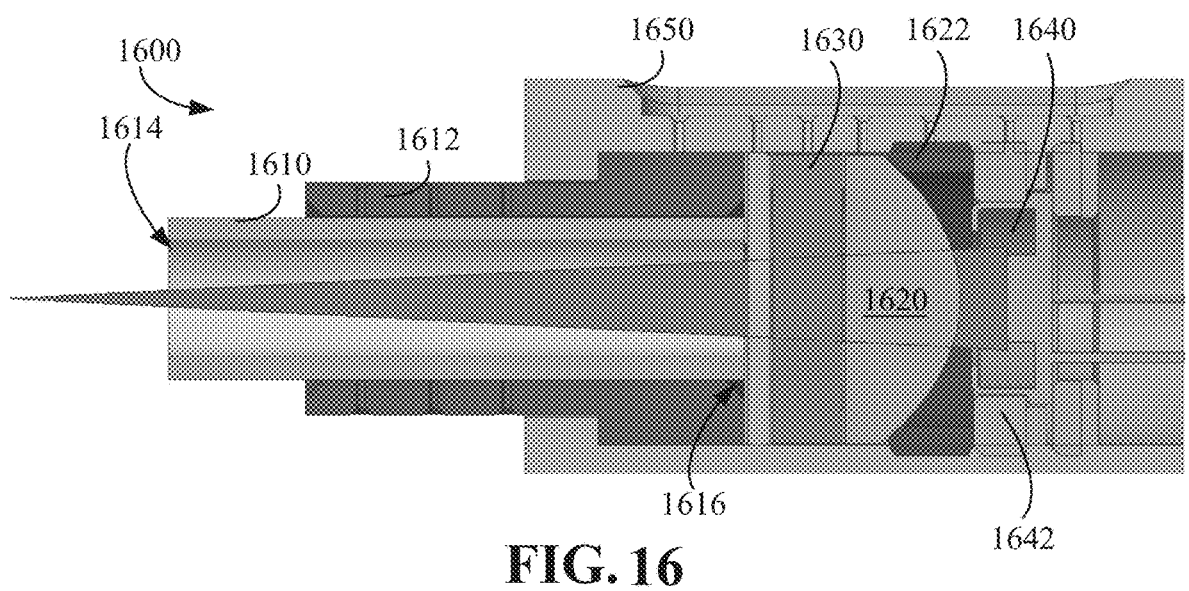
FIG. 16 is a cross-section illustrating a light pipe with a collection lens and an associated mount for green light collection.

FIG. 16 depicts some implementations of a green light collection assembly 1600. The green light collection assembly 1600 includes an optical light pipe 1610, a light pipe mount 1612, a lens 1620, a green filter 1630, a lens 1620, a lens retention ring 1622, a photo diode 1640, a photo diode mount 1642, and the assembly mount 1650. The optical light pipe 1610 may be a hollow copper tube having a highly reflective interior surface to reflect the light within the light pipe 1610. The air within the hollow tube may be substantially lossless for optical transmission. In some implementations, the reflective interior surface can be a silver layer. In other implementations, the reflective interior surface can be configured to minimize optical losses at a specific wavelength, such as 500 nm to 550 nm. In other implementations, the inner surface of the light pipe 1610 can incorporate an optical filtering coating to absorb or filter wavelengths of light that are not of interest. In some instances, the light pipe 1610 may have a 5 millimeter (mm) inner diameter, a 7 mm outer diameter, and be 25 mm in length. The light pipe 1610 may be coupled or staked to the light pipe mount 1612 via adhesive within one or more openings formed in the light pipe mount 1612. The light pipe mount 1612 may be secured within the assembly mount 1650 via adhesive within one or more openings formed in the assembly mount 1650. The light pipe 1610 may be positioned proximate the magneto-optical defect center material at a first end 1614 and may be positioned proximate a green filter 1630 at a second end 1616. In some implementation, a spacer washer can be positioned between the second end 1616 and the green filter 1630.

A green filter 1630 may be positioned proximate the lens 1620 to filter out wavelengths of light that do not correspond to a wavelength of interest, such as 500 nm to 550 nm. In some implementations, multiple green filters 1630 may be used depending on the intensity of light. In some implementations, the green filter 1630 may be a coating on the lens 1620 and/or may be incorporated integrally into the lens 1620 itself. The green filter 1630 can also be secured within the assembly mount 1650 via adhesive within one or more openings formed in the assembly mount 1650.

The lens 1620 may be an aspheric lens positioned to focus the light exiting the light pipe 1610 to a focal point corresponding to a collection portion of the photo diode 1640. Thus, by positioning the lens 1620 downstream of the light pipe 1610, substantially all of the light exiting the light pipe 1610 may be collected by the photo diode 1640. A lens retention ring 1622 mechanically secures the lens 1620 in position within the assembly mount 1650. In addition, the lens 1620 and lens retention ring 1622 can also be secured within the assembly mount 1650 via adhesive within one or more openings formed in the assembly mount 1650. In some implementations, the lens 1620 may be positioned within the light pipe 1610 and/or may be integrally formed with the light pipe 1610.

A photo diode 1640 may be positioned such that the collection portion may be located at the focal point of the lens 1620. The photo diode 1640 can be coupled to a photo diode mount 1642 to center the photo diode 1640 within the assembly mount 1650. In some implementations, the photo diode mount 1642 can also be secured within the assembly mount 1650 via adhesive within one or more openings formed in the assembly mount 1650. In some implementations, a retaining ring can be used to axially secure the photo diode mount 1642 within the assembly mount 1650.

Tubular Light Pipe

A light pipe with a lens at the end of the light pipe provides a collection system that efficiently starts and ends the process of directing and focusing the light to the photo diode. The light pipe may efficiently collect a large amount of light from the light source and may then direct that light to a lens or system of lenses, which may then efficiently focus the light onto the collection surface of the photo diode such that the maximum amount of light may be collected and measured. Since the sensitivity of an optical defect based magnetometer is directly related to the efficiency of the light collection, the combination of a light pipe with a lens or lenses results in a direct sensitivity improvement for the magnetometer system.

Magneto-optical defect center materials such as diamonds with nitrogen vacancy (NV) centers can be used to detect magnetic fields. Green light which enters a diamond structure with NV centers interacts with NV centers, and red light is emitted from the diamond. The amount of red light emitted can be used to determine the strength of the magnetic field. The efficiency and accuracy of sensors using magneto-optical defect center materials such as diamonds with NV centers (DNV sensors) may be increased by transferring as much light as possible from the NV centers to the photo sensor that measures the amount of red light. Magneto-optical defect center materials include but are not be limited to diamonds, Silicon Carbide (SiC) and other materials with nitrogen, boron, or other chemical defect centers.

In some implementations, a coated, hollow light pipe may be used to improve the optics and specifically the light collection efficiency in an optical defect center based magnetometer where the light collection optics directly relate to the performance of the magnetometer. While solid glass or other manufactured solid optical material light pipes may be used, such solid light pipes may suffer from efficiency issues. Solid light pipes have at least the efficiency issues of entrance loss, where some of the light entering the light pipe may be reflected, absorption, where the solid material attenuates some of the light through the length of the pipe through absorption, escape of light through the sides of the light pipe, where light hitting an edge of the light pipe at an angle beyond the angle for total internal reflection escapes through the side of the light pipe, and exit loss, where some of the light exiting the solid material light pipe may be reflected back into it.

A tubular, hollow light pipe has the benefits of no entrance loss or exit loss because the tube is not a solid material, but rather hollow in the middle where the light may be traveling. There may be nearly no attenuation loss because the hollow center of the tube where the light travels is full of air, which over the length of most light pipes has no measurable attenuation of the light. In some embodiments, there are no or reduced escape issues from the total internal reflection because the reflective coating on the inside of the hollow portion of the light pipe directs the light from the entrance side to the exit side. If a reflective coating is used, there may be some amount of light that, but still much less absorption than through a solid material light pipe.

Figure 17:
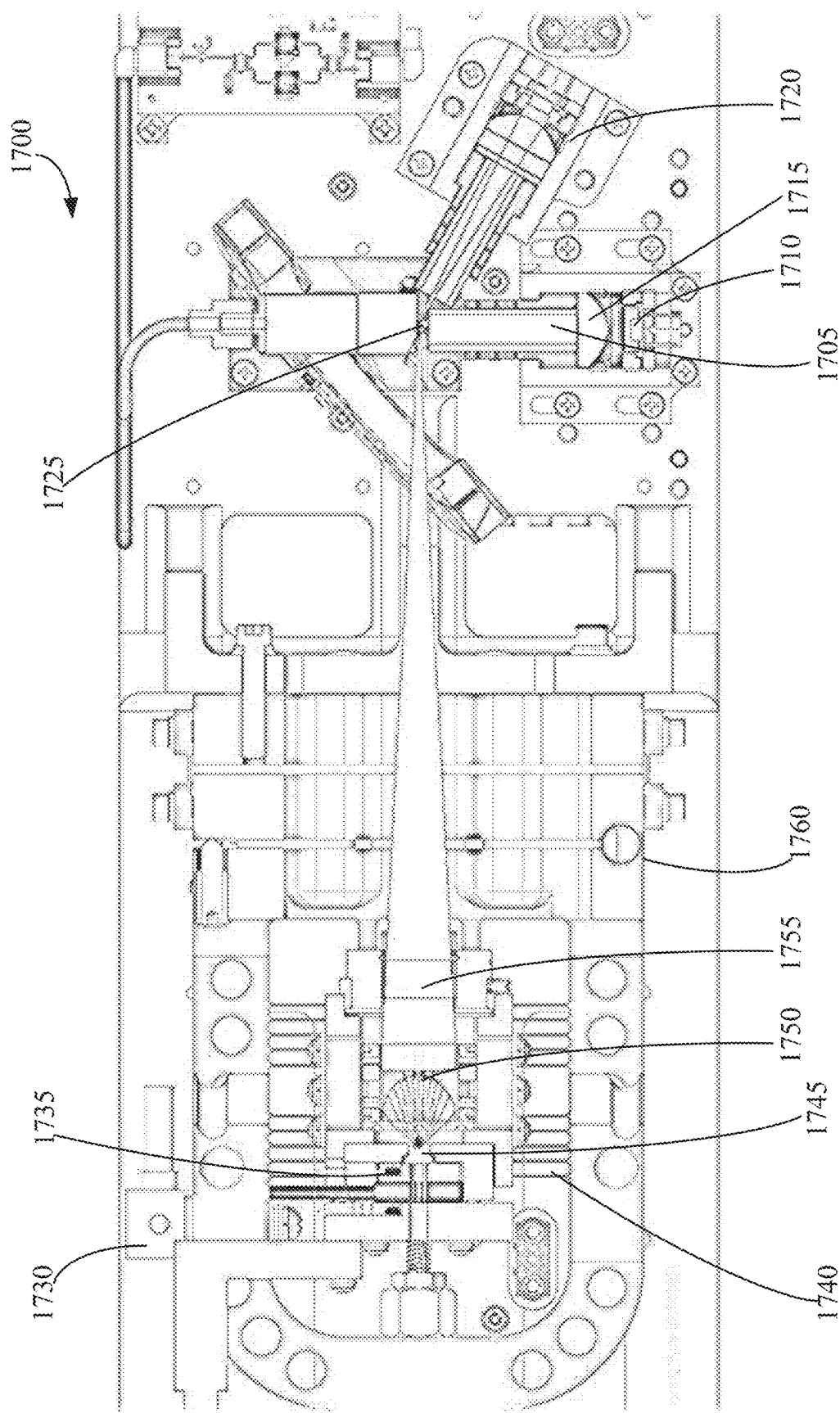
FIG. 17 illustrates an optical excitation assembly as a cross-section including light pipes in some embodiments.

FIG. 17 illustrates an optical excitation assembly 1700 as a cross-section including light pipes in accordance with some embodiments. The optical excitation assembly 1700 includes, in brief, a first light pipe 1705, a photo diode 1710 (e.g., a photo diode for detecting red light), a lens assembly with red filter 1715, a second light pipe 1720 (with similar corresponding assembly to the first light pipe 1705 but for detecting green light), a magneto-optical defect center material 1725 with defect centers, an accelerometer 1730, one or more thermistors 1735, laser position adjustment flexure rib array 1740, an optical excitation module 1745, an optical excitation focusing lens cell 1750, a waveplate for laser polarization control 1755, and a laser angle adjustment flexure rib 1760.

Still referring to FIG. 17 and in further detail, the optical excitation assembly 1700 comprises a first light pipe 1705. In some embodiments, the first light pipe 1705 may be configured to operably connect to an assembly for detecting red light (e.g., using a photo diode 1710 configured to detect red light). The first light pipe 1705 may have any appropriate geometry. In some embodiments, the first light pipe 1705 may be cylindrical and hollow. The hollow inside surface may be coated with a reflective surface. In some embodiments, the first light pipe 1705 comprises a copper structure, silver inner reflective surface, and gold outer surface. A light pipe with such a structure may have approximately 95% reflection at a wavelength of light of 515 nm. In some embodiments, the reflection increases as the wavelength increases. In some embodiments, the first light pipe 1705 may be configured to be mountable as outer points of the light pipe can be contacted without increasing emission loss from the light pipe. In some embodiments, the first light pipe 1705 may have a circular cross-section, square cross-section, rectangular cross-section, hexagonal cross-section, or octagonal cross-section. In some embodiments, the light pipe may be a tubular piece of glass or metal (e.g., copper) that may be hollow on the inside and that has an inside surface coated with a reflective coating that directs light from the entrance side to the exit side such that the first light pipe 1705 functions as a light pipe. The first light pipe 1705 may be formed from any appropriate material (e.g., copper structure). In some embodiments, the optical excitation assembly 1700 comprises a second light pipe assembly 1720. In some embodiments, the second light pipe assembly 1720 comprises a second light pipe configured to operably connect to the assembly for detecting green light similar to the above configuration for the first light pipe 1705.

The light pipe can be selected to have an appropriate aperture size. The aperture of the light pipe can be selected to be matched to or smaller than the optical detector. This size relationship allows the optical detector to capture the highest possible percentage of the light emitted by the light pipe. The aperture of the light pipe can be also selected to be larger than the surface of the diamond material to which it may be coupled. This size relationship allows the light pipe to capture the highest possible percentage of light emitted by the magneto-optical defect center material. In some embodiments, the light pipe may have an aperture of about 4 mm. In some other embodiments, the light pipe may have an aperture of about 2 mm. In some embodiments, the light pipe may have an aperture of 4 mm, and the magneto-optical defect material may have a coupled surface with a height of 0.6 mm and a length of 2 mm, or less. The light pipe may have any appropriate length, such as about 25 mm. The light pipe can be positioned such that the end surface of the light pipe adjacent the magneto-optical material may be parallel, or substantially parallel, to the associated surface of the magneto-optical material. This arrangement allows the light pipe to capture an increased amount of the light emitted by the magneto-optical defect center material as possible. The alignment of the surfaces of the light pipe and the magneto-optical defect center material ensures that a maximum amount of the light emitted by the magneto-optical defect center material will intersect the end surface of the light pipe, thereby being captured by the light pipe.

The optical excitation assembly 1700 comprises a photo diode 1710. In some embodiments, the photo diode 1710 may be configured to collect light (e.g., red or green light collection).

The optical excitation assembly 1700 comprises a lens assembly with red filter 1715. In some implementations, light from the magneto-optical defect center material 1725 may be directed through the lens assembly with red filter 1715 to filter out light in the excitation band (in the green, for example), and to pass light in the red fluorescence band. The lens assembly with red filter 1715 may be any appropriate optical filter capable of transmitting red light and reflecting other light, such as green light. In some embodiments, the red filter may be a coating applied to an end surface of the lens assembly. The coating may be any appropriate anti-reflection coating for red light. In some embodiments, the anti-reflective coating may exhibit greater than 99% transmittance for light in the wavelength range of about 650 nm to about 850 nm. Preferably, the anti-reflective coating may exhibit greater than 99.9% transmittance for light in the wavelength range of about 650 nm to about 850 nm. The optical filter 650 may be disposed on an end surface of the lens 1825 assembly adjacent to the light pipe. In some embodiments, the red filter 1715 may also be highly reflective for light other than red light, such as green light. Such an optical filter may be a dichroic coating or multiple coatings with the desired cumulative optical properties. The optical filter may exhibit less than about 0.1% transmittance for light with a wavelength of less than about 600 nm. Preferably, the optical filter may exhibit less than about 0.01% transmittance for light with a wavelength of less than about 600 nm. In some embodiments, the optical excitation assembly 1700 comprises a lens assembly 1720 configured similarly with a green light filter. In some implementations, light from the magneto-optical defect center material 1725 may be directed through the lens assembly 1720 to filter out light in the excitation band (in the red, for example), and to pass light in the green fluorescence band. The lens assembly 1720 may be any appropriate optical filter capable of transmitting green light and reflecting other light, such as red light. In some embodiments, the green filter may be a coating applied to an end surface of the lens assembly. The coating may be any appropriate anti-reflection coating for green light.

The filter(s) may be a coating formed by any appropriate method. In some embodiments, the filter(s) may be formed by an ion beam sputtering (IBS) process. The coating may be a single-layer coating or a multi-layer coating. The coating may include any appropriate material, such as magnesium fluoride, silica, hafnia, or tantalum pentoxide. The material for the coating may be selected based on the light pipe material and the material which the coating will be in contact with, such as an optical coupling material, to produce the desired optical properties. The coating may have a hardness that approximately matches the hardness of the light pipe. The coating may have a high density, and exhibit good stability with respect to humidity and temperature.

The optical excitation assembly 1700 comprises a magneto-optical defect center material 1725 with defect centers. In general, a variety of different magneto-optical defect center material, with a variety of magneto-optical defect centers can be used (e.g., diamond with nitrogen vacancy defect centers). Magneto-optical defect center materials include but are not limited to diamonds, Silicon Carbide (SiC) and other materials with nitrogen, boron, or other defect centers.

In some embodiments, the optical excitation assembly 1700 further comprises an accelerometer 1730, one or more thermistors 1735, a laser position adjustment flexure rib array 1740, and a laser angle adjustment flexure rib 1760. The optical excitation assembly 1700 comprises an optical excitation module 1745. The optical excitation module 1745 may be a directed light source. In some embodiments, the optical excitation module 1745 may be a light emitting diode. In some embodiments, the optical excitation module 1745 may be a laser diode.

The optical excitation assembly 1700 comprises an optical excitation focusing lens cell 1750. In some embodiments, the optical excitation focusing lens cell 1750 may be configured to focus light coming from the exit of a light pipe (e.g., a first light pipe 1705) on to a photo diode for collection.

The optical excitation assembly 1700 comprises a waveplate for laser polarization control 1755. In some embodiments, the waveplate may be a half-wave plate. In some embodiments, the waveplate may be a quarter-wave plate. The waveplate may be configured to be rotated relative to the optical excitation assembly 1700 in order to change the polarization of the light (e.g., laser light).

Figure 18:
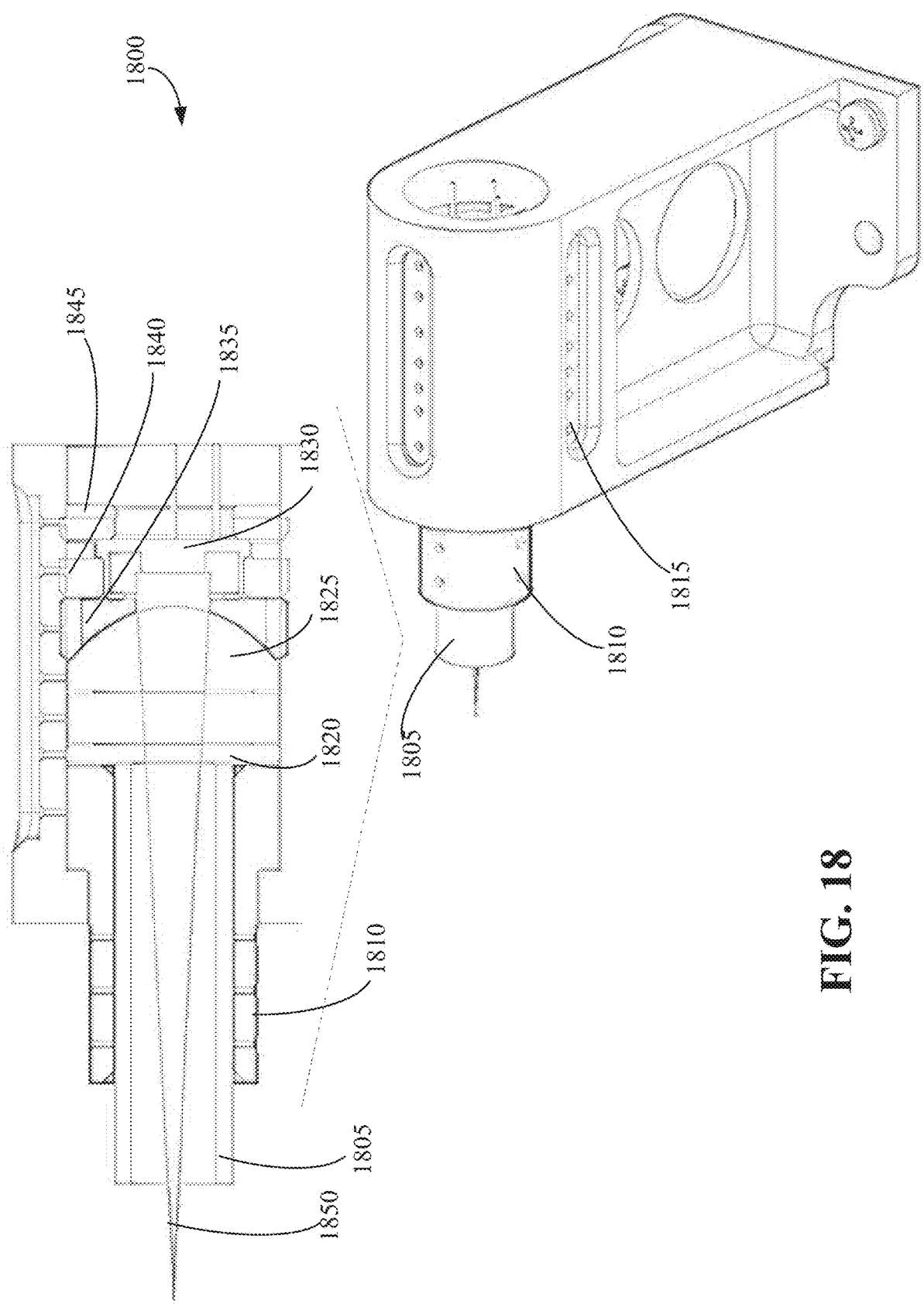
FIG. 18 illustrates a light pipe with body mount in some embodiments.

FIG. 18 depicts a light pipe with body mount 1800 illustrated in accordance with some embodiments. The figure also shows across section as viewed from above of a portion of body mount including the light pipe. The light pipe with body mount 1800 includes, in brief, a light pipe tube 1805 (e.g., hollow light pipe tube), a light pipe mount 1810, holes for staking optics for vibration 1815, one or more filters 1820, a lens 1825, a photo diode 1830, a lens retaining ring 1835, a photo diode mount 1840, and a photo diode retaining ring 1845. A representation of a light path 1850 is also shown.

Still referring to FIG. 18 and in further detail, the light pipe with body mount 1800 comprises a light pipe tube 1805. In some embodiments, the light pipe tube 1805 may be configured to operably connect to an assembly for detecting red light or green light (e.g., using a photo diode 1830 configured to detect red light or green light). The light pipe tube 1805 may have any appropriate geometry. In some embodiments, the light pipe tube 1805 may be cylindrical and hollow. The hollow inside surface may be coated with a reflective surface. In some embodiments, the light pipe tube 1805 comprises a copper structure, silver inner reflective surface, and gold outer surface. A light pipe with such a structure may have approximately 95% reflection at a wavelength of light of 515 nm. In some embodiments, the reflection increases as the wavelength increases. In some embodiments, the light pipe tube 1805 may be configured to be mountable as outer points of the light pipe can be contacted without increasing emission loss from the light pipe. In some embodiments, the light pipe tube 1805 may have a circular cross-section, square cross-section, rectangular cross-section, hexagonal cross-section, or octagonal cross-section. In some embodiments, the light pipe tube 1805 may be a tubular piece of glass or metal (e.g., copper) that may be hollow on the inside and that has an inside surface coated with a reflective coating that directs light from the entrance side to the exit side such that the light pipe tube 1805 functions as a light pipe. The light pipe tube 1805 may be formed from any appropriate material (e.g., copper structure with reflective coatings).

The light pipe with body mount 1800 comprises a light pipe mount 1810. The light pipe mount 1810 can be made of any material (e.g., plastic) that can hold the light pipe securely. Since, the performance of the hollow light pipe (e.g., light pipe tube 1805) is not diminished by contact or mounting points, the light pipe mount 1810 can be configured to hold the light pipe (e.g., light pipe tube 1805) securely. The light pipe with body mount 1800 may further comprise holes for staking optics for vibration 1815.

The light pipe with body mount 1800 comprises one or more filters 1820. The filter(s) may be a coating formed by any appropriate method. In some embodiments, the filter(s) may be formed by an ion beam sputtering (IBS) process. The coating may be a single-layer coating or a multi-layer coating. The coating may include any appropriate material, such as magnesium fluoride, silica, hafnia, or tantalum pentoxide. The material for the coating may be selected based on the light pipe material and the material which the coating will be in contact with, such as an optical coupling material, to produce the desired optical properties. The coating may have a hardness that approximately matches the hardness of the light pipe. The coating may have a high density, and exhibit good stability with respect to humidity and temperature.

The light pipe with body mount 1800 comprises a lens 1825. In some embodiments, the lens 1825 may be configured to focus light coming from the exit of a light pipe (e.g., light pipe tube 1805) on to a photo diode for collection. In some embodiments, the light pipe with body mount 1800 comprises a photo diode 1830. In some embodiments, the photo diode 1830 may be configured to collect light (e.g., red or green light collection). In some embodiments, the lens 1825 may be held in place by a lens retaining ring 1835 and the photo diode (e.g., photo diode 1830) may be held in place by a photo diode mount 1840 and photo diode retaining ring 1845. In some implementations, an optical coupling material may be disposed between one or more of a light pipe, filter, magneto-optical defect material, photo diode, and lens as described in various embodiments. The optical coupling material may be any appropriate optical coupling material, such as a gel or epoxy. In some embodiments, the optical coupling material may be selected to have optical properties, such as an index of refraction, that improves the light transmission between the coupled components. The coupling material may be in the form of a layer formed between the components to be coupled. The optical coupling material may be configured to optically couple the light pipe to the magneto-optical defect center material. In some embodiments, the coupling material layer may have a thickness of about 1 micron to about 5 microns. The coupling material may serve to eliminate air gaps between the components to be coupled, increasing the light transmission efficiency. The coupling material may produce a light transmission between the components to be coupled that may be functionally equivalent to direct contact between the components to be coupled. In some embodiments, an epoxy coupling material may also serve to mount the magneto-optical defect material to the optical waveguide assembly, such that other supports for material are not required. In some embodiments, a coupling material may not be necessary where direct contact between the optical filter or light pipe and the optical detector is achieved. Similarly, a coupling material may not be necessary where direct contact between the light pipe and the magneto-optical defect center material is achieved.

Vibration Insensitive Precision Adjustability

Figure 19:
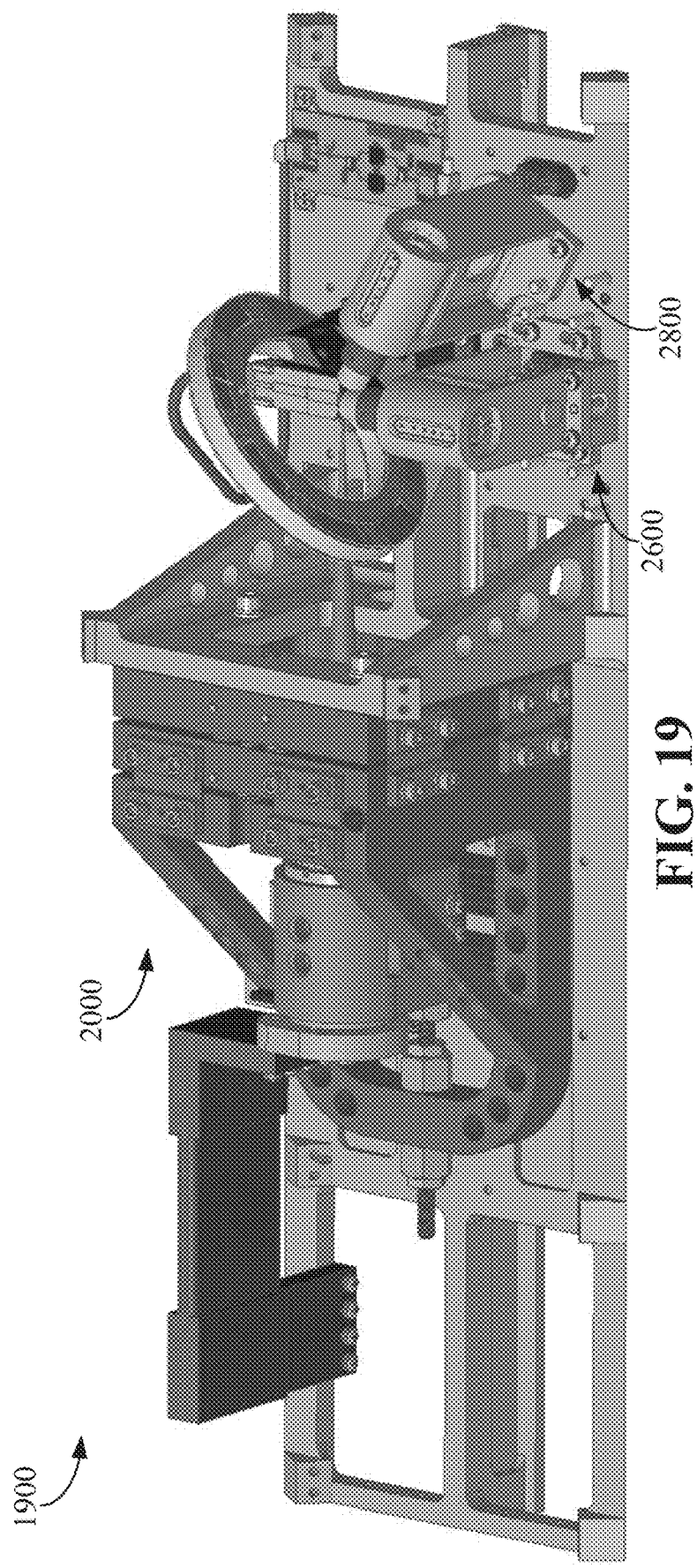
FIG. 19 is a perspective view illustrating a magneto-optical defect center sensor and showing assemblies for a laser mount and light pipes and lenses for green and red light collection.
Figure 20:
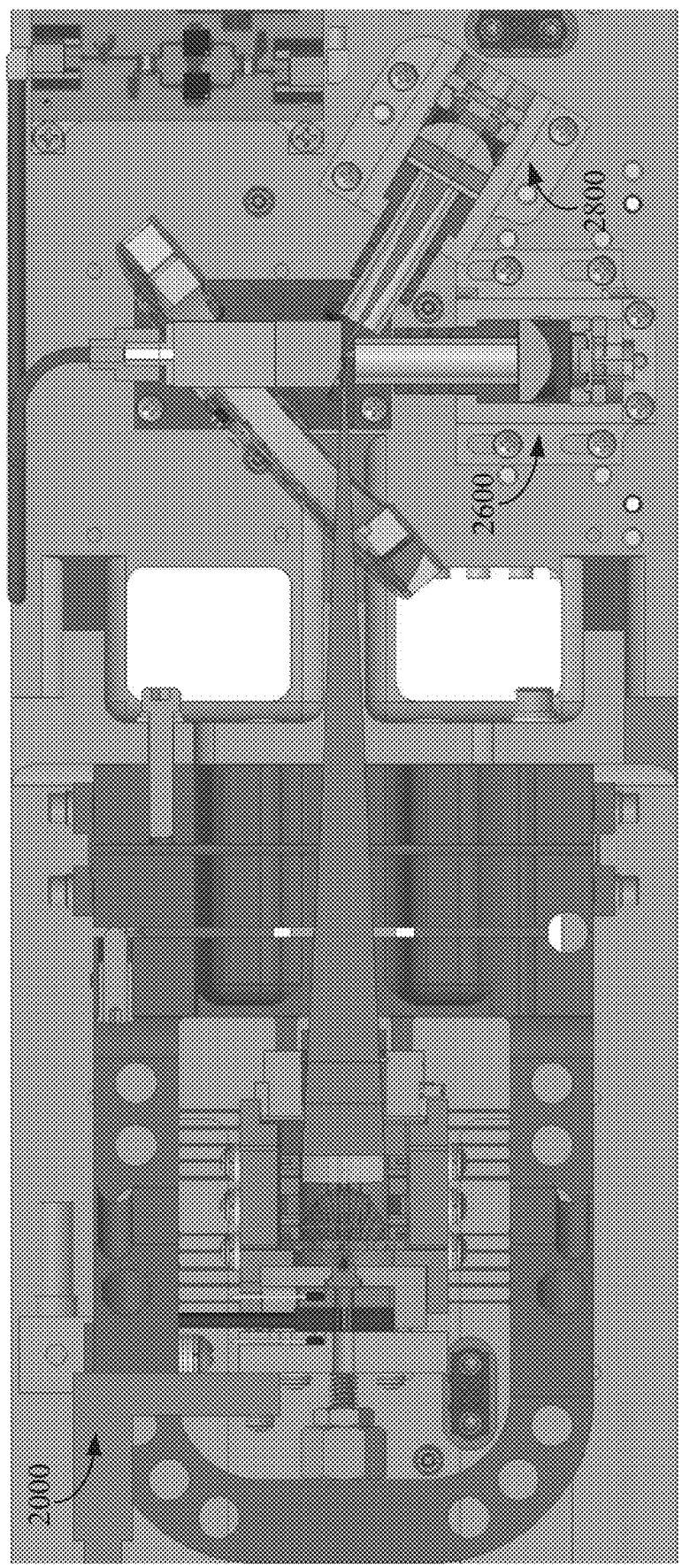
FIG. 20 is a top view illustrating the magneto-optical defect center sensor of FIG. 19.

FIG. 19 is perspective view depicting a magneto-optical defect center sensor 3100 and showing a laser mount assembly 2000 and assemblies 2600, 2200 for light pipes and lenses for green and red light collection. As shown generally in FIGS. 19-20, green light may be emitted from a laser optical assembly 2000 and focused on a magneto-optical defect center material, such as a diamond having nitrogen vacancies. The laser optical assembly 2000 is described in greater detail below in reference to FIGS. 21-24. The red light collection assembly 2600 may be positioned relative to the magneto-optical defect center material to collect the red light emitted. The red light collection assembly 2600 may be described in greater detail below in reference to FIGS. 25-26. The green light collection assembly 1000 may be positioned relative to the magneto-optical defect center material to collect the green light that passes through the magneto-optical defect center material that does not fluoresce into red light from the magneto-optical defect centers. In the implementation shown, the green light collection assembly 1000 may be offset at an angle of approximately 29.25 degrees based on the geometric configuration of the magneto-optical defect center material. The green light collection assembly 1000 is described in greater detail below in reference to FIGS. 27-28.

Figure 21:
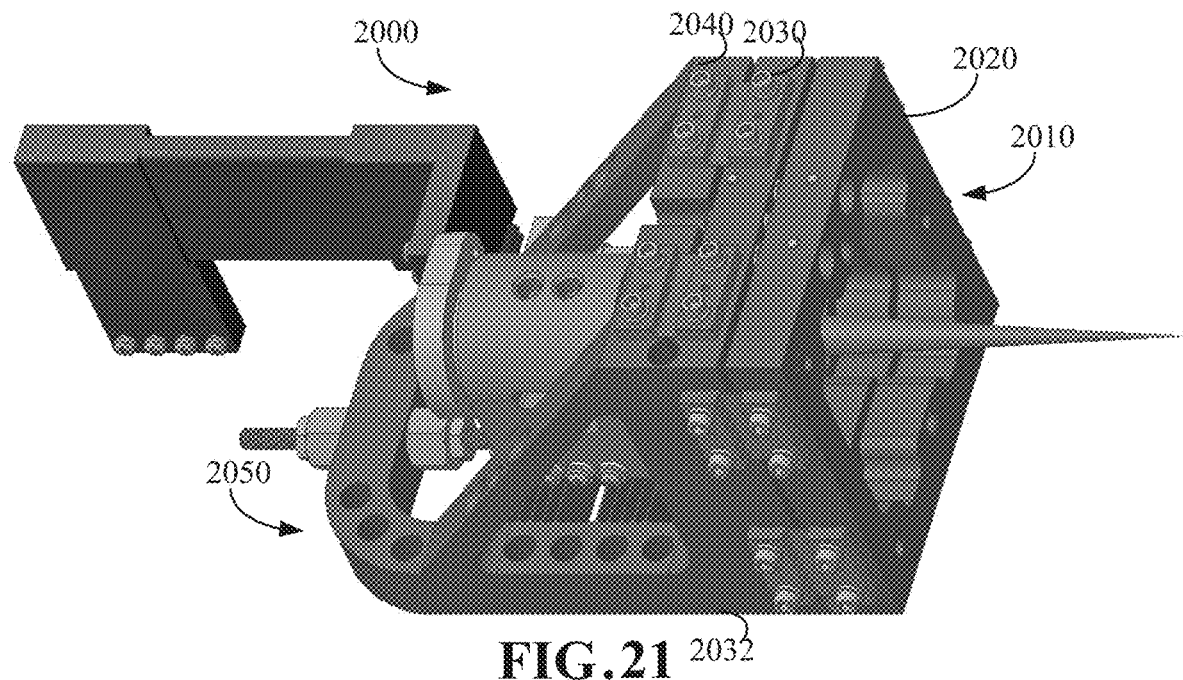
FIG. 21 is a perspective view illustrating the laser mount of FIG. 19.
Figure 22:
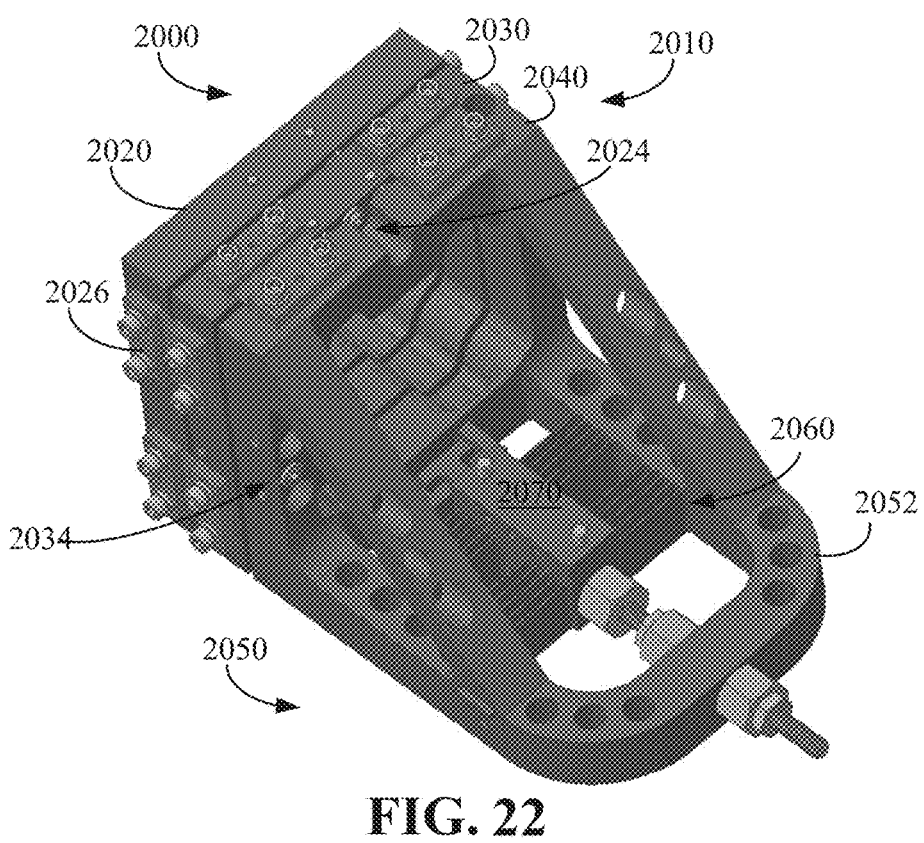
FIG. 22 is another perspective view illustrating the laser mount of FIG. 19.
Figure 23:
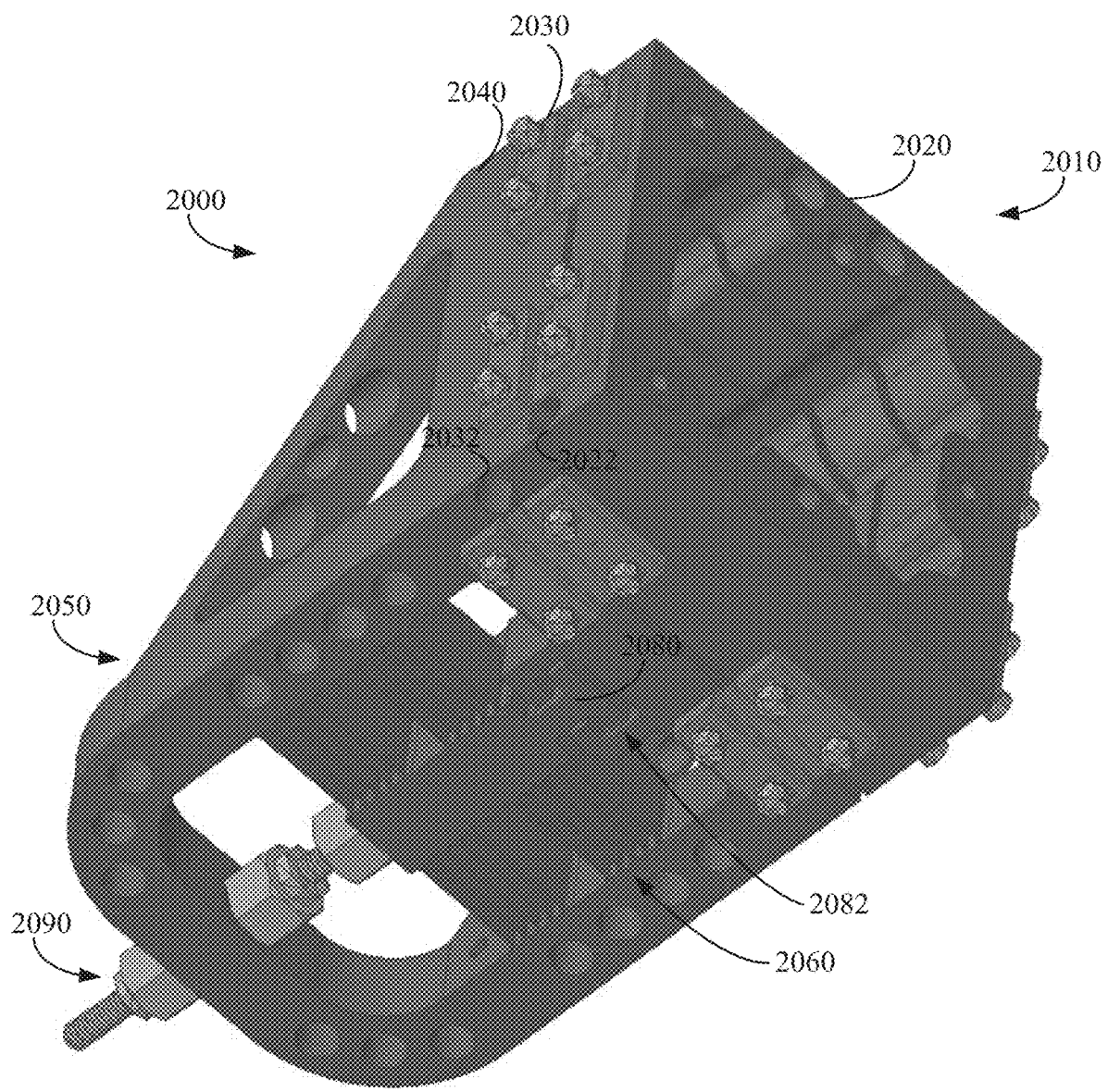
FIG. 23 is another perspective view illustrating the laser mount of FIG. 19.
Figure 24:
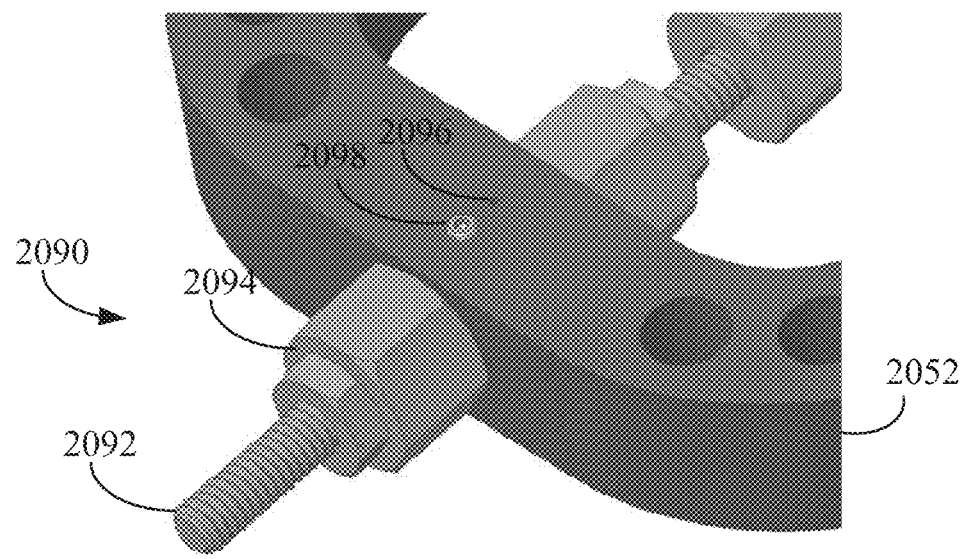
FIG. 24 is a magnified perspective view illustrating a Z-axis adjustment component of the laser mount of FIGS. 21-23.

FIGS. 21-24 generally depict the laser optical assembly 2000. The laser optical assembly 2000 includes a tip and tilt flexure assembly 2010 and a Z-axis adjustment assembly 2050. The tip and tilt flexure assembly 2010 includes a first frame member portion 2020, a second frame member portion 2030, and a third frame member portion 2040. The first frame member portion 2020 may be substantially separated from the second frame member portion 2030 except for a tilt flexure rib 2022 coupling the first frame member portion 2020 to the second frame member portion 2030, as shown in FIG. 23. The tilt flexure rib 2022 can be approximately 0.050 inches to permit flexure of the first frame member portion 2020 relative to the second frame member portion 2030, without plastically deforming the tilt flexure rib 2022. A nudger 2024 may be used to finely adjust the tilt angle of the first frame member portion 2020 relative to the second frame member portion 2030. In some implementations, the nudger 2024 can include one or more springs, such as two springs, to assist retracting or pushing the first frame member portion 2020 relative to the second frame member portion 2030. In some implementations, one or more fixation straps 2026 can be affixed, either mechanically via screws, adhesively, or both, to the first frame member portion 2020 and the second frame member portion 2030 to secure the first frame member portion 2020 relative to the second frame member portion 2030. In some implementations, the nudger 2024 and/or screws of the fixation straps 2026 can be removed to reduce the weight of the assembly once secured in position. In other implementations, the nudger 2024 and/or screws of the fixation straps 2026 can remain in place during operation.

The second frame member portion 2030 may be substantially separated from the third frame member portion 2040 except for a tip flexure rib 2032 coupling the second frame member portion 2030 to the third frame member portion 2040, as shown in FIG. 23. The tip flexure rib 2032 can be approximately 0.050 inches to permit flexure of the second frame member portion 2030 relative to the third frame member portion 2040, without plastically deforming the tip flexure rib 2032. A nudger 2034 may be used to finely adjust the tilt angle of the second frame member portion 2030 relative to the third frame member portion 2040. In some implementations, the nudger 2034 can include one or more springs, such as two springs, to assist retracting or pushing the second frame member portion 2030 relative to the third frame member portion 2040. In some implementations, one or more fixation straps 2026 can be affixed, either mechanically via screws, adhesively, or both, to the second frame member portion 2030 and the third frame member portion 2040 to secure the second frame member portion 2030 relative to the third frame member portion 2040. In some implementations, the nudger 2034 and/or screws of the fixation straps 2026 can be removed to reduce the weight of the assembly once secured in position. In other implementations, the nudger 2034 and/or screws of the fixation straps 2026 can remain in place during operation.

As shown in FIGS. 21-23, the Z-axis adjustment assembly 2050 includes an outer frame member 2052 and a plurality of flexure ribs 2060 connecting the outer frame member 2052 to a laser mount 2070. In the implementation shown, the plurality of flexure ribs 2060 include four sets of five flexure ribs 2060, with two sets of five ribs on each side. The flexure ribs 2060 can be approximately 0.050 inches to permit flexure of the flexure ribs 2060 to adjust a Z-axis position of the laser mount 2070 relative to the outer frame member 2052. As shown in FIG. 23, a motion limiter 2080, such as a T-shaped member, can be positioned within a channel 2082 to limit the maximum movement of the laser mount 2070 relative to the outer frame member 2052 to limit the maximum deformation of the plurality of flexure ribs 2060. The Z-axis adjustment assembly 2050 includes a Z-axis adjustment component 2090, shown in FIG. 24. The Z-axis adjustment component 2090 includes a threaded rod 2092 coupled to nuts 2094 secured relative to the laser mount 2070 and the outer frame member 2052. The threaded rod 2092 and/or the nuts 2094 are rotated to selectively adjust the position of the laser mount 2070 relative to the outer frame member 2052 while the plurality of flexure ribs 2060 flex. The outer frame member 2052 includes an opening 2096 through which an adhesive can be applied to secure the threaded rod 2092 relative to the outer frame member 2052. In some implementations, a set screw 2098 can be used to secure the threaded rod 2092 relative to the outer frame member 2054, either in lieu of the adhesive or in addition thereto.

Figure 25:
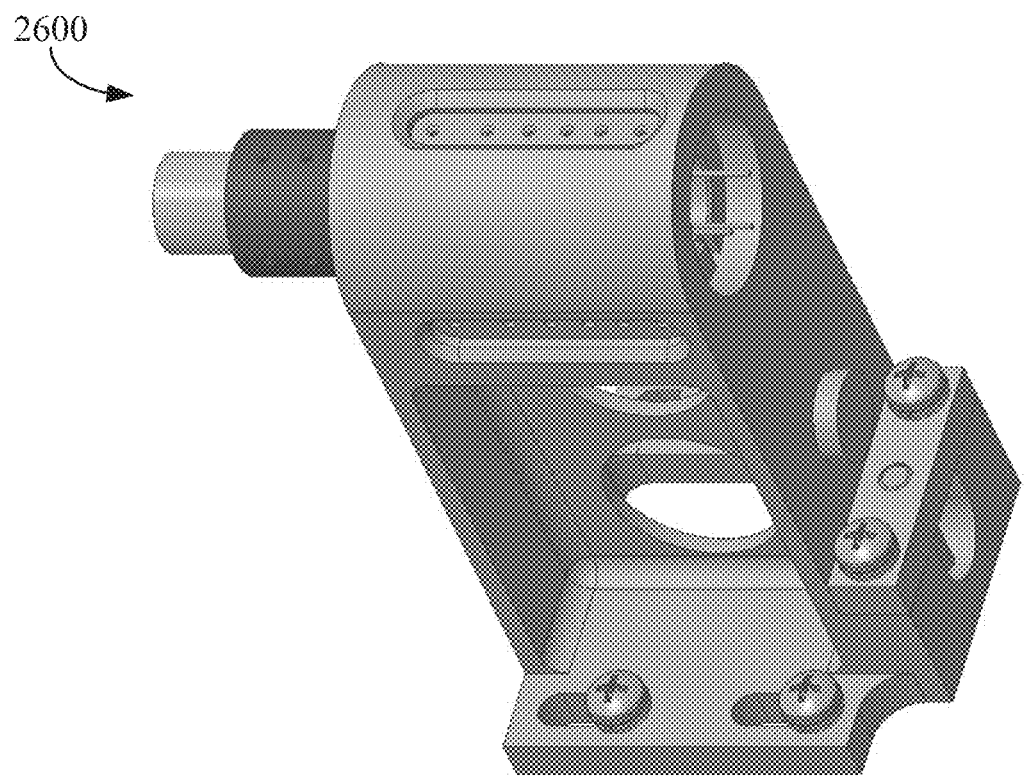
FIG. 25 is a perspective view illustrating the red light collection assembly of FIG. 19.
Figure 26:
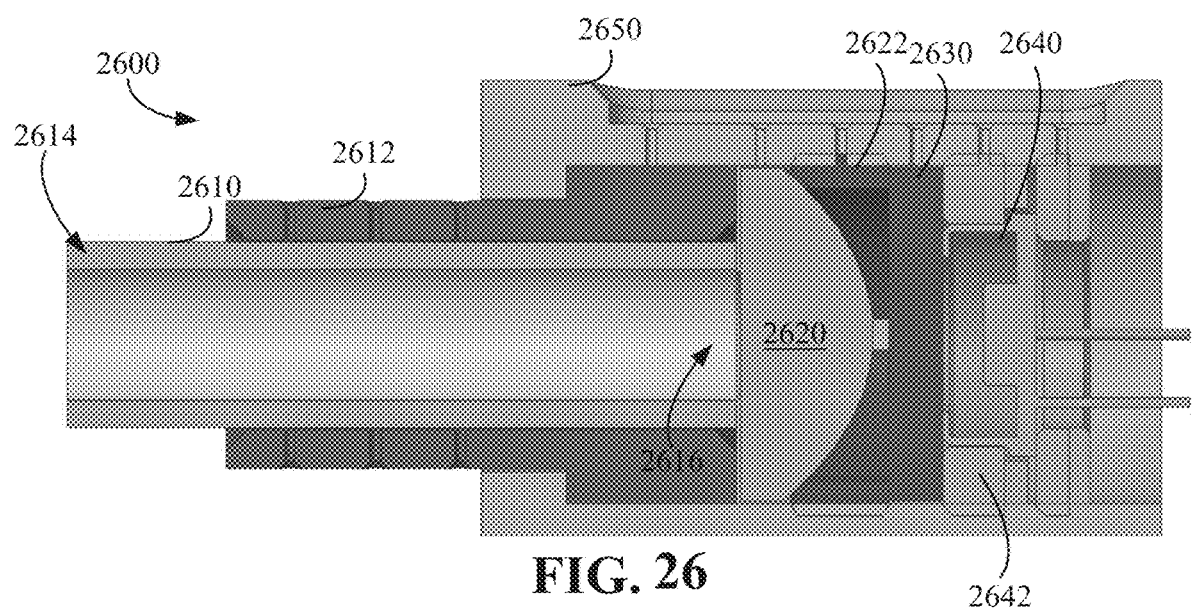
FIG. 26 is a cross-section illustrating a hollow light pipe with a collection lens and an associated mount of the red light collection assembly of FIG. 25.

FIGS. 25-26 depict an implementation of a red light collection assembly 2600. The red light collection assembly 2600 includes an optical light pipe 2610, a light pipe mount 2612, a lens 2620, a lens retention ring 2622, a red filter 2630, a photo diode 2640, a photo diode mount 2642, and the assembly mount 2650. The assembly mount 2650 includes slotted openings 1452 to selectively adjust a Z-axis of the red light collection assembly 2600 relative to the magneto-optical defect center material.

The optical light pipe 2610 may be a hollow copper tube having a highly reflective interior surface to reflect the light within the light pipe 2610. The air within the hollow tube may be substantially lossless for optical transmission. In some implementations, the reflective interior surface can be a silver layer. In other implementations, the reflective interior surface can be configured to minimize optical losses at a specific wavelength, such as 650 nanometers (nm) to 2050 nm. In other implementations, the inner surface of the light pipe 2610 can incorporate an optical filtering coating to absorb or filter wavelengths of light that are not of interest. In some instances, the light pipe 2610 may have a 5 millimeter (mm) inner diameter, a 7 mm outer diameter, and be 25 mm in length. The light pipe 2610 may be coupled or staked to the light pipe mount 2612 via adhesive within one or more openings formed in the light pipe mount 2612. The light pipe mount 2612 may be secured within the assembly mount 2650 via adhesive within one or more openings formed in the assembly mount 2650. The light pipe 2610 may be positioned proximate the magneto-optical defect center material at a first end 2614 and may be positioned proximate a lens 2620 at a second end 2616. In some implementation, a spacer washer can be positioned between the second end 2616 and the lens 2620.

The lens 2620 may be an aspheric lens or the like positioned to focus the light exiting the light pipe 2610 from the second end 2616 to a focal point corresponding to a collection portion of the photo diode 2640. Thus, by positioning the lens 2620 directly downstream of the light pipe 2610, substantially all of the light exiting the light pipe 2610 may be collected by the photo diode 2640. A lens retention ring 2622 mechanically secures the lens 2620 in position within the assembly mount 2650. In addition, the lens 2620 and lens retention ring 2622 can also be secured within the assembly mount 2650 via adhesive within one or more openings formed in the assembly mount 2650. In some implementations, the lens 2620 may be positioned within the light pipe 2610 and/or may be integrally formed with the light pipe 2610.

A red filter 2630 may be positioned proximate the lens 2620 to filter out wavelengths of light that do not correspond to a wavelength of interest, such as 650 nm to 2050 nm. In some implementations, the red filter 2630 may be a coating on the lens 2620 and/or may be incorporated integrally into the lens 2620 itself. The red filter 2630 can also be secured within the assembly mount 2650 via adhesive within one or more openings formed in the assembly mount 2650.

A photo diode 2640 may be positioned such that the collection portion may be located at the focal point of the lens 2620. The photo diode 2640 can be coupled to a photo diode mount 2642 to center the photo diode 2640 within the assembly mount 2650. In some implementations, the photo diode mount 2642 can also be secured within the assembly mount 2650 via adhesive within one or more openings formed in the assembly mount 2650. In some implementations, a retaining ring can be used to axially secure the photo diode mount 2642 within the assembly mount 2650.

In some implementations, the optical light pipe 2610 may be a solid glass pipe having a highly reflective coating to reflect the light within the light pipe 2610. In some implementations, the reflective coating can be configured to minimize optical losses at a specific wavelength, such as 650 nm to 2650 nm. In other implementations, the light pipe 2610 itself can incorporate an optical filtering material to absorb or filter wavelengths of light that are not of interest. In some instances, the light pipe 2610 may be a hexagonal solid borosilicate glass material. The light pipe 2610 may be coupled to the light pipe mount 2612 via a compressible portion of the light pipe mount 2612 that may be clamped down to secure the light pipe 2610 to the light pipe mount 2612.

Figure 27:
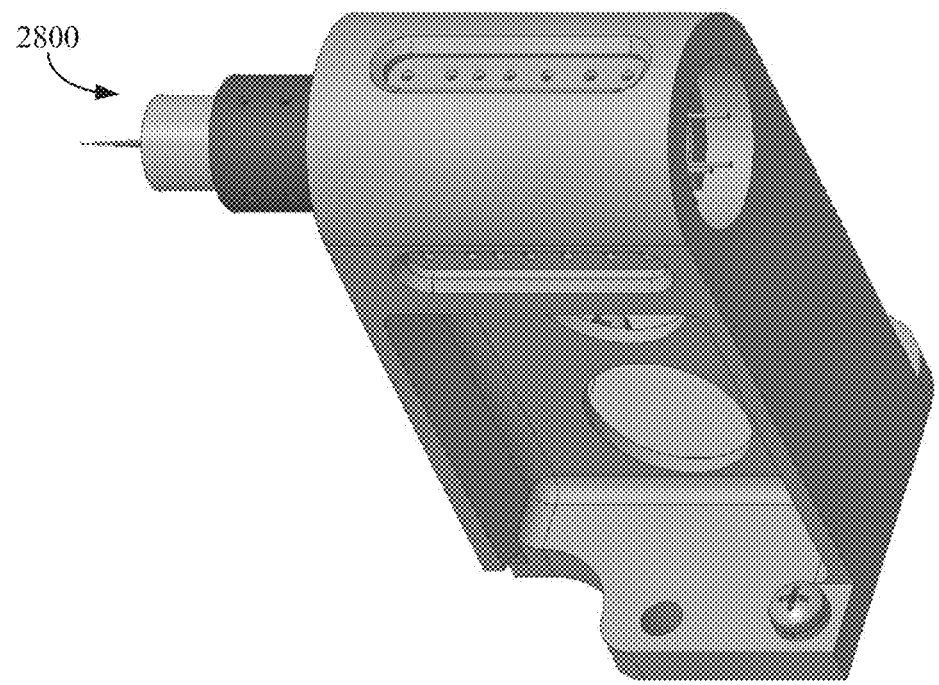
FIG. 27 is a perspective view illustrating the green light collection assembly of FIG. 19.
Figure 28:
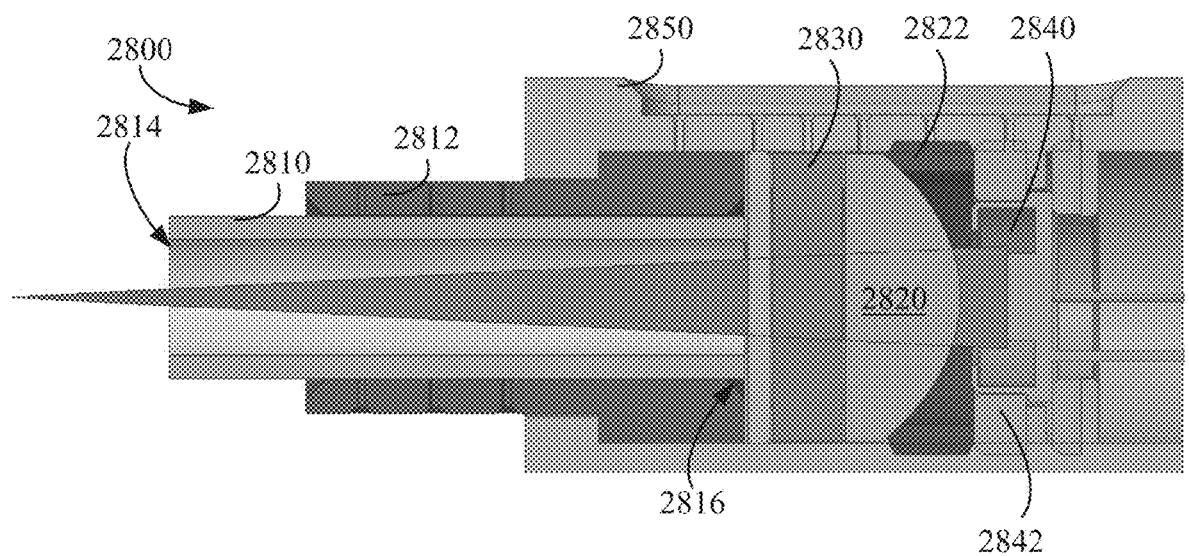
FIG. 28 is a cross-section illustrating a light pipe with a collection lens and an associated mount of the green light collection assembly of FIG. 27.
Figure 29:
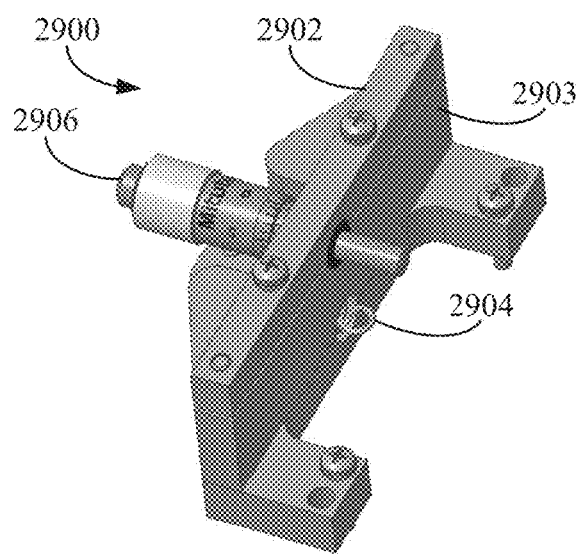
FIG. 29 is a perspective view illustrating a light collection assembly adjustment tool for adjusting the light collection assemblies.
Figure 30:
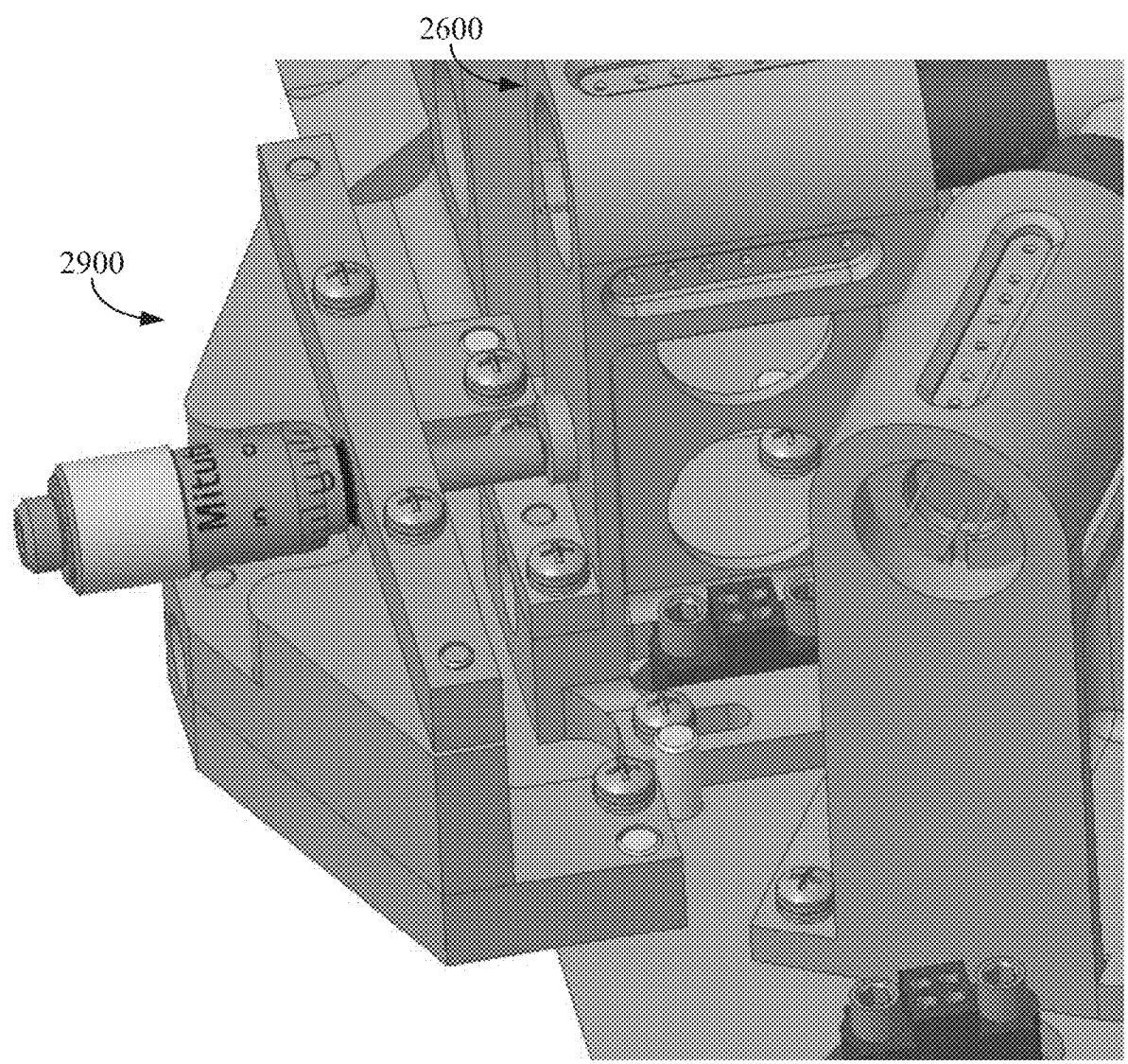
FIG. 30 is a perspective view of the light collection assembly adjustment tool of FIG. 29 engaged with the red light collection assembly of FIG. 25.

FIGS. 27-28 depicts an implementation of a green light collection assembly 2200. The green light collection assembly 2200 includes an optical light pipe 2810, a light pipe mount 2812, a green filter 2830, a lens 2820, a lens retention ring 2822, a photo diode 2840, a photo diode mount 2842, and the assembly mount 2850. In some implementations, the assembly mount 2850 can include slotted openings to selectively adjust the axial position of the green light collection assembly 2200 relative to the magneto-optical defect center material.

The optical light pipe 2810 may be a hollow copper tube having a highly reflective interior surface to reflect the light within the light pipe 2810. The air within the hollow tube may be substantially lossless for optical transmission. In some implementations, the reflective interior surface can be a silver layer. In other implementations, the reflective interior surface can be configured to minimize optical losses at a specific wavelength, such as 500 nm to 550 nm. In other implementations, the inner surface of the light pipe 2810 can incorporate an optical filtering coating to absorb or filter wavelengths of light that are not of interest. In some instances, the light pipe 2810 may have a 5 millimeter (mm) inner diameter, a 7 mm outer diameter, and be 25 mm in length. The light pipe 2810 may be coupled or staked to the light pipe mount 2812 via adhesive within one or more openings formed in the light pipe mount 2812. The light pipe mount 2812 may be secured within the assembly mount 2850 via adhesive within one or more openings formed in the assembly mount 2850. The light pipe 2810 may be positioned proximate the magneto-optical defect center material at a first end 2814 and may be positioned proximate a green filter 2830 at a second end 2816. In some implementation, a spacer washer can be positioned between the second end 2816 and the green filter 2830.

A green filter 2830 may be positioned proximate the lens 2820 to filter out wavelengths of light that do not correspond to a wavelength of interest, such as 500 nm to 550 nm. In some implementations, multiple green filters 2830 may be used depending on the intensity of light. In some implementations, the green filter 2830 may be a coating on the lens 2820 and/or may be incorporated integrally into the lens 2820 itself. The green filter 2830 can also be secured within the assembly mount 2850 via adhesive within one or more openings formed in the assembly mount 2850.

The lens 2820 may be an aspheric lens or the like positioned to focus the light exiting the light pipe 2810 to a focal point corresponding to a collection portion of the photo diode 2840. Thus, by positioning the lens 2820 downstream of the light pipe 2810, substantially all of the light exiting the light pipe 2810 may be collected by the photo diode 2840. A lens retention ring 2822 mechanically secures the lens 2820 in position within the assembly mount 2850. In addition, the lens 2820 and lens retention ring 2822 can also be secured within the assembly mount 2850 via adhesive within one or more openings formed in the assembly mount 2850. In some implementations, the lens 2820 may be positioned within the light pipe 2810 and/or may be integrally formed with the light pipe 2810.

A photo diode 2840 may be positioned such that the collection portion may be located at the focal point of the lens 2820. The photo diode 2840 can be coupled to a photo diode mount 2842 to center the photo diode 2840 within the assembly mount 2850. In some implementations, the photo diode mount 2842 can also be secured within the assembly mount 2850 via adhesive within one or more openings formed in the assembly mount 2850. In some implementations, a retaining ring can be used to axially secure the photo diode mount 2842 within the assembly mount 2850.

In some implementations, the filters and lenses described herein can be incorporated into a customized photo diode to integrate the components into a compact package.

Figure 31:
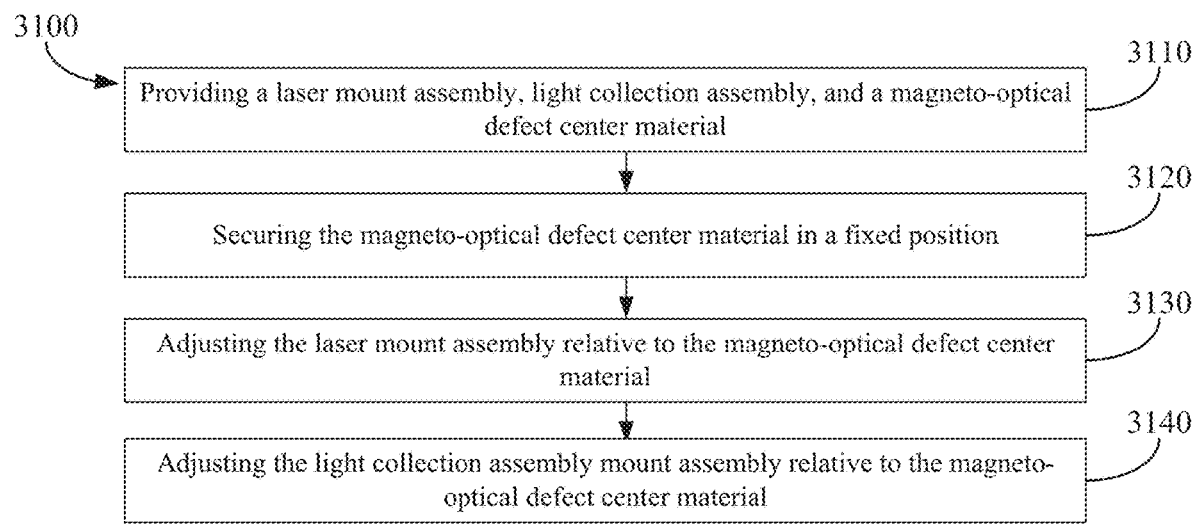
FIG. 31 depicts a process for assembling and adjusting the laser mount assembly and light collection assemblies.

FIG. 31 depicts a process 3100 for process for assembling and adjusting the laser mount assembly 2000 and light collection assemblies 2600, 2200. The process 3100 includes providing a laser mount assembly 2000, light collection assembly 2600, 2200, and a magneto-optical defect center material (block 3110). The process 3100 includes securing the magneto-optical defect center material in a fixed position (block 3120). Securing of the magneto-optical defect center material can include mounting the magneto-optical defect center material to a mount and securing the mount on a base plate.

The process 3100 includes mounting the laser mount assembly 2000 and adjusting the laser mount assembly 2000 relative to the magneto-optical defect center material (block 3130). Adjusting the laser mount assembly 2000 relative to the magneto-optical defect center material can include adjusting the tip, tilt, and/or Z-axis position. The tip and tilt can be adjusted using the tilt flexure rib 2022 and tip flexure rib 2032 with the nudgers 823, 2034 to adjust lensing of a laser assembly to optically focus an optical excitation source at a point and/or plane of the magneto-optical defect center material. The Z-axis position can adjust the Z-axis focal point of the optical excitation by moving the laser mount 2070 in the Z-axis using the Z-axis adjustment assembly 2050. In some implementations, the fixation straps 2026 can be fixed for the tip/tilt prior to adjusting the Z-axis. The Z-axis position can then be adjusted and fixed in position. In other implementations, an iterative process can be implemented to fine tune the tip, tilt, and Z-axis position of the focal point and/or plane of the optical excitation source relative to the magneto-optical defect center material.

The process 3100 includes mounting a light collection assembly mount assembly 2600, 2200 and adjusting the light collection assembly mount assembly 2600, 2200 relative to the magneto-optical defect center material (block 3140). Adjusting the light collection assembly mount assembly 2600, 2200 relative to the magneto-optical defect center material can include adjusting the Z-axis position to position the light collection assembly mount assembly 2600, 2200 for maximum light collection at the photo diode. The Z-axis position can be adjusted using the light collection assembly adjustment tool 2900. In some implementations, the light collection assembly mount assembly 2600, 2200 can be fixed by mechanically and/or adhesively. In some implementations, the light collection assembly adjustment tool 2900 may only be used during manufacturing/adjustment, and may therefore, not be a permanent part of the magnetometer.

In some implementations, an iterative process can be implemented to fine tune the tip, tilt, and Z-axis position of the focal point and/or plane of the optical excitation source relative to the magneto-optical defect center material and the Z-axis position of the light collection assembly mount assembly 2600, 2200.

In some implementations, the filters and lenses described herein can be incorporated into a customized photo diode to integrate the components into a compact package.

Thermal Electric Cooling the Excitation Light Source

Figure 32:
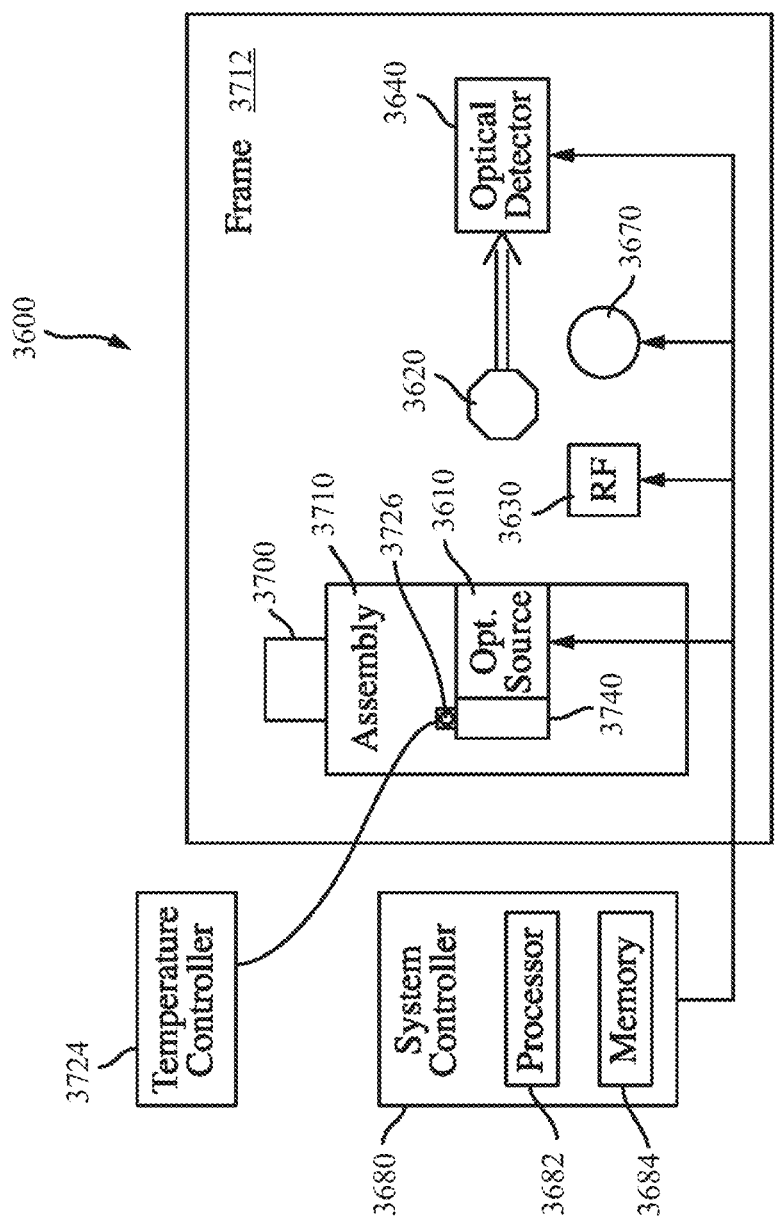
FIG. 32 is a schematic diagram illustrating some embodiments of a magnetic field detection system.

FIG. 32 is a schematic diagram of a magnetic field detection system 3600 according to some embodiments. The system 3600 includes an optical excitation source assembly 3710 comprising an optical excitation source 3610, where the optical excitation source 3610 directs optical excitation to an NV diamond material 3620 with NV centers, or another magneto-optical defect center material with magneto-optical defect centers. An RF excitation source 3630 provides RF radiation to the NV diamond material 3620. A magnetic field generator 3670 generates a magnetic field, which may be detected at the NV diamond material 3620 along with external magnetic fields.

The system 3600 further includes a system controller 3680 arranged to receive a light detection signal from the optical detector 3640 and to control the optical excitation source 3610, the RF excitation source 3630, and magnetic field generator 3670, and to perform calculations. The system controller 3680 may be a single controller, or may have multiple subcontrollers. For a system controller including multiple subcontrollers, each of the subcontrollers may perform different functions, such as controlling different components of the system 3600.

The RF excitation source 3630 may be a microwave coil, for example. The RF excitation source 3630 may be controlled to emit RF radiation with a photon energy resonant with the transition energy between the ground $m_s=0$ spin state and the $m_s=\pm 1$ spin states as discussed above with respect to FIG. 3.

The optical excitation source 3610 may be a laser or a light emitting diode, for example, which emits light in the green, for example. The optical excitation source 3610 induces fluorescence in the red from the NV diamond material 3620, where the fluorescence corresponds to an electron transition from the excited state to the ground state. Light from the NV diamond material 3620 may be directed to be detected by the optical detector 3640. The optical detector 3640 may comprise two detectors, for example, one detecting fluorescence light in the red and another detecting light in the green. The optical excitation light source 3610, in addition to exciting fluorescence in the NV diamond material 3620, may also serve to reset the population of the $m_s=0$ spin state of the ground state $^3A_2$ to a maximum polarization, or other desired polarization.

The system controller 3680 may be arranged to receive a light detection signal from the optical detector 3640 and to control the optical excitation source 3610, the RF excitation source 3630, and magnetic field generator 3670. The system controller 3680 may include a processor 3682 and a memory 3684, in order to control the operation of the optical excitation source 3610, the RF excitation source 3630, and the magnetic field generator 3670, and to perform calculations. The memory 3684, which may include a nontransitory computer readable medium, may store instructions to allow the operation of the optical excitation source 3610, the RF excitation source 3630, and the magnetic field generator 3670 to be controlled. That is, the system controller 3680 may be programmed to provide control.

Optical Excitation Source Assembly

As shown in FIG. 32, the optical excitation source assembly 3710 includes the optical excitation source 3610 and an active cooling element 3740. The active cooling element 3740 may be arranged to actively cool the optical excitation source 3610. In this regard, active cooling is different from passive cooling, where for example in passive cooling the object to be cooled may be merely thermally connected to a heat sink, for example. The active cooling element 3740 may be a thermal electric cooler, for example. The active cooling element 3740 may be in thermal contact with the optical excitation source 3610, although the active cooling element 3740 may not be in direct physical contact with the optical excitation source 3610. For example, the optical excitation source 3610 may be physically separated from the active cooling element 3740, but may be in thermal contact with the active cooling element 3740 via a good thermal conductor, such as a metal, for example.

The active cooling element 3740 may be arranged to actively cool the optical excitation source 3610 apart from any separate actively cooling of other components of the system 3600. In particular, the active cooling element 3740 may be arranged to actively cool the optical excitation source 3610 without actively cooling the RF excitation source 3630, the NV diamond material 3620, and the optical detector 3640. By having the active cooling element 3740 cool the optical excitation source 3610, and not the RF excitation source 3630, the NV diamond material 3620, or the optical detector 3640, the thermal load on the active cooling element 3740 may be reduced.

Further, the RF excitation source 3630, the NV diamond material 3620, and the optical detector 3640 may be arranged so as to not to be cooled by any active cooling element. In some embodiments, however, the RF excitation source 3630, the NV diamond material 3620, and the optical detector 3640 may be cooled by passive cooling, such as by being thermally connected to a heat sink, for example.

The optical excitation source assembly 3710 may further include one or more thermometers 3726 which are arranged to thermally contact the active cooling element 3740. The thermometers 3726 provide a temperature indicative of the temperature of the optical excitation source 3610. The thermometers 3726 may be thermistors, or IR thermometers, for example.

The system may further comprise, in some embodiments, a temperature controller 3724. The temperature controller 3724 may be configured to receive a temperature signal from the one or more thermometers 3726. Based on the temperature signal, the temperature controller 3724 controls the active cooling element 3740. The temperature controller 3724 may be a proportional integral derivative (PID) controller, for example.

The temperature controller 3724 may control the active cooling element 3740 in some embodiments based on the temperature signal from the one or more thermometers 3726 so that the optical excitation source 3610 has a temperature which may be maintained at a constant value. The temperature controller 3724 may alternatively provide control such that the temperature of the optical excitation source 3610 does not remain constant.

Figure 34:
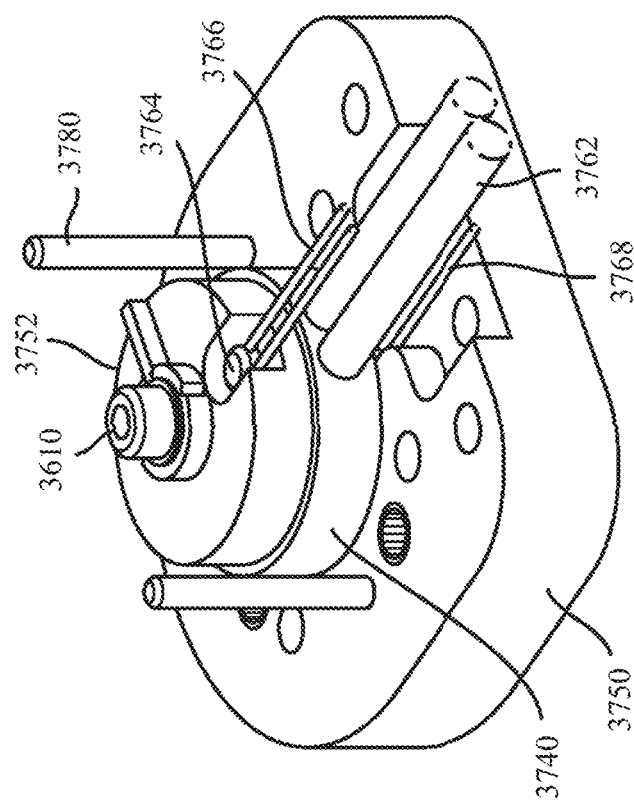
FIG. 34 illustrates a perspective view of some embodiments of the optical excitation source assembly, with the thermally insulating mount removed to expose the upper heat conducting plate.
Figure 33:
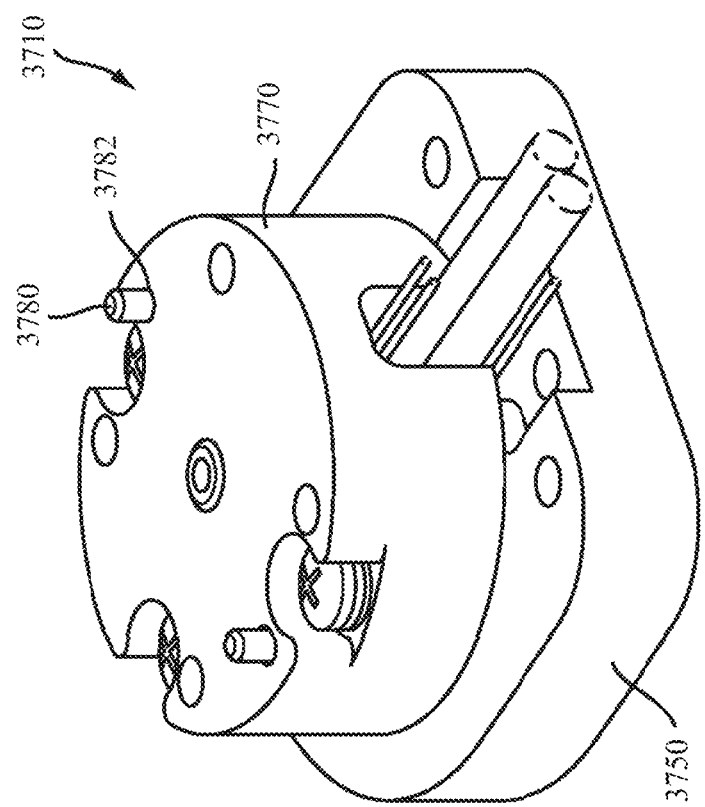
FIG. 33 illustrates a perspective view of some embodiments of the optical excitation source assembly.
Figure 35:
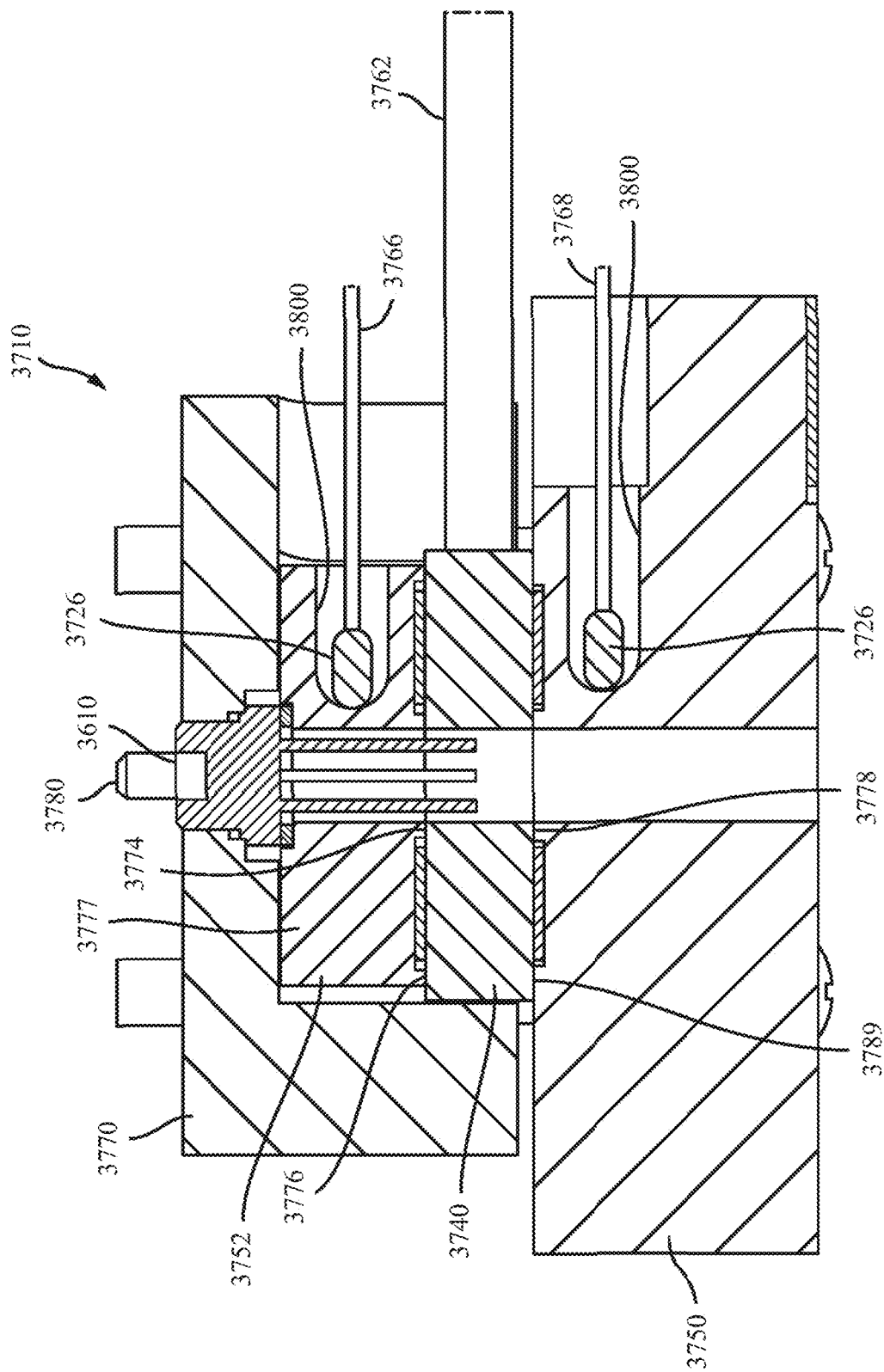
FIG. 35 illustrates a cross-sectional view of some embodiments of the optical excitation source assembly.

The optical excitation source assembly 3710, according to some embodiments may be described with respect to FIGS. 33-35. FIG. 33 is a perspective view of the optical excitation source assembly 3710. FIG. 34 is a perspective view of the optical excitation source assembly 3710, but with the thermally insulating mount 3770 removed to expose the upper heat conducting plate 3752. FIG. 35 is a cross-sectional view of the optical excitation source assembly 3710.

According to some embodiment, the optical excitation source assembly 3710 may include an upper conducting plate 3752, a lower conducting plate 3750, and an active cooling element 3760. The optical excitation source 3610, such as a laser diode, may be mounted on, and in thermal contact with, the upper conducting plate 3752. The active cooling element 3740 may be a thermal electric cooler, for example.

The active cooling element 3740 may be arranged between, and in thermal contact with, the lower conducting plate 3750, and the upper conducting plate 3752. In particular, one side 3777 (the upper side in FIG. 35) of the upper conducting plate 3752 may be in thermal contact with optical excitation source 3610. Another side 3776 (the lower side in FIG. 35) of the upper conducting plate 3752 may be in thermal contact with a cooling side 3774 (the upper side in FIG. 35) of the active cooling element 3740. Thus, the cooling of the active cooling element 3760 may be transferred to the optical excitation source 3610 via thermal conduction by the upper conducting plate 3752.

Further, a side 3780 (the upper side in FIG. 35) of the lower conducting plate 3750 may be in thermal contact with a heat side 3778 (the lower side in FIG. 35) of the active cooling element 3740. Thus, heat from the active cooling element 3740 may be transferred from heat side 3778 of the active cooling element 3740 by the lower conducting plate 3750.

It may be preferable that both of the upper conducting plate 3752 and the lower conducting plate 3750 be good thermal conductors. In that regard, the upper conducting plate 3752 and the lower conducting plate 3750 may be metals, for example. For example, the upper conducting plate 3752 and the lower conducting plate 3750 may be copper, for example.

Further, it may be preferable that the upper conducting plate 3752 and the lower conducting plate 3750 be thermally isolated from each other. A function of the upper conducting plate 3752 may be to provide cooling from the cooling side 3774 of the active cooling element 3740 to the optical excitation source 3610. On the other hand, a function of the lower conducting plate 3750 may be to conduct heat from the heat side 3778 of the active cooling element 3740. It may be preferable that the upper conducting plate 3752 and the lower conducting plate 3750 be thermally isolated from each other so that there is not a thermal short between the upper conducting plate 3752 and the lower conducting plate 3750 such that heat from the lower conducting plate 3750 may be transferred to the upper conducting plate 3752.

Further, according to some embodiments the lower conducting plate 3750 may be thicker than the upper conducting plate 3752. The increased thickness of the lower conducting plate 3750 improves its thermal performance.

The one or more thermometers 3726 of the optical excitation source assembly 3710 may include wiring 3766, 3768 from the thermometers 3726 to the thermal controller 3724 (see FIG. 32). The wiring 3766, 3768 provides an electrical signal from the thermometers 3726 indicative of the temperature of the thermometers 3726 to the thermal controller 3724. The wiring 3766 extends from the thermometers 3726 contacting the upper conducting plate 3752, while the wiring 3768 extends from the thermometers 3726 contacting the lower conducting plate 3750.

According to some embodiments the thermometers 3726 may be mounted in mounting holes 3800 in the upper conducting plate 3752 and the lower conducting plate 3750. This arrangement improves the connection to the upper conducting plate 3752 and the lower conducting plate 3750, and reduce contact of the thermometers 3726 with air flow, thus improving the operation of the thermometers 3726.

The active cooling element 3740 further has wiring 3762 extending therefrom, and connected to the controller 3724 (see FIG. 32). The controller 3724 provides a signal controlling the temperature of the active cooling element 3740, where the temperature may be based on the temperature signals from the thermometers 3726, in particular to the temperature signals from those of the thermometers 3726 thermally contacting the upper conducting plate 3752, which in turn thermally contacts the optical excitation source 3610.

In order to provide a good thermal contact as desired between certain components, a thermal grease may be applied at the interface between the desired components. For example, thermal grease may be applied between the upper conducting plate 3752 and the active cooling element 3740, between the lower conducting plate 3750 and the active cooling element 3740, and between the upper conducting plate 3752 and optical excitation source 3610.

The lower conducting plate 3750 may further include alignment pins 3780 to be inserted in holes 3782 in the thermally insulating mount 3770. The alignment pins 3780 aid in aligning the lower conducting plate 3750 to the thermally insulating mount 3770.

Figure 36:
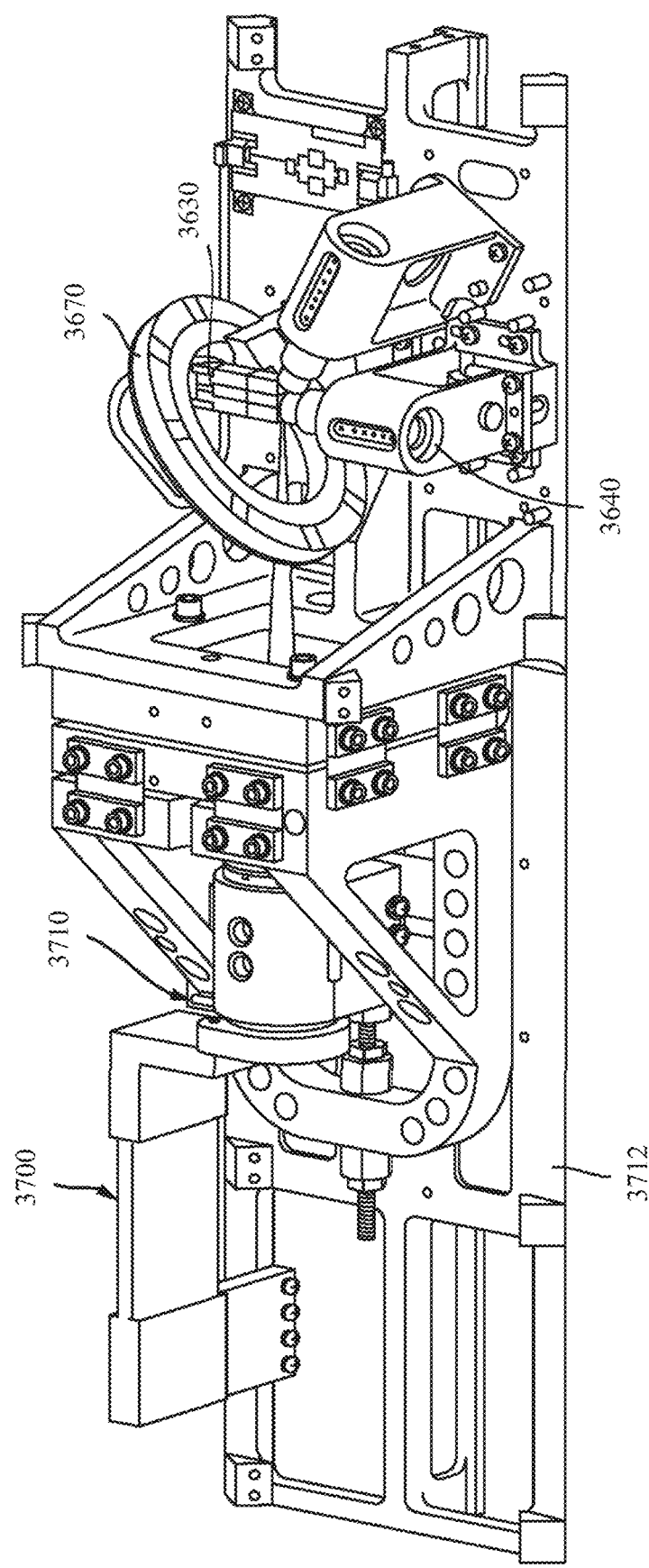
FIG. 36 is a diagram illustrating some embodiments of a magnetic field detection system.

Referring back to FIG. 32, and to FIG. 36, in some embodiments, the system 3600 may further include a frame 3712. All of the optical excitation source assembly 3710, the RF excitation source 3630, the NV diamond material 3620, and the optical detector 3640, may be supported on the frame 3712. Further, the system 3600 may further include a thermal strap 3700 connecting the optical excitation source assembly 3710 to the frame 3712. Specifically, the thermal strap 3700 thermally contacts the lower heat conducting plate 3750, which conducts heat from the active cooling element 3740 to the frame 3712. The thermal strap 3700 thermally contacts the lower heat conducting plate 3750, while at the same time allowing for decoupling of vibrational forces of the frame 3712 from the optical excitation source assembly 3710.

Measurement Collection Process

According to certain embodiments, the system controller 3680 controls the operation of the optical excitation source 3610, the RF excitation source 3630, and the magnetic field generator 3670 to perform Optically Detected Magnetic Resonance (ODMR). Specifically, the magnetic field generator 3670 may be used to apply a bias magnetic field that sufficiently separates the intensity responses corresponding to electron spin resonances for each of the four NV center orientations. The system controller 3680 then controls the optical excitation source 3610 to provide optical excitation to the NV diamond material 3620 and the RF excitation source 3630 to provide RF excitation to the NV diamond material 3620. The resulting fluorescence intensity responses for each of the NV axes are collected over time to determine the components of the external magnetic field Bz aligned along directions of the four NV center orientations which respectively correspond to the four diamond lattice crystallographic axes of the NV diamond material 3620, which may then be used to calculate the estimated vector magnetic field acting on the system 3600. The excitation scheme utilized during the measurement collection process (i.e., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters $\pi$ and $\tau$ may be optimized using Rabi analysis and FID-Tau sweeps prior to the collection process, as described in, for example, U.S. patent application Ser. No. 15/003,590 entitled "APPARATUS AND METHOD FOR HIGH SENSITIVITY MAGNETOMETRY MEASUREMENT AND SIGNAL PROCESSING IN A MAGNETIC DETECTOR SYSTEM" filed Jan. 21, 2016, which issued as U.S. Pat. No. 9,557,391 on Jan. 31, 2017, and is hereby incorporated by referenced in its entirety. The pulse parameters $\pi$ and $\tau$ may also be optimized using another optimization scheme.

Figure 37:
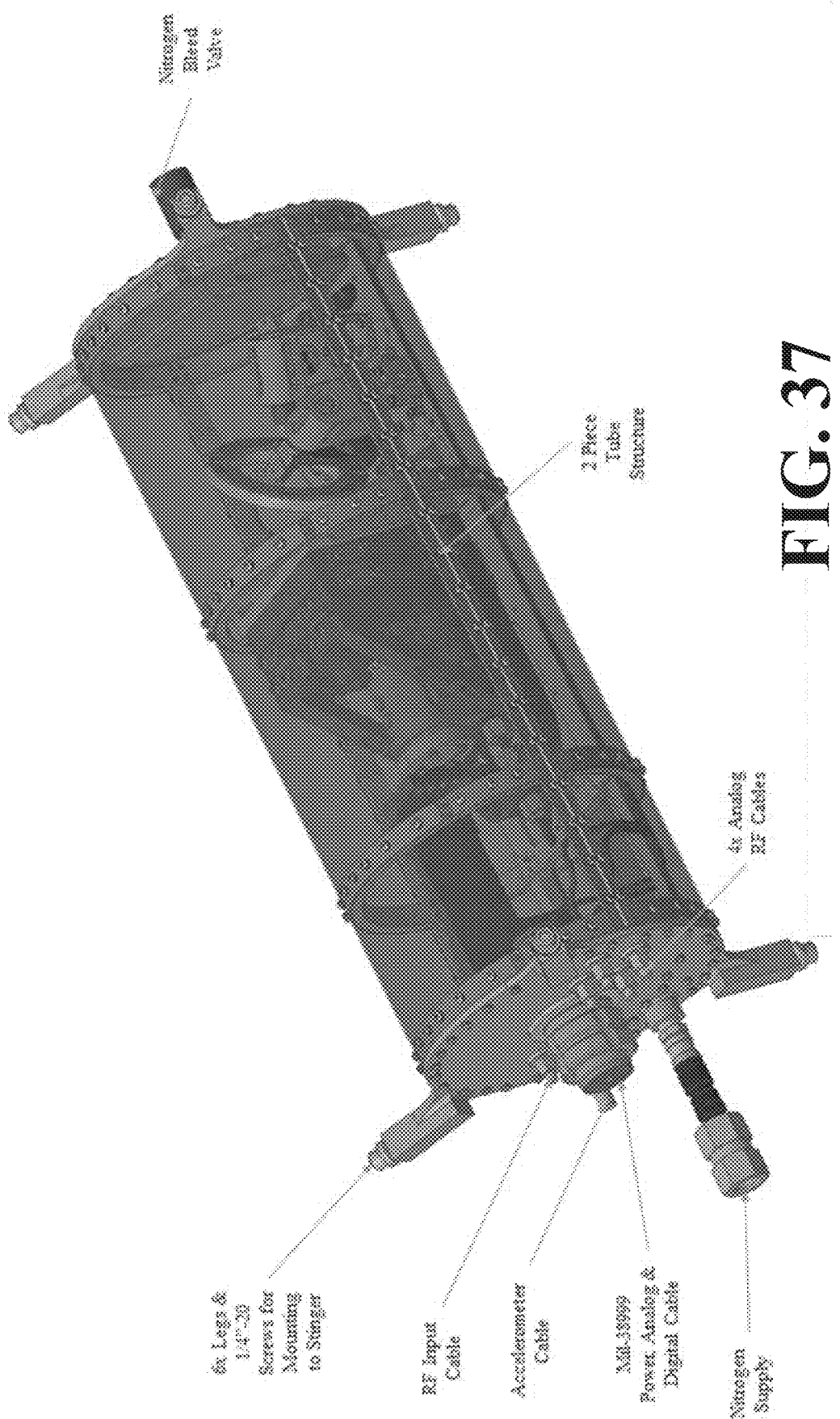
FIG. 37 illustrates a housing configured to enclose the magnetometer according to some embodiments.
Figure 38:
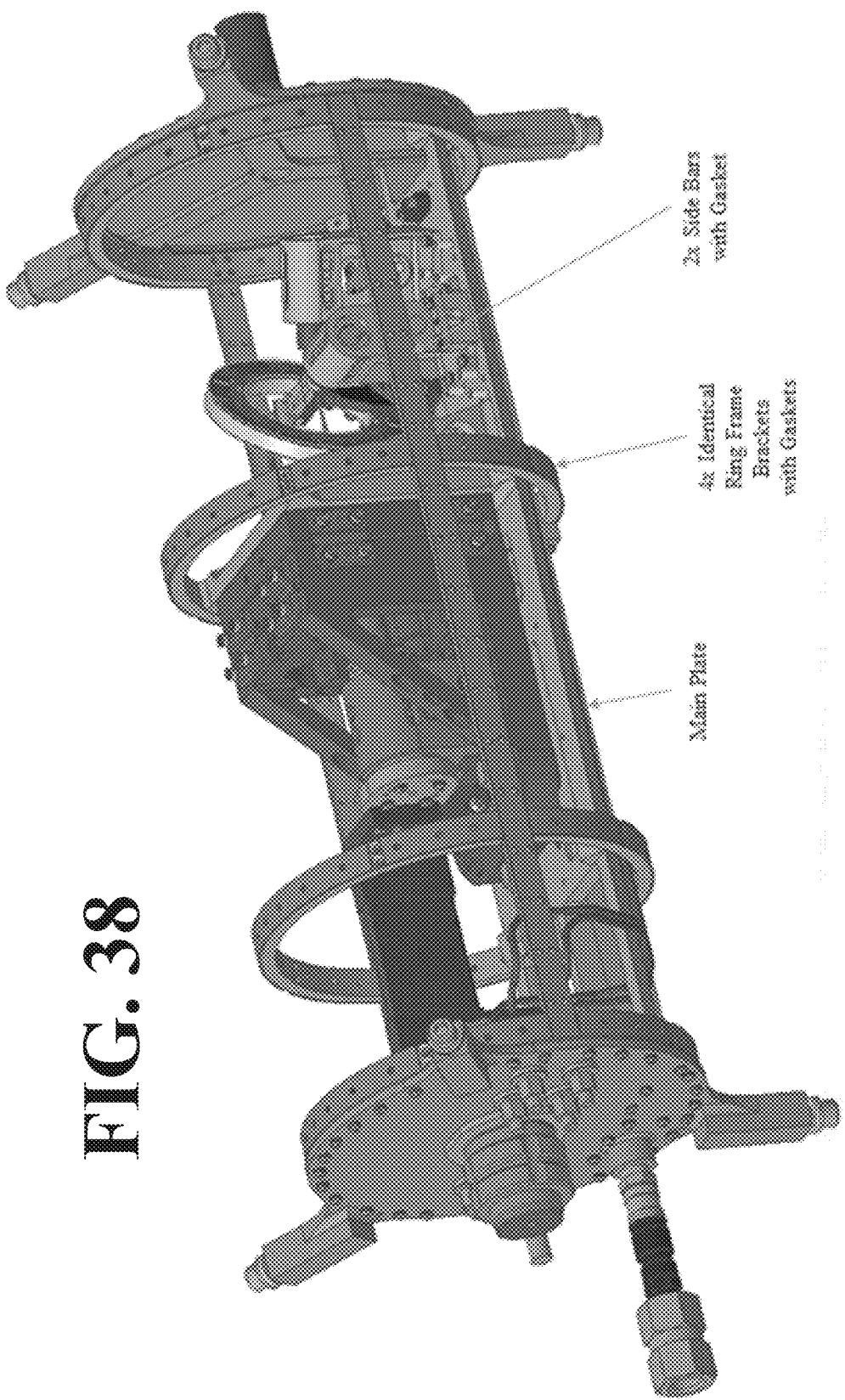
FIG. 38 illustrates an internal structure of the housing of FIG. 37.

The magnetometer described in any of the embodiments above may be provided within a housing, as illustrated in FIG. 37. The housing illustrated in FIG. 37 is substantially cylindrical, but any suitable shape housing may be used. An exterior of the housing may include terminals configured to receive various cables such an as RF input cable, an accelerometer cable, an analog RF cable, or a power, analog & digital cable. FIG. 38 illustrates an internal structure of the housing including a plurality of ring frame brackets and side bars.

Figure 39:
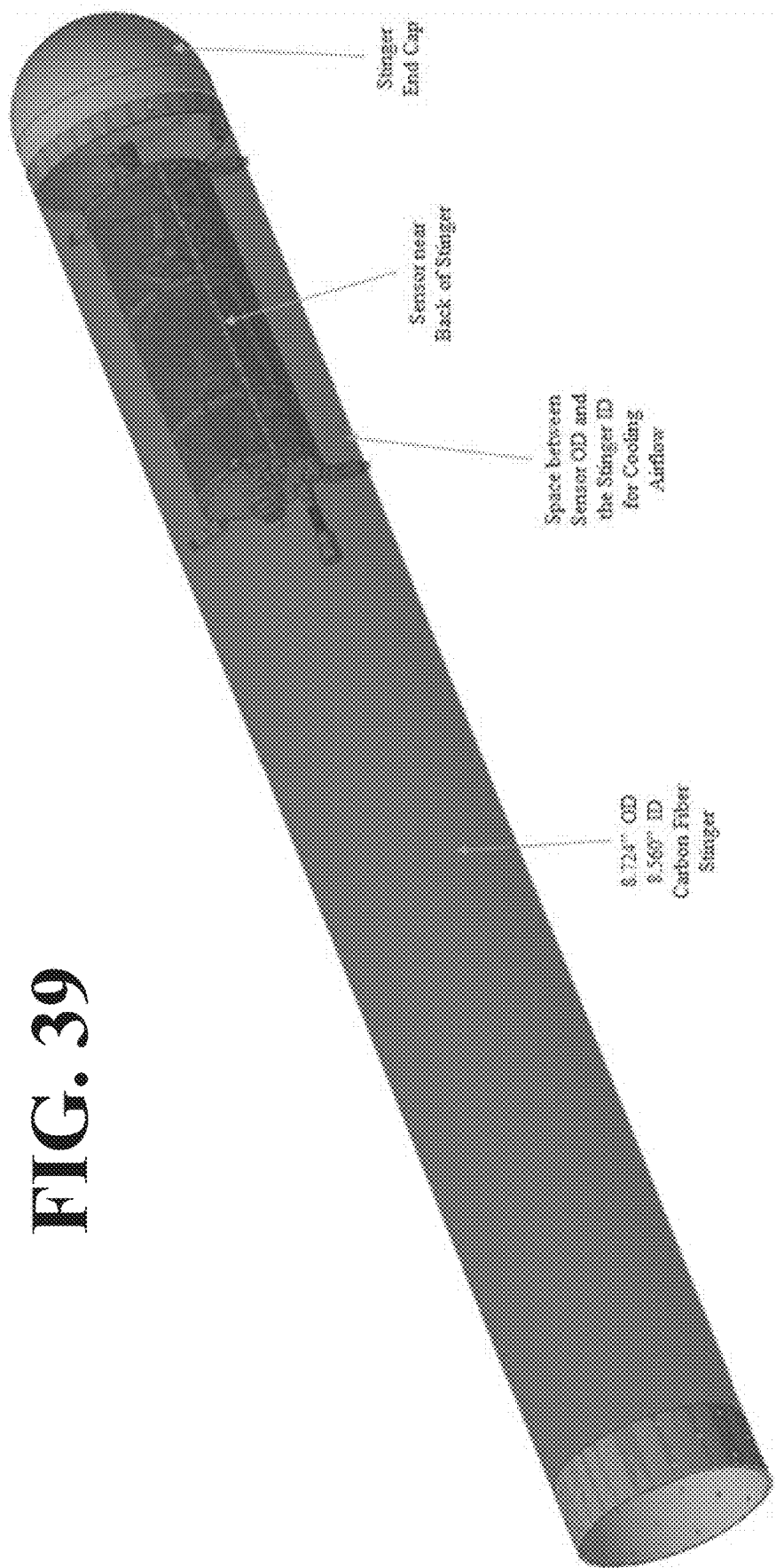
FIG. 39 illustrates the housing of FIG. 37 mounted to a stinger.

The housing may be further mounted within a stinger in a concentric manner. One or more legs may extend from the exterior of the housing, the one or more legs configured to facilitate mounting to an interior of the stinger. See FIG. 39. A space may be provided between an outer diameter of the housing of the magnetometer and an inner diameter of the stinger for cooling airflow. The magnetometer may be arranged at any position within the stinger. As illustrated in FIG. 39, the magnetometer may be positioned at a back end thereof adjacent to an end cap thereof. Providing the magnetometer in a housing, or in a housing mounted in a stinger may reduce the effects of stress or vibration on the magnetometer.

A system including the magnetometer may further include a nitrogen cooling system configured to cool or otherwise reduce thermal loading on components of the system for magnetic detection. The nitrogen cooling system may be in thermal communication with the housing such that heat removed by the nitrogen cooling system may be convectively dissipated to atmosphere. One end of the exterior of the housing may include a terminal configured to connect to a nitrogen supply line where nitrogen may be supplied by an external nitrogen source. The other end of the exterior of the housing may include a nitrogen bleed valve. The system may further include the system a hydrogen absorber positioned within the housing, the hydrogen absorber configured to absorb hydrogen released by materials used in the system for magnetic detection.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology. In some aspects, the subject technology may be used in various markets, including for example and without limitation, advanced sensors and mobile space platforms.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases. Every combination of components described or exemplified can be used to practice the embodiments, unless otherwise stated. Some embodiments can be modified to incorporate any number of variations, alterations, substitutions or equivalent arrangements not heretofore described, but which are commensurate with the spirit and scope of the embodiments. Additionally, while various embodiments of the disclosure have been described, it is to be understood that aspects of the disclosure may include only some of the described embodiments. Accordingly, the disclosure is not to be seen as limited by the foregoing description.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A magnetometer for magnetic detection, comprising:
    a magneto-optical defect center material comprising at least one magneto-optical defect center,
    a radio frequency (RF) exciter system including a radio frequency (RF) excitation source, the RF exciter system being configured to provide RF excitation to the magneto-optical defect center material;
    an optical excitation system including an optical excitation source;
    an optical detector configured to receive an optical signal based on light emitted by the magneto-optical defect center material due to RF excitation and optical excitation provided to the magneto-optical defect center material;
    a magnetic field generator configured to generate a magnetic field detected at the magneto-optical defect center material;
    an active cooling element arranged to actively cool the optical excitation source without cooling the RF excitation source, the magneto-optical defect center material, or the optical detector; and
    a system controller programmed to:
        control the RF excitation source to provide the RF excitation to the magneto-optical defect center material; and
        control the optical excitation source to provide optical excitation to the magneto-optical defect center material.

2. The magnetometer according to claim 1, wherein the magnetic field generator comprises a plurality of permanent magnets arranged in a Halbach array.

3. The magnetometer according to claim 2, wherein a first subset of the plurality of permanent magnets are comprised of a first magnetic material and a second subset of the plurality of permanent magnets is comprised of a second magnetic material different from the first magnetic material.

4. The magnetometer according to claim 3, wherein the first magnetic material comprises samarium cobalt and the second magnetic material comprises neodymium.

5. The magnetometer according to claim 3, wherein the first magnetic material has a first temperature coefficient and the second magnetic material has a second temperature coefficient different than the first temperature coefficient.

6. The magnetometer according to claim 3, wherein the first subset of the plurality of permanent magnets is oriented to generate a magnetic field in a first direction, and the second subset of the plurality of permanent magnets is oriented to generate a magnetic field in a second direction opposite to the first direction.

7. The magnetometer according to claim 2, further comprising at least one thermistor configured to be affixed to one of the permanent magnets and configured to monitor a temperature of the one of the permanent magnets.

8. The magnetometer according to claim 1, wherein the magneto-optical defect center material comprises a nitrogen vacancy (NV) diamond material comprising at least one NV center.

9. The magnetometer according to claim 1, wherein the magneto-optical defect center material comprises a nitrogen vacancy (NV) diamond material comprising a plurality of NV centers.

10. A method for magnetic detection using a magnetometer, the method comprising:
providing radio frequency (RF) excitation to a magneto-optical defect center material via a radio frequency (RF) excitation source, the magneto-optical defect center material comprising at least one magneto-optical defect center;
providing optical excitation to the magneto-optical defect center material via an optical excitation source;
receiving an optical signal via an optical detector, the optical signal being based on light emitted by the magneto-optical defect center material due to the RF excitation and the optical excitation provided to the magneto-optical defect center material;
actively cooling, by an active cooling element, the optical excitation source without cooling the RF excitation source, the magneto-optical defect center material, or the optical detector; and
generating a magnetic field detected at the magneto-optical defect center material via a magnetic field generator.

11. The method according to claim 10, further comprising:
controlling the RF excitation source to provide the RF excitation to the magneto-optical defect center material; and
controlling the optical excitation source to provide the optical excitation to the magneto-optical defect center material.

12. The method according to claim 10, further comprising:
transmitting light emitted from the magneto-optical defect center material to the optical detector via a waveguide assembly comprising an optical waveguide with a hollow core and through at least one optical filter coating.

13. The method according to claim 12, wherein the optical filter coating transmits greater than about 99% of light with a wavelength of about 650 nm to about 850 nm.

14. The method according to claim 12, wherein the optical filter coating transmits less than 0.1% of light with a wavelength of less than about 600 nm.

15. The method according to claim 12, wherein the optical filter coating transmits greater than about 99% of light with a wavelength of about 650 nm to about 850 nm, and transmits less than 0.1% of light with a wavelength of less than about 600 nm.

16. A system for magnetic detection, comprising:
a magneto-optical defect center material comprising at least one magneto-optical defect center;
a radio frequency (RF) excitation source configured to provide RF excitation to the magneto-optical defect center material;
a first optical detector and a second optical detector configured to receive optical signals emitted by the magneto-optical defect center material;
an optical light source;
a first light collection assembly comprising a first light pipe, a first optical filter, and a first lens, wherein the first light collection assembly is configured to transmit light of a first type emitted from the magneto-optical defect center material to the first optical detector;
an active cooling element arranged to actively cool the optical light source without cooling the RF excitation source, the magneto-optical defect center material, the first optical detector, or the second optical detector; and
a second light collection assembly comprising a second light pipe, a second optical filter, and a second lens, wherein the second light collection assembly is configured to transmit light of a second type emitted from the magneto-optical defect center material to the second optical detector.

17. The system according to claim 16, wherein the light of the first type is a red light and the first optical filter is a red filter.

18. The system according to claim 16, wherein the light of the second type is a green light and the second optical filter is a green filter.

19. The system according to claim 16, wherein the first lens focuses light from the first light pipe to a first focal point corresponding to a first position of a first collection portion of the first optical detector and the second lens focuses light from the second light pipe to a second focal point corresponding to a second position of a second collection portion of the second optical detector.

20. The system according to claim 16, wherein the first optical filter is integrated into the first lens or the second optical filter is integrated into the second lens.

21. The system according to claim 16, wherein the first optical filter is a coating on the first light pipe or the second optical filter is a coating on the second light pipe.

22. The system according to claim 16, wherein at least one of the first light pipe and the second light pipe includes a hollow tube.

23. The system according to claim 16, wherein at least one of the first light pipe and the second light pipe includes a solid glass member.

24. The system according to claim 16, wherein the first lens is integrated into the first light pipe or the second lens is integrated into the second light pipe.

25. A magnetometer for magnetic detection, comprising:
a magneto-optical defect center material comprising at least one magneto-optical defect center;
a radio frequency (RF) exciter system including a radio frequency (RF) excitation source, the RF exciter system being configured to provide RF excitation to the magneto-optical defect center material;

an optical excitation system including an optical excitation source mounted to a laser optical assembly that is selectively adjustable in a first axial direction in a first plane relative to the magneto-optical defect center material;

a light collection assembly that is selectively adjustable in a second axial direction in the first plane relative to the magneto-optical defect center material;

an optical detector configured to receive an optical signal based on light emitted by the magneto-optical defect center material due to RF excitation and optical excitation provided to the magneto-optical defect center material;

a magnetic field generator configured to generate a magnetic field detected at the magneto-optical defect center material, the magnetic field generator including a plurality of permanent magnets arranged in a Halbach array;

an active cooling element arranged to actively cool the optical excitation source without cooling the RF excitation source, the magneto-optical defect center material, or the optical detector; and a system controller programmed to:
 control the RF excitation source to provide the RF excitation to the magneto-optical defect center material; and
 control the optical excitation source to provide optical excitation to the magneto-optical defect center material.

26. The magnetometer according to claim 25, wherein the light collection assembly comprises a light pipe, an optical filter, and a lens.

27. The magnetometer according to claim 25, wherein the light collection assembly comprises an optical waveguide assembly included an optical waveguide with a hollow core and at least one optical filter coating, wherein the optical waveguide assembly is configured to transmit the optical signal emitted from the magneto-optical defect center material to the optical detector through the at least one optical filter coating.

28. The magnetometer according to claim 25, wherein the optical excitation system further comprises:
 a thermal electric cooler arranged to actively cool the optical excitation source without cooling the RF excitation source, the magneto-optical defect center material, or the optical detector;
 one or more thermometers thermally contacting the optical excitation source; and
 a temperature controller configured to receive a temperature signal from the one or more thermometers, and to control the thermal electric cooler based on the received temperature signal.

* * * * *